US009106250B2

(12) United States Patent
Ogawa et al.

(10) Patent No.: US 9,106,250 B2
(45) Date of Patent: Aug. 11, 2015

(54) IMAGE CODING METHOD AND DECODING METHOD, IMAGE CODING APPARATUS AND DECODING APPARATUS, CAMERA, AND IMAGING DEVICE

(75) Inventors: Mayu Ogawa, Osaka (JP); Shinji Kitamura, Kyoto (JP); Masao Ozawa, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 523 days.

(21) Appl. No.: 13/475,561

(22) Filed: May 18, 2012

(65) Prior Publication Data

US 2012/0229636 A1 Sep. 13, 2012

Related U.S. Application Data

(63) Continuation of application No. PCT/JP2010/005441, filed on Sep. 3, 2010.

(30) Foreign Application Priority Data

Nov. 20, 2009 (JP) .................. 2009-265670
Jan. 25, 2010 (JP) .................. 2010-013659

(51) Int. Cl.
 *H04N 7/18* (2006.01)
 *H03M 7/16* (2006.01)
 (Continued)

(52) U.S. Cl.
 CPC ............ *H03M 7/16* (2013.01); *H04N 19/126* (2014.11); *H04N 19/13* (2014.11); *H04N 19/154* (2014.11);
 (Continued)

(58) Field of Classification Search
 CPC ............ H03M 7/16; H04N 19/00096; H04N 19/00121; H04N 19/002; H04N 19/00278; H04N 19/00303; H04N 19/00478; H04N 19/00545; H04N 19/00763; H04N 19/00884
 USPC ................ 348/143, 222.1; 382/165, 233, 238
 See application file for complete search history.

(56) References Cited

U.S. PATENT DOCUMENTS 5,481,553 A 1/1996 Suzuki et al.
5,515,388 A 5/1996 Yagasaki
(Continued)

FOREIGN PATENT DOCUMENTS

CN 1106988 A 8/1995
CN 1108865 A 9/1995
(Continued)

OTHER PUBLICATIONS

International Search Report issued in International Patent Application No. PCT/JP2010/005441, mailed Dec. 7, 2010.
(Continued)

*Primary Examiner* — Behrooz Senfi
(74) *Attorney, Agent, or Firm* — McDermott Will & Emery LLP

(57) ABSTRACT

An image coding method includes: a predictive pixel generation step of generating a predictive value from at least one surrounding pixel located near a compression target pixel; a code conversion step of code-converting the pixel data to generate a Gray code; and quantizing bit change information (exclusive OR) between the generated Gray code and a Gray code of the predictive value to a quantization value, to compress the pixel data. This prevents significant image quality degradation, so that high image quality can be achieved.

40 Claims, 45 Drawing Sheets

(51) Int. Cl.
  *H04N 19/176*  (2014.01)
  *H04N 19/13*  (2014.01)
  *H04N 19/593*  (2014.01)
  *H04N 19/126*  (2014.01)
  *H04N 19/154*  (2014.01)
  *H04N 19/182*  (2014.01)
  *G06K 9/46*  (2006.01)
  *H04N 19/70*  (2014.01)
  *H04N 19/46*  (2014.01)
  *H04N 19/42*  (2014.01)

(52) U.S. Cl.
  CPC ........... *H04N 19/176* (2014.11); *H04N 19/182* (2014.11); *H04N 19/593* (2014.11); *H04N 19/42* (2014.11); *H04N 19/46* (2014.11); *H04N 19/70* (2014.11)

(56) References Cited

U.S. PATENT DOCUMENTS

| | | |
|---|---|---|
| 5,590,139 A | 12/1996 | Suzuki et al. |
| 5,594,679 A | 1/1997 | Iwata |
| 7,221,483 B2 | 5/2007 | Yagishita et al. |
| 7,421,132 B2 | 9/2008 | Okada |
| 8,023,748 B2 | 9/2011 | Kato et al. |
| 2002/0031276 A1* | 3/2002 | Yagishita et al. ............ 382/252 |
| 2005/0141772 A1* | 6/2005 | Okada ........................ 382/238 |
| 2007/0223824 A1 | 9/2007 | Kato et al. |
| 2010/0142811 A1 | 6/2010 | Okamoto et al. |

FOREIGN PATENT DOCUMENTS

| | | |
|---|---|---|
| JP | 2002-218250 | 8/2002 |
| JP | 2005-191939 | 7/2005 |
| JP | 2007-036566 | 2/2007 |
| JP | 2007-228515 | 9/2007 |
| WO | 9421053 A1 | 9/1994 |
| WO | 9421083 A1 | 9/1994 |

OTHER PUBLICATIONS

Chinese Search Report issued in Chinese Application No. 201080051980.8 dated Jul. 29, 2014, w/Partial English translation.

* cited by examiner

FIG. 5

Order of input to image coding apparatus 100 →

| | P1 | P2 | P3 | P4 | P5 | P6 |
|---|---|---|---|---|---|---|
| Pixel data | 300 | 220 | 260 | 280 | 320 | 590 |
| Code | 000110111010 | 000010110010 | 000100000110 | 000110010100 | 000111000000 | 001101101001 |

| Exclusive OR | 000100001000 | 000100110100 | 000000010010 | 000001110100 | 001010001001 |
|---|---|---|---|---|---|
| Number of effective bits | 9 | 9 | 5 | 7 | 10 |
| Quantization width | 1 | 1 | 0 | 0 | 2 |
| Quantization value | 10000100 | 10011010 | 00010010 | 01110100 | 10100010 |

FIG. 6

| Number of effective bits of bit change information E | Quantization width J | Quantization information |
|---|---|---|
| 1 | 0 | 00 |
| 2 | 0 | 00 |
| 3 | 0 | 00 |
| 4 | 0 | 00 |
| 5 | 0 | 00 |
| 6 | 0 | 00 |
| 7 | 0 | 00 |
| 8 | 0 | 00 |
| 9 | 1 | 01 |
| 10 | 2 | 10 |
| 11 | 4 | 11 |
| 12 | 4 | 11 |

FIG. 17

| Number of effective bits of adopted bit pattern | Quantization width J | Adopted bit pattern | Quantization information ID |
|---|---|---|---|
| 8 or less | 0 | 1 | 0000 |
| 8 or less | 0 | 2 | 0001 |
| 9 | 1 | 1 | 0010 |
| 9 | 1 | 2 | 0011 |
| 9 | 1 | 3 | 0100 |
| 10 | 2 | 1 | 0101 |
| 10 | 2 | 2 | 0110 |
| 10 | 2 | 3 | 0111 |
| 11 | 3 | 1 | 1000 |
| 11 | 3 | 2 | 1001 |
| 11 | 3 | 3 | 1010 |
| 12 | 4 | 1 | 1011 |

FIG. 25

| Number of effective bits of bit change information E | Detection result | Quantization width J | Quantization information ID |
|---|---|---|---|
| 8 or less | Mismatch | 0 | 000 |
| 9 | Mismatch | 1 | 001 |
| 10 | Mismatch | 2 | 010 |
| 11 | Mismatch | 3 | 011 |
| 12 | Mismatch | 4 | 100 |
| * | Match | 0 | 101 |

FIG. 27

| Number of effective bits of adopted bit pattern | Quantization width J | Adopted bit pattern | Detection result | Quantization information ID |
|---|---|---|---|---|
| 8 or less | 0 | 1 | Mismatch | 0000 |
| 8 or less | 0 | 2 | Mismatch | 0001 |
| 9 | 1 | 1 | Mismatch | 0010 |
| 9 | 1 | 2 | Mismatch | 0011 |
| 9 | 1 | 3 | Mismatch | 0100 |
| 10 | 2 | 1 | Mismatch | 0101 |
| 10 | 2 | 2 | Mismatch | 0110 |
| 10 | 2 | 3 | Mismatch | 0111 |
| 11 | 3 | 1 | Mismatch | 1000 |
| 11 | 3 | 2 | Mismatch | 1001 |
| 11 | 3 | 3 | Mismatch | 1010 |
| 12 | 4 | 1 | Mismatch | 1011 |
| * | 0 | 1 | Match | 1100 |

FIG. 30A

| Number of effective bits of adopted bit pattern | Quantization width J | Adopted bit pattern | Quantization information ID |
|---|---|---|---|
| 8 or less | 0 | 1 | 0001 |
| 8 or less | 0 | 2 | 0010 |
| 9 | 1 | 1 | 0011 |
| 9 | 1 | 2 | 0100 |
| 9 | 1 | 3 | 0101 |
| 10 | 2 | 1 | 0110 |
| 10 | 2 | 2 | 0111 |
| 10 | 2 | 3 | 1000 |
| 11 | 3 | 1 | 1001 |
| 11 | 3 | 2 | 1010 |
| 11 | 3 | 3 | 1011 |
| 12 | 4 | 1 | 1100 |

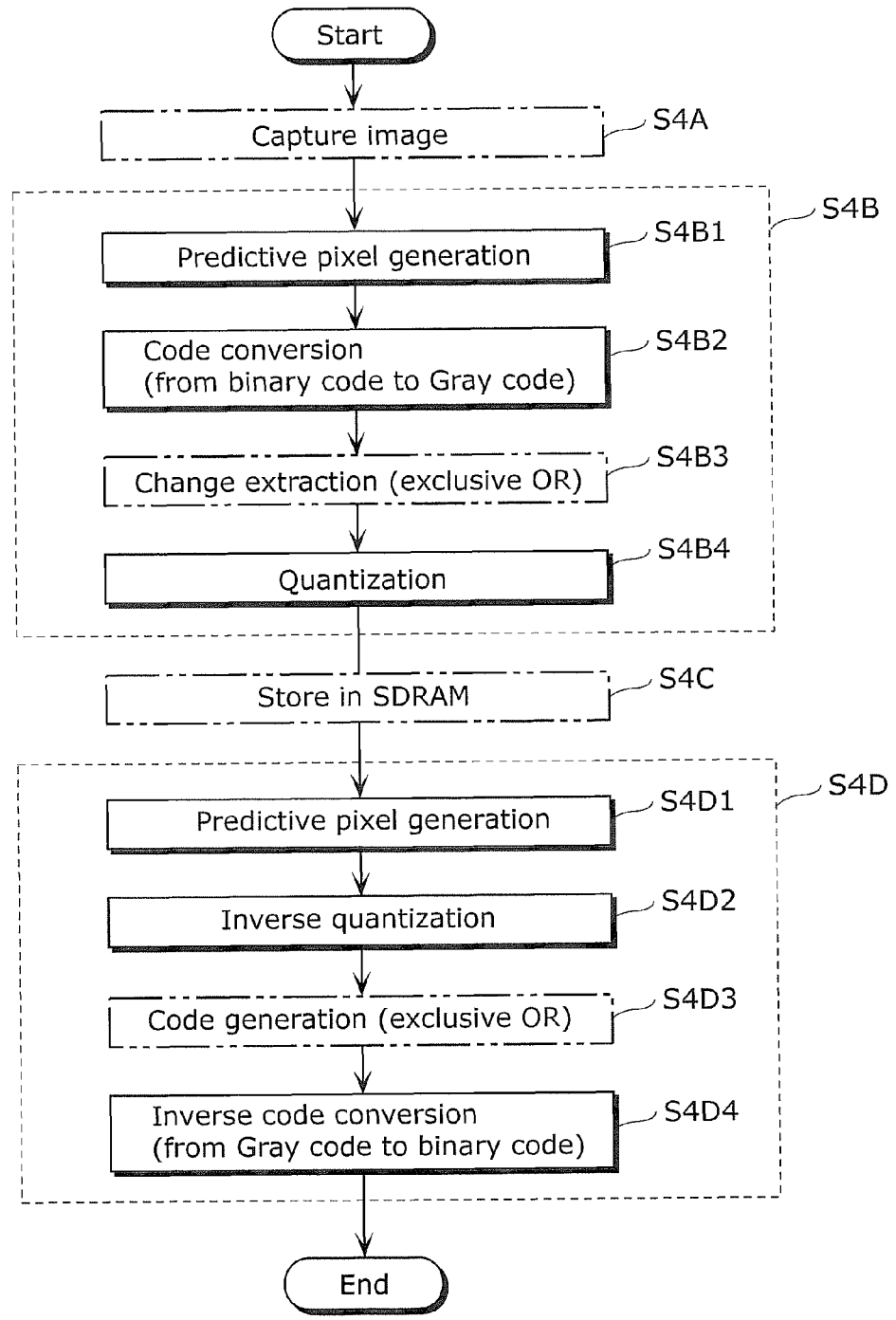

IMAGE CODING METHOD AND DECODING METHOD, IMAGE CODING APPARATUS AND DECODING APPARATUS, CAMERA, AND IMAGING DEVICE

CROSS REFERENCE TO RELATED APPLICATION(S)

This is a continuation application of PCT Patent Application No. PCT/JP2010/005441 filed on Sep. 3, 2010, designating the United States of America, which is based on and claims priority of Japanese Patent Applications No. 2009-265670 filed on Nov. 20, 2009 and No. 2010-013659 filed on Jan. 25, 2010. The entire disclosures of the above-identified applications, including the specifications, drawings and claims are incorporated herein by reference in their entirety.

TECHNICAL FIELD

The present invention relates to an image coding method and decoding method in an apparatus that handles images, such as a digital still camera, a network camera, or the like. The present invention more specifically relates to an image coding method and decoding method for achieving faster data transfer and less memory usage by image compression, and an apparatus using such image coding method and decoding method.

BACKGROUND ART

In recent years, increases in resolution of an imaging device used in an imaging apparatus such as a digital still camera or a digital video camera lead to increases in amount of image data processed by an integrated circuit in the imaging apparatus. To handle a large amount of image data, a higher operating frequency, a larger memory capacity, and the like can be proposed as measures for securing a data transfer bus width in the integrated circuit. These measures, however, directly result in cost increases.

Typically, when all image processing is completed by the integrated circuit in the imaging apparatus such as a digital still camera or a digital video camera, the processed image is recorded in an external recording device such as an SD card. Upon recording, the image is compressed so that image data of a larger image size or a larger number of pictures is stored in the external recording device of the same capacity than in the case where the image is not compressed. A coding scheme such as JPEG or MPEG is employed for this compression process.

In Patent Literature (PTL) 1, image data compression is also extended (applied) to a pixel signal (raw data) received from an imaging device. PTL 1 intends to reduce a bus bandwidth necessary for memory read and write and thus achieve a high-speed operation even in the case where the imaging device is increased in resolution and so a higher load of signal processing is required. Moreover, a fixed length coding scheme is employed in order to secure the bus bandwidth and reduce the amount of compression. This is implemented by a method of calculating maximum and minimum values from pixel data in an arbitrary image area and determining a local dynamic range in the image area. A value obtained by subtracting the calculated minimum value from each pixel in the image area is then quantized with a quantization width corresponding to the determined dynamic range. Fixed length coding of image data is performed in this way.

PTL 2 intends to reduce memory usage and increase the number of continuous shots by compressing raw data, because the number of continuous shots typically depends on the number of pictures of raw data that can be stored in a buffer memory. In PTL 2, too, fixed length coding is employed in order to ensure a continuous shooting rate. This is implemented by a method of calculating a predictive difference between a pixel value (target pixel) to be compressed and a predictive value predicted from known data. When the calculated predictive difference exceeds a predetermined threshold, a quantization step (quantization width) is changed to be coarser, and quantization is performed with the changed quantization step. By doing so, a bit range is kept within a predetermined width, to adjust a bit length per pixel to a fixed length in compression.

PTL 3 also intends to increase the number of continuous shots of the same image size with the same memory capacity. This is implemented by a method of determining a quantization width from a difference from an adjacent pixel and subtracting, from a pixel value to be compressed, an offset value uniquely derived from the quantization width, thereby determining a quantized value. PTL 3 thus provides a digital signal compression coding and decoding apparatus that realizes compression while ensuring a low coding processing load, without requiring more memory.

CITATION LIST

Patent Literature

PTL 1: Japanese Unexamined Patent Application Publication No. 2007-228515
PTL 2: Japanese Unexamined Patent Application Publication No. 2005-191939
PTL 3: Japanese Unexamined Patent Application Publication No. 2007-036566

SUMMARY OF INVENTION

Technical Problem

In the imaging apparatus described in PTL 1, the difference from the minimum value in the same area is quantized with the quantization width that is larger when the dynamic range in the area is wider. This exploits a visual property that, in the case where the dynamic range in the area is wide, there is a high possibility that the image changes significantly, and so it is hard to visually perceive a fine level change. However, there is a problem that compression cannot be launched unless all pixels in the area are available, because the minimum and maximum values in the area need to be calculated. This causes a processing delay until all pixels in the area are available, though the reduction in bus bandwidth is possible. In terms of implementation, too, there is a problem of an increase in circuit scale because a memory for storing the pixels in the area is necessary.

FIG. 1 is a diagram showing a quantization width in the image coding method described in PTL 2.

In PTL 2, the quantization step (quantization width) is determined not on an area-by-area basis but on a pixel-by-pixel basis. Here, the quantization step is determined according to a range (range of quantization step 1, range of quantization step 2, . . . ) of the predictive difference between the compression target pixel and the predictive value (see the circle mark in FIG. 1).

As shown in FIG. 1, the following point is clear from a signal level (a position of a brightness value indicated by the circle mark on each of two vertical number lines in the left and right parts of FIG. 1) of a predictive value with respect to a dynamic range (a range of a brightness value of an image indicated by each of the two number lines in FIG. 1) of an input pixel signal, and a quantization step (quantization step 1, 2, 4, . . . ) that can be used for quantization of the compression target pixel.

In the case where the predictive value is exactly a half level of the input range (the left part of FIG. 1), the quantization step increases with predetermined intervals as the value of the target pixel is more away from the predictive value.

In the case where the predictive value is near "0" (the right part of FIG. 1), the quantization step equally increases with predetermined intervals. However, since the possible predictive difference has a wider range, a maximum quantization step (maximum quantization width) increases from quantization step "8" (S1 in the left part) to "32" (S2 in the right part). The number of patterns of the compression target pixel having the same quantization step "8" increases, too. Thus, when the range of the possible predictive difference changes according to the signal level (the position of the circle mark) of the predictive value, the number of patterns of the compression target pixel for which an arbitrary quantization width is adopted changes depending on the signal level of the predictive value, in the case where no adjacent pixel correlation is taken into consideration.

In PTL 2, when the signal level of the predictive value is lower (darker pixel) (the right part of FIG. 1), the quantization width is larger, that is, the quantization accuracy is coarser, which incurs a higher probability of a quantization error, as shown in FIG. 1. In other words, in the right part of FIG. 1, there is a significant decrease of the amount of information from before quantization to after quantization.

There is also a human visual property that the same level of image quality degradation is more visible in a darker image (the right part of FIG. 1). In PTL 2, however, there is a problem that a darker area has a higher probability of a significant decrease of the amount of information, despite the fact that image quality degradation caused by quantization is more visible in a darker area (the right part of FIG. 1).

In PTL 3, too, the same problem arises due to the same principle, because coded data is generated by quantizing the difference between the compression target pixel and its immediately preceding pixel.

Typically, in image processing by an integrated circuit in a digital still camera or the like, a digital pixel signal received from an imaging device is temporarily stored in a memory such as an SDRAM (Synchronous Dynamic Random Access Memory). The temporarily stored data is then submitted to predetermined image processing, YC signal generation, zoom processing such as enlargement and reduction, and the like, and the processed data is temporarily stored in the SDRAM again. During this time, a request to read pixel data of an arbitrary area from the memory is often made as when clipping an arbitrary area of an image, when performing image processing for which reference or correlation between upper and lower pixels is needed, or the like. In the case of variable length coded data, random accessibility cannot be attained because it is impossible to read an arbitrary area at some midpoint of coded data.

In view of the problems stated above, the present invention has an object of realizing fixed length coding to maintain random accessibility, while preventing image quality degradation by fixing the number of pixel patterns having an arbitrary quantization width without depending on a signal level of a predictive value.

The following image coding method (see PTL 2) is conventionally known.

As an example, in a digital still camera (digital still camera 2800 in FIG. 28), the image coding method is executed by an image processing unit (image processing unit 2820) when writing an image to an SDRAM (SDRAM 2860). In detail, the image coding method is executed by the image processing unit (image processing unit 2820) on the image to be written. As another example, in a digital still camera (digital still camera 2900 in FIG. 29), the image coding method is executed by an imaging unit (imaging unit 2810A) when providing an image captured by the imaging unit to an image processing unit (image processing unit 2820A). In detail, the image coding method is executed by the imaging unit on the image to be written. The image coded according to the image coding method is, for example, an image of raw data. That is, the image coding method is employed in such a case where an image needs to be coded at high speed by a simple structure.

The following first and second steps are used in this image coding method.

In the first step, a difference between a target pixel to be coded and a predictive value of the target pixel is calculated. The coding target pixel can be obtained from the calculated difference and the predictive value.

In the second step, the difference calculated in the first step is quantized to generate a quantization value that represents the difference with a smaller amount of information (number of bits) than the amount of information (number of bits) of the difference.

In this way, the target pixel is coded to the quantization value at high speed by a simple structure.

The quantization value generated here has the same bit length regardless of, for example, the quantity represented by the quantization value. That is, the generated quantization value is a fixed length code.

Solution to Problem

To solve the problems stated above, an image coding method according to the present invention is an image coding method (in a digital still camera, a surveillance camera, or the like) for compressing pixel data (raw data) of a compression target pixel, the image coding method including: generating a predictive value of the pixel data from at least one surrounding pixel located near the compression target pixel; code-converting (binary code to Gray code conversion) the pixel data to generate a code (Gray code) of the pixel data; quantizing bit change information (exclusive OR) to a quantization value that has a smaller number of bits than the bit change information, to compress the pixel data to the quantization value, the bit change information being information of a bit change between the code of the pixel data generated in the code-converting and a code (Gray code generated by code-converting the predictive value, i.e. the same type of code as the code of the pixel data) of the predictive value generated in the generating; and performing an exclusive OR operation on the code of the pixel data generated in the code-converting and the code of the predictive value generated in the generating, to generate the bit change information as a result of the operation, wherein the quantizing includes: determining, as a quantization width, the number of bits obtained by subtracting a bit length of the quantization value from the number of effective bits of the bit change information generated in the performing; and quantizing the bit change information generated in the performing, with the quantization width determined in the determining.

In the present invention, for example, coding is performed by a method that does not depend on a signal level of a predictive value without adding more memory by means of sequential processing, to solve the problems stated above.

As an example, one aspect of the present invention is an image coding method for compressing each of a plurality of pieces of pixel data that constitute image data, the image coding method including: a predictive pixel generation step of generating a predictive value from at least one pixel located near a coding target pixel; and a code conversion step of code-converting the pixel data, wherein the pixel data is compressed by quantizing bit change information of a bit change between the code-converted coding target pixel and the predictive value to obtain coded data including a quantization value.

In the image coding method, the code conversion step may include converting the pixel data from a binary code to a Gray code.

This image coding method achieves sufficiently high image quality, fixed-length quantized (compressed) quantization value generation, and ease of processing.

Advantageous Effects of Invention

According to the present invention, sequential processing is performed, so that compression can be carried out with almost no processing delay or need for additional memory. Moreover, since bit change information is quantized unlike conventional difference coding, the number of pixel patterns having an arbitrary quantization width can always be fixed without depending on a signal level of a predictive value. Furthermore, code conversion and bit pattern generation for reducing the information amount of the bit change information enable quantization error reduction.

By realizing these features by fixed length coding, in the case where a plurality of pieces of fixed length coded data generated as a result are stored in a memory or the like, coded data corresponding to a pixel of a specific part in the image can be easily specified. Thus, random accessibility to coded data can be maintained. That is, according to the present invention, image quality degradation can be prevented as compared with the conventional art, while maintaining random accessibility to a memory.

Therefore, all of the advantageous effects including sufficiently high image quality, fixed-length quantized (compressed) quantization value generation, and ease of processing can be achieved.

BRIEF DESCRIPTION OF DRAWINGS

These and other objects, advantages and features of the invention will become apparent from the following description thereof taken in conjunction with the accompanying drawings that illustrate a specific embodiment of the present invention. In the Drawings:

FIG. 5 is a diagram showing an image coding process example and each operation result;

FIG. 6 is a diagram showing an example of the number of effective bits of bit change information, a quantization width, and a quantization result;

FIG. 17 is a diagram showing a quantization information ID in Variation 2;

FIG. 25 is a diagram showing a quantization information ID in Variation 3;

FIG. 27 is a diagram showing a quantization information ID in the case where the bit pattern generation unit and the pattern detection unit are included;

FIG. 30A is a diagram showing a quantization information ID in Variation 5;

FIG. 43 is a flowchart showing processes in a system according to the present invention.

DESCRIPTION OF EMBODIMENT

Figure 1:
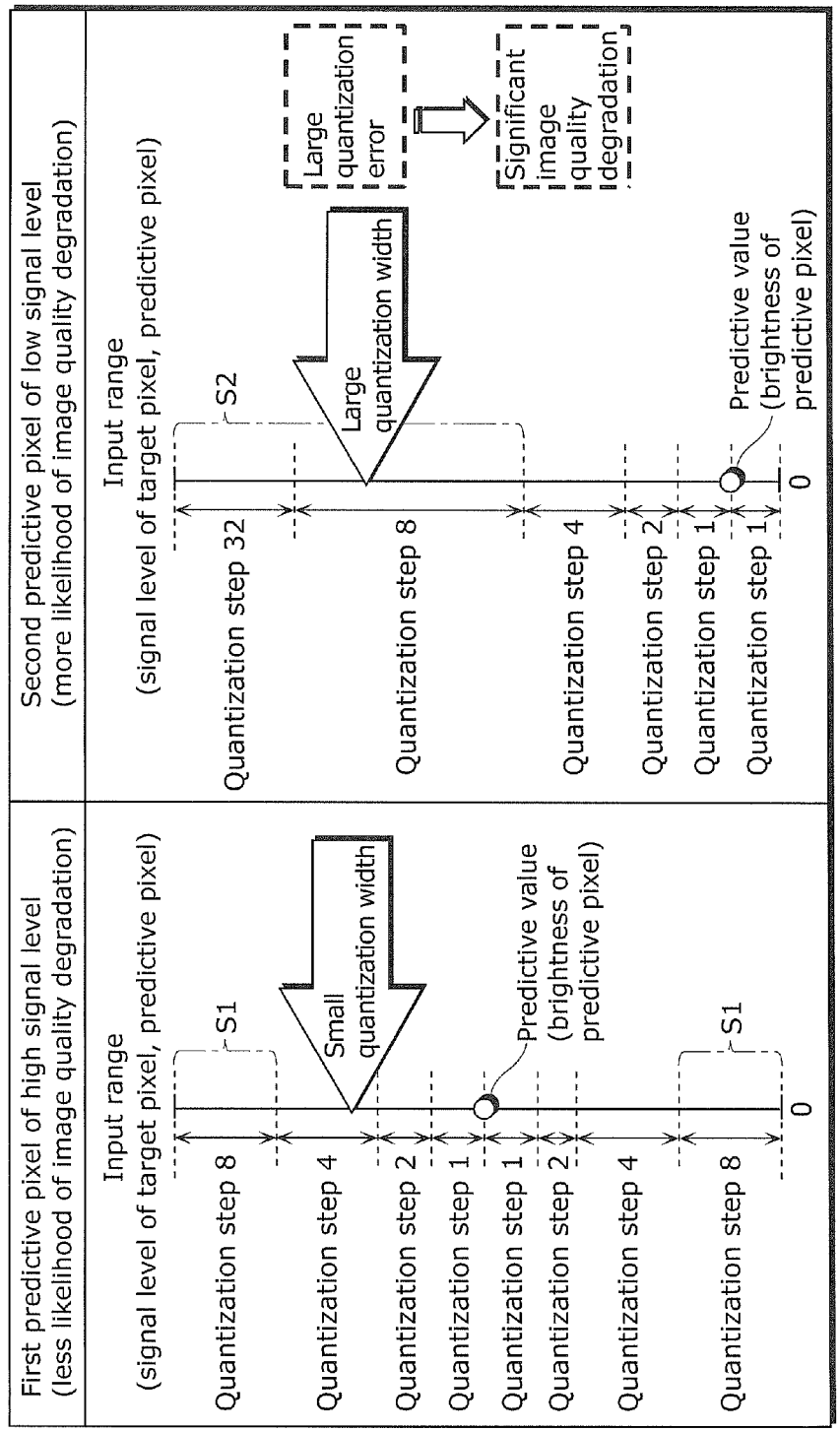
FIG. 1 is a diagram regarding PTL 2.

The following describes an embodiment of the present invention with reference to drawings.

In the following description, components having the same functions as already described components are given the same reference signs and their description is omitted.

An image coding method (method used in image coding apparatuses 100, 100b, 100c, 100cx, digital still camera 2800, surveillance camera 3100, and the like, FIG. 2, Step S4B in FIG. 43) described below is an image coding method for compressing pixel data (raw data of an image captured (Step S4A) by a camera such as the digital still camera 2800 (FIG. 28) or the surveillance camera 3100 (FIG. 31)) of a compression target pixel (to a fixed length code), the image coding method including: generating a predictive value of the pixel data from at least one surrounding pixel located near the compression target pixel (predictive pixel generation unit 102, Steps S102, S4B1); code-converting (e.g. binary code to Gray code conversion) the pixel data to generate a code (Gray code) of the pixel data (code conversion unit 103 (conversion processing unit 103x), Step S103, S4B2); and quantizing bit change information (exclusive OR, change extraction unit 104, Steps S104, S4B3) to a quantization value (of a fixed length) that has a smaller number of bits than the bit change information, to compress the pixel data to the quantization value, the bit change information being information of a bit change between the code of the pixel data generated in the code-converting and a code (Gray code generated by code-converting the predictive value, i.e. the same type of code as the code of the pixel data) of the predictive value generated in the generating (quantization processing unit 106, quantization unit 106x, Steps S106, S4B4).

For example, the following operation may be performed in a given situation.

An image is captured by a camera (e.g. the digital still camera 2800 (FIG. 28), the surveillance camera 3100 (FIG. 31)) (Step S4A).

A quantized quantization value obtained by compressing pixel data of raw data in the captured image is stored in an SDRAM 2860 (FIG. 28) (Step S4C).

When storing the quantization value, an exclusive OR (bit change information) of a Gray code (Step S4B2) of the pixel data of the raw data and a Gray code of a predictive value (Step S4B1) of the pixel data (Step S4B2) is calculated (Steps S4B1 to S4B3).

The quantization value obtained by quantizing the calculated exclusive OR is generated to thereby compress the pixel data to the quantization value (Step S4B4).

The generated (Step S4B) and stored (Step S4C) quantization value is read and decompressed (inverse quantization, image decoding method, Step S4D: S4D1 to S4D4) to the pre-compression pixel data.

According to this method, the exclusive OR of the Gray code is quantized, unlike the conventional process of difference quantization. This reduces a loss of information in quantization, with it being possible to prevent degradation and enhance image quality.

Accordingly, sufficiently high image quality can be maintained even when a large number of pictures are captured per unit time and the captured pictures need to be processed in short time as would be the case in the future.

Moreover, not only the exclusive OR of the Gray code is quantized, but also the quantization value of not a variable length but a fixed length can be obtained as a result of compression.

Besides, the need to merely perform the process of calculating the exclusive OR of the Gray code contributes to easier processing.

Therefore, features such as sufficiently high image quality, fixed-length quantization value generation, and ease of processing can all be achieved.

Thus, in coding, an exclusive OR operation is performed when generating the exclusive OR from the code (Step S4B3 in FIG. 43). In decoding, too, an exclusive OR operation is performed when generating the code from the exclusive OR (Step S4D3). Since the same operation is performed for both coding and decoding, ease of processing can further be enhanced.

Combining these components (steps) produces synergistic effects. Conversely, the known conventional art lacks part or whole of these components (steps), and so fails to produce synergistic effects. The present invention is different from the conventional art in this regard.

The use (generation, storage, decompression, etc.) of the quantization value obtained by quantizing the bit change information (exclusive OR) of the code (Gray code) generated as a result of code conversion (binary code to Gray code conversion) (see FIG. 43, etc.) enables development of the image coding method and the like that are expected to be widely used in the future.

In more detail, the quantizing may include rearranging the bit change information according to a predetermined method (see bit patterns 1 to 3 in FIG. 16), and quantizing the rearranged bit change information to the quantization value.

The image coding method may include performing an exclusive OR operation on the code of the pixel data generated in the code-converting and the code of the predictive value generated in the generating, to generate the bit change information as a result of the operation (change extraction unit 104, Step S4B3), wherein the quantizing includes: determining, as a quantization width, the number of bits (1, 1, 0, 0, 2 in the third row in the lower table in FIG. 5) obtained by subtracting a bit length (8 bits in the fourth row) of the quantization value from the number of effective bits (the second row) of the bit change information generated in the performing (quantization width determination unit 105); and quantizing the bit change information generated in the performing, with the quantization width determined in the determining.

For example, the change extraction step (the above-mentioned performing) may be included in the code conversion step (the above-mentioned code-converting) (Steps S4B2 and S4B3). The change extraction step may thus be part of the image coding method. Alternatively, the result of the change extraction step performed separately from the image coding method may be used in the image coding method. Other forms are also applicable.

The determining may include: rearranging bit data in the bit change information of N bits generated in the performing, to obtain a plurality of bit patterns (e.g. bit patterns 2 to 3 or 1 to 3 in FIG. 16) resulting from different rearrangements (see bit patterns 1 to 3 in FIG. 18A), N being a natural number; adopting a bit pattern (e.g. bit pattern 2) having a minimum number of effective bits from among the plurality of bit patterns; and determining, as the quantization width used for the quantization, the number of bits obtained by subtracting the bit length (e.g. 8) of the quantization value from the number of effective bits (e.g. 10) of the adopted bit pattern.

At least one (e.g. bit pattern 2 in FIG. 16) of the plurality of bit patterns may be second bit change information obtained by dividing first bit change information (bit pattern 1 in FIG. 16) into high-order bits and low-order bits at a predetermined bit position (arrow position in bit pattern 2 in FIG. 16) and rearranging the high-order bits in reverse order, the first bit change information being the bit change information of N bits generated in the performing.

At least one (bit pattern 3 in FIG. 16) of the plurality of bit patterns may be third bit change information (bit data such as b11, b10, . . . , b7, b6 changed in position) obtained by changing bit positions of a plurality of pieces of bit data (higher bits with respect to arrow position) in first bit change information (bit pattern 1) which is the bit change information of N bits generated in the performing.

At least one of the plurality of bit patterns may be fourth bit change information of L bits obtained by extracting only information of a change in K consecutive bits in first bit change information (bit pattern 1 in FIG. 24) which is the bit change information of N bits generated in the performing, the K consecutive bits being consecutive from a predetermined bit position (between b5 and b6), K (6 bits from b6 to b11) being a natural number smaller than N, and L (e.g. 5 bits from b7 to b11) being smaller than K.

Figure 12:
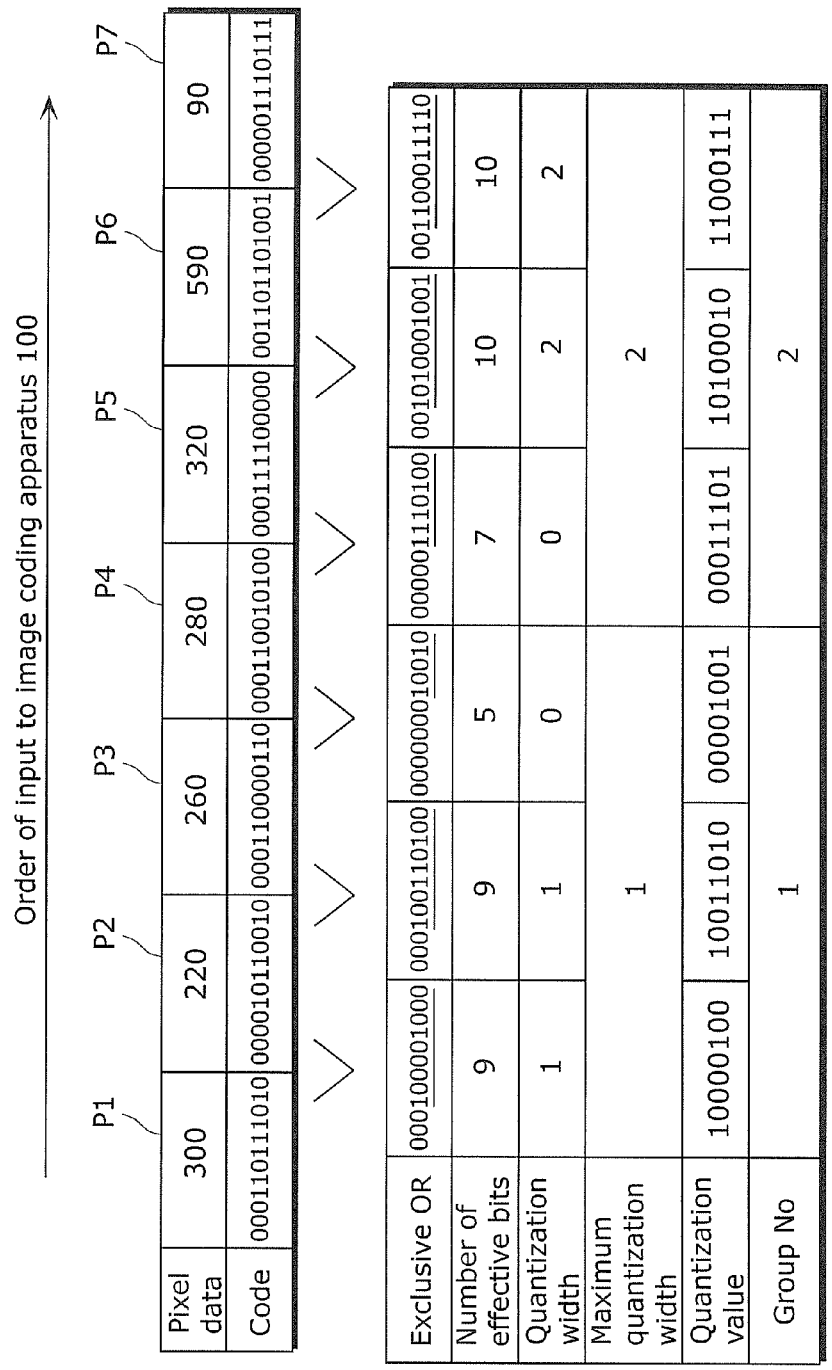
FIG. 12 is a diagram showing an image coding process example and each operation result in Variation 1.

The determining may include determining, for each group (e.g. group of three pieces of pixel data in the second to fourth columns in the lower table in FIG. 12) composed of a plurality of pieces of pixel data, a common quantization width (e.g. maximum quantization width "1" in the fourth row in the lower table) used for quantization of all of the plurality of pieces of pixel data.

The determining may include coding the determined quantization width to a code (e.g. code in the third column in FIG. 6) of Q bits, to generate coded data (e.g. 8-bit data of "quantization value" in FIG. 7B) for specifying the quantization width used for inverse quantizing the quantization value, Q being a natural number.

Figure 38:
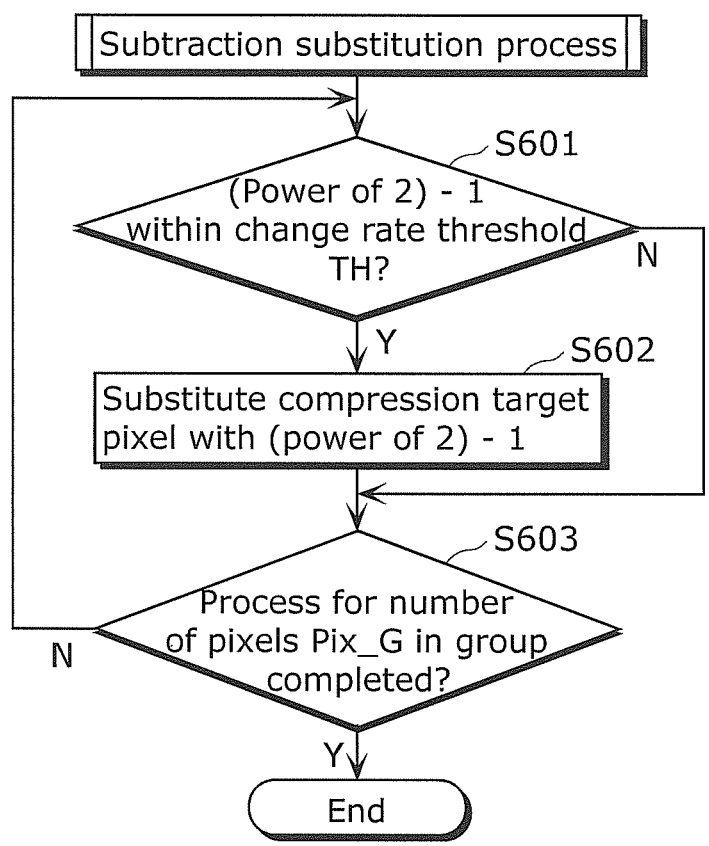
FIG. 38 is a flowchart showing Step S207 shown in FIG. 34 in detail.

The image coding method may further include: determining a need of whether or not to substitute a value of the pixel data of the compression target pixel (substitution determination unit 11 in FIG. 39, Step S205 in FIG. 34); and substituting the value of the pixel data of the compression target pixel (e.g. 512 of the pixel P32 in FIG. 42) with an arbitrary (appropriate) value (511 in "512→511" of the pixel P32) (Steps S206 (602), S207, pixel value substitution unit 12), wherein, in the case of determining in the determining a need that the value of the pixel data needs to be substituted (Step S601 in FIG. 38: Y), the code-converting includes code-converting the pixel data (511) whose value (512 in "512→511" of the pixel P32 in FIG. 42) is substituted in the substituting to generate the code (Gray code) of the pixel data (511), and the quantizing includes quantizing the bit change information (exclusive OR) between the code of the pixel data generated in the code-converting and the code of the predictive value (500 of the pixel P31) (Step S1102 in FIG. 33).

Figure 40:
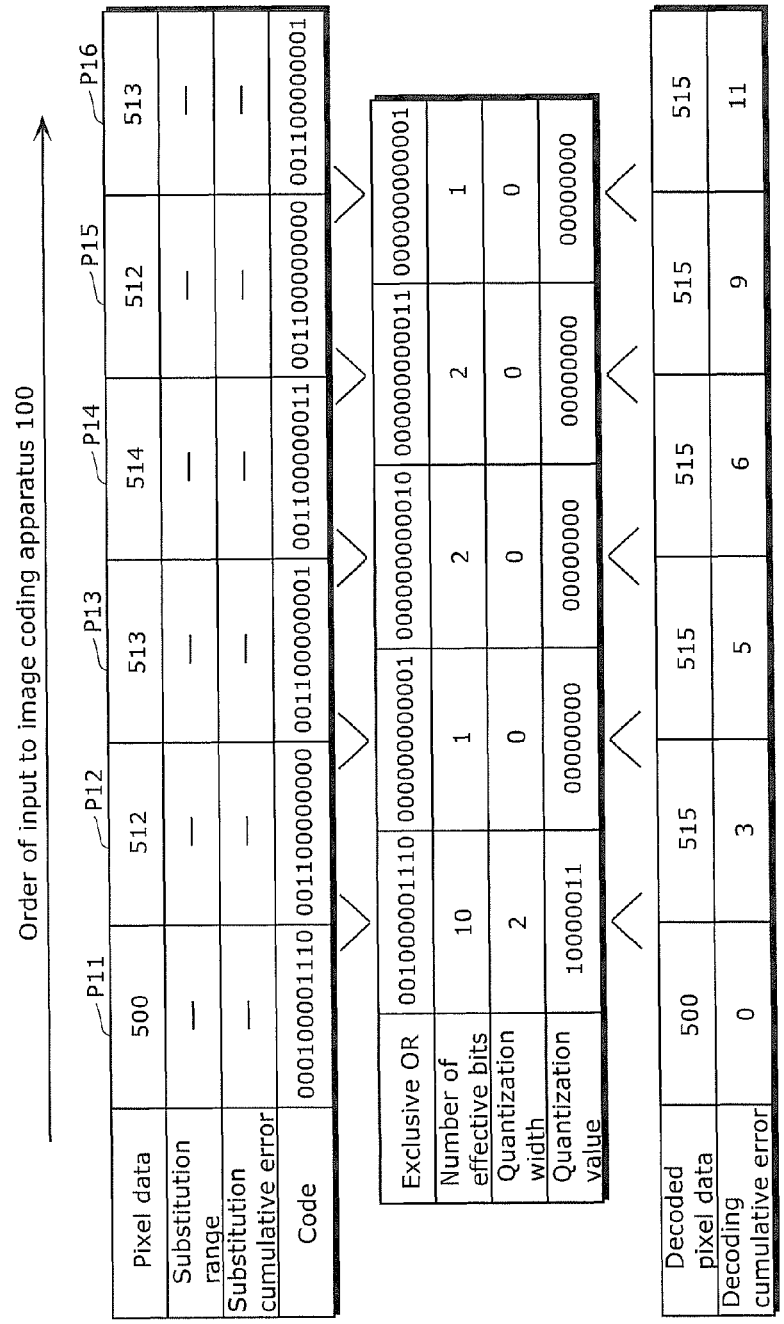
FIG. 40 is a diagram showing results in Variation 1.

According to this method, it is possible to prevent a situation where quantization is performed with a large quantization width (see a quantization width "2" in the third row in the middle table in FIG. 40) calculated from two pixel values (500 of a pixel P31 and 512 of a pixel P32 before substitution) with a power of 2 (512) being included from one pixel value to the other, which causes a large quantization error and results in degradation.

Figure 42:
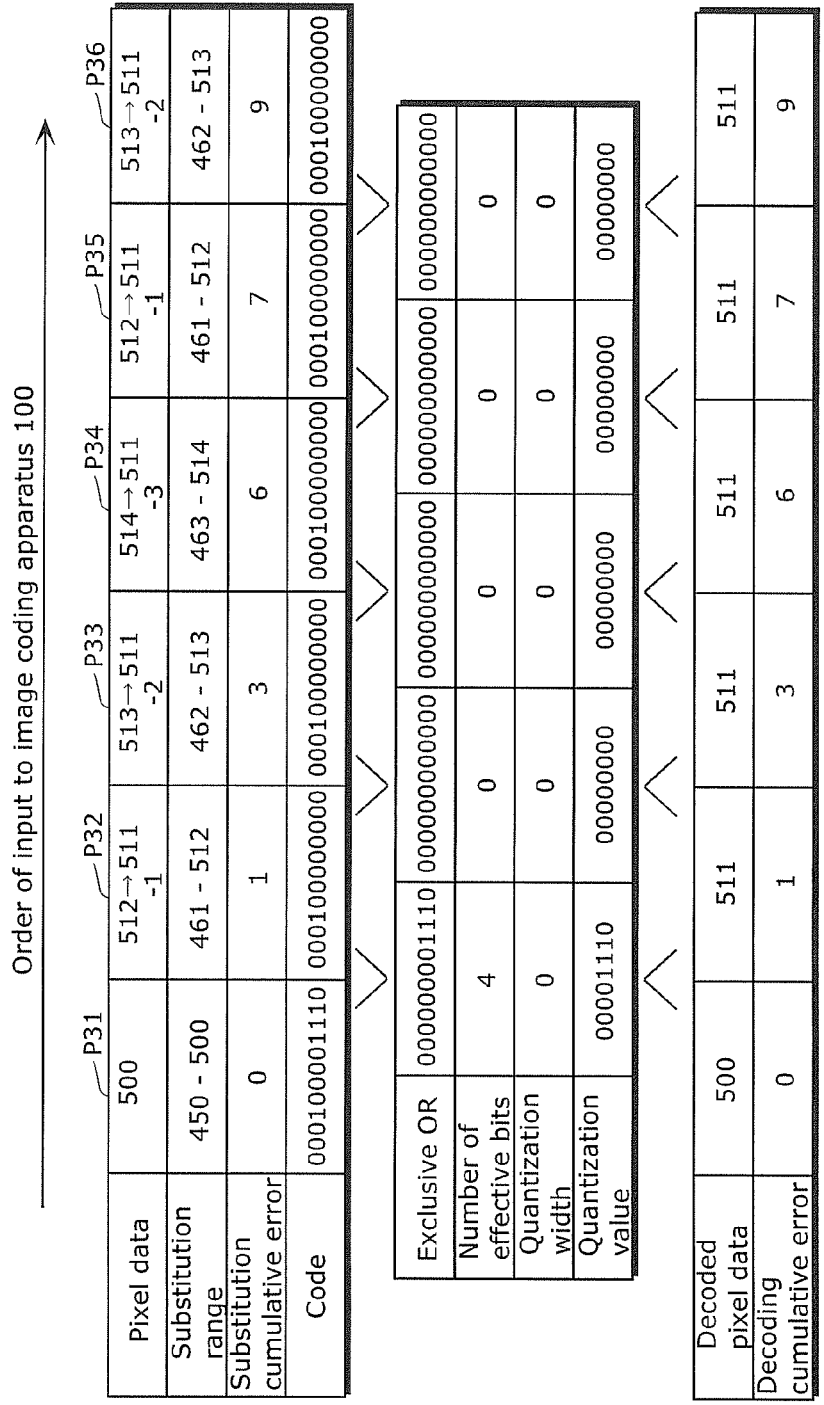
FIG. 42 is a diagram showing processing results of Step S204 shown in FIG. 34.

That is, quantization is performed with a small quantization width (see a quantization width "0" in the third row in the middle table in FIG. 42) calculated from two pixel values (500 of the pixel P31 and 511 of the pixel P32 after substitution) with no power of 2 (512) being included from one pixel value to the other. This reduces a quantization error and prevents degradation, contributing to high image quality.

The determining a need may include determining whether or not the value of the pixel data of the compression target pixel needs to be substituted, according to the quantization width determined in the determining.

That is, the determining a need may include determining that the value of the pixel data of the compression target pixel needs to be substituted, in the case where the quantization width determined in the determining is W which is an arbitrary nonzero natural number.

For example, after substitution, a second quantization width smaller than the above-mentioned first quantization width may be determined and put to use for quantization.

The substituting may include substituting the value (e.g. 512 of the pixel P32 in FIG. 42) of the pixel data of the compression target pixel (to a predetermined value (e.g. 511 in "512→511" of the pixel P32 in FIG. 42)), in the case where a power of 2 (e.g. 2 raised to the 9th power=512) is included in a predetermined range (512 to 461 (=512−51)) determined from the value of the pixel data of the compression target pixel (Step S601: Y).

Figure 41:
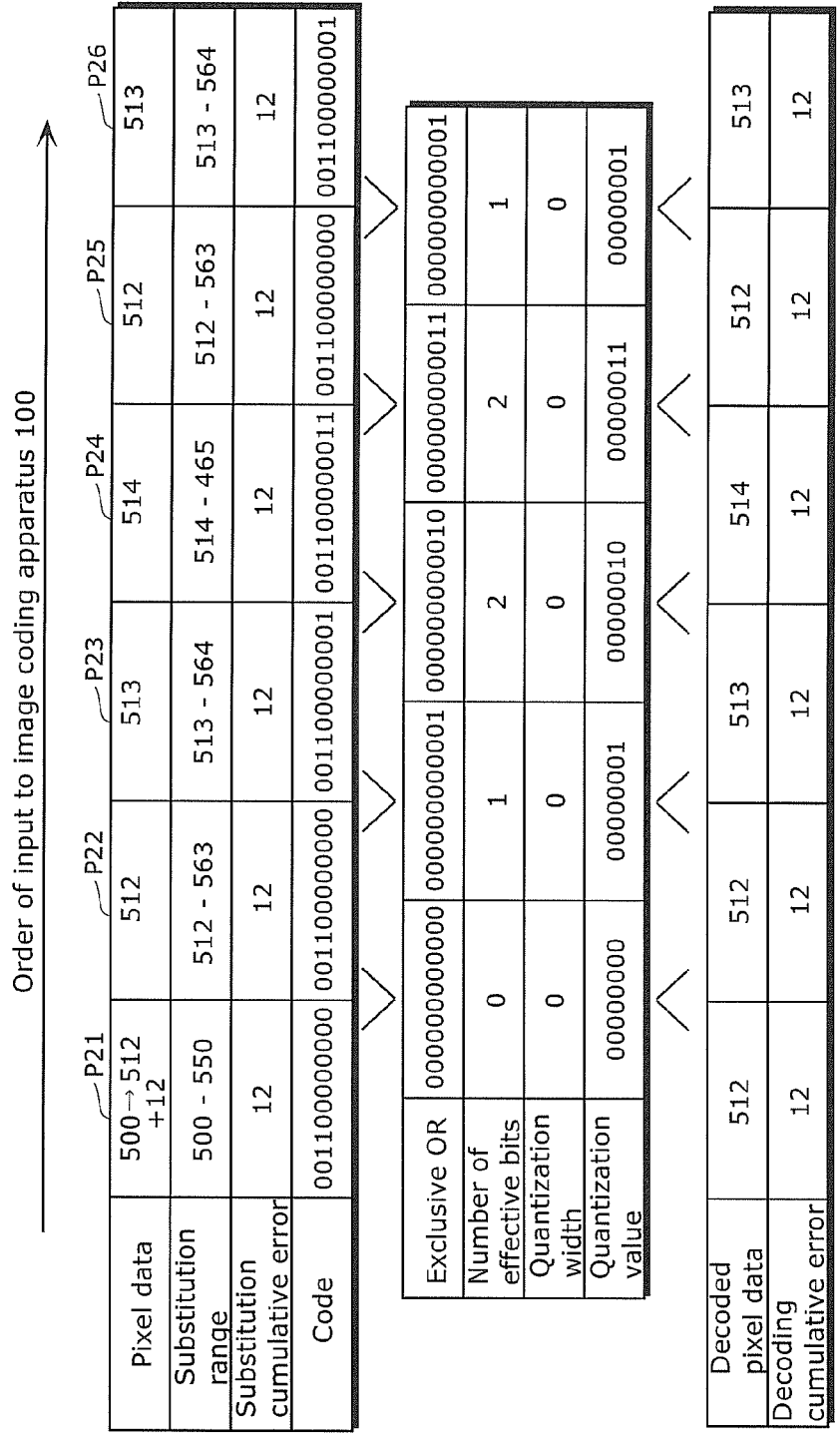
FIG. 41 is a diagram showing processing results of Step S203 shown in FIG. 34.

The substituting may include substituting the value of the pixel data of the compression target pixel with the power of 2 (e.g. 512) in the case of substituting the value in a positive direction (substituting with a larger value as in FIG. 41, Step S205: N), and substituting the value of the pixel data of the compression target pixel with a result of subtracting 1 from the power of 2 (e.g. 511) in the case of substituting the value in a negative direction (substituting with a smaller value as in FIG. 42, Step S205: Y).

Figure 15:
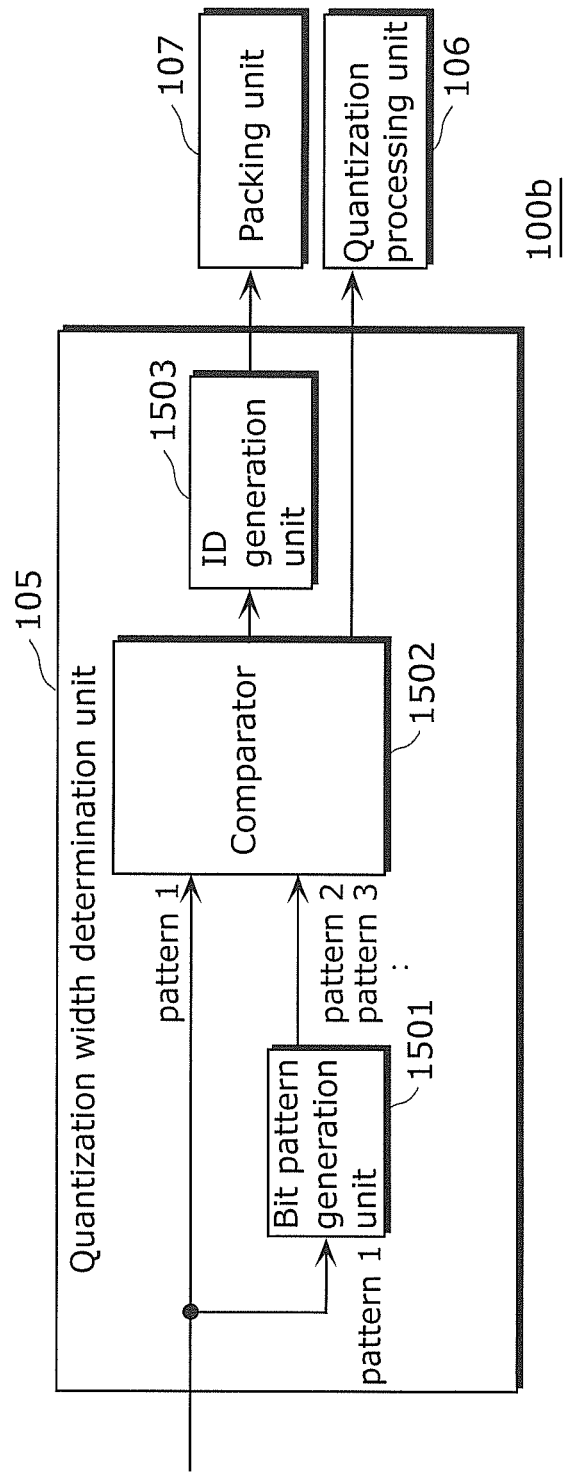
FIG. 15 is a block diagram showing a structure of a quantization width determination unit in image coding in Variation 1.

The determining may include determining one quantization information ID for specifying the quantization width (the second column in FIG. 17) used for the quantization from among at most $2^4$ (e.g. $2^2$=4) quantization information IDs (each row in FIG. 17) where Q is predetermined (e.g. Q=4), and coding the quantization width to the determined quantization information ID which is a code of Q bits (e.g. the ID generation unit 1503 in FIG. 15).

The determining may include generating a quantization information ID (the fourth column in FIG. 17) that includes (specifies) at least quantization width information (the second column) and bit pattern information (the third column), the quantization width information being information for specifying the quantization width used for the quantization, and the bit pattern information being information for specifying the bit pattern adopted in the determining.

The generating coded data may include generating, as the coded data, packed data (64-bit data in FIG. 7B) that includes unquantized pixel data (12-bit data of the pixel P1) of a leading pixel (pixel P1 in FIGS. 7A and 7B) and one or more quantization values (five quantization values of the pixels P2 to P6) obtained by quantizing, in the quantizing, pixel data of each pixel (pixels P2 to P6) following the leading pixel within a predetermined interval (fixe pixels of the pixels P2 to P6) (packing unit 107, Step S107).

The pixel data may be raw data which an image coding apparatus (image coding apparatus 100 in FIG. 28) that executes the image coding method receives from an imaging device (imaging device 2812).

A dynamic range M of coded data of the pixel may be changed for each color component. The determining may include determining the quantization width separately for each color component. The pixel data may be data of a luminance signal or a chrominance signal generated by an image processing apparatus from raw data received from an imaging device. The pixel data may be data of a luminance signal or a chrominance signal generated by a decompression apparatus (e.g. digital still camera 2800) decompressing a JPEG (Joint Photographic Experts Group) image.

An image decoding method may be an image decoding method (Step S4D in FIG. 43) for decoding a quantization value to pixel data, the quantization value being a result of quantizing bit change information of a bit change between a code of the pixel data and a code of a predictive value of the pixel data, the predictive value being generated from at least one pixel located near a pixel of the pixel data, the image decoding method including: generating the predictive value of the pixel data from already decoded preceding pixel data (predictive pixel generation unit 112, Step S4D1); inverse quantizing the quantization value to generate the bit change information (inverse quantization processing unit 114, inverse quantization unit 113x, Step S4D2); and inverse code-converting (inverse code conversion unit 116, Step S4D4) the code (code generation unit 115, Step S4D3) of the pixel data to obtain the pixel data, the code of the pixel data being specified from the code of the predictive value generated in the generating and the bit change information generated in the inverse quantizing (inverse conversion processing unit 115x, Steps S4D3 to S4D4).

The image decoding method may include performing an exclusive OR operation on the bit change information generated in the inverse quantizing and the code of the predictive value generated in the generating, to generate the code of the pixel data as a result of the operation (code generation unit 115, Step S4D3).

For example, the code generation step (the above-mentioned performing) (Step S4D3) may be included in the inverse code conversion step (the above-mentioned inverse code-converting) (Steps S4D3 and S4D4).

Alternatively, the code generation step (Step S4D3) may not be included in the above-mentioned inverse code conversion step (only Step S4D4).

That is, the result of Step S4D3 performed separately from the inverse code conversion step (only Step S4D4) may be used in the inverse code conversion step (only Step S4D4).

Likewise, the result of Step S4D3 performed separately from the image decoding method may be used in the image decoding method.

The determining may include specifying the quantization width and bit pattern information indicated by a quantization information ID, the bit pattern information being information for specifying an adopted bit pattern from among a plurality of bit patterns. In other words, the quantization width and the bit pattern information may be indicated by the quantization information ID.

The present invention may be realized as an integrated circuit, a method, a digital still camera, a digital video camera, a surveillance camera, a solid-state imaging device (including the image coding apparatus or the like), a computer program, and so on.

Part or whole of the above-mentioned operations may be realized by operations described below.

EMBODIMENT

Figure 2:
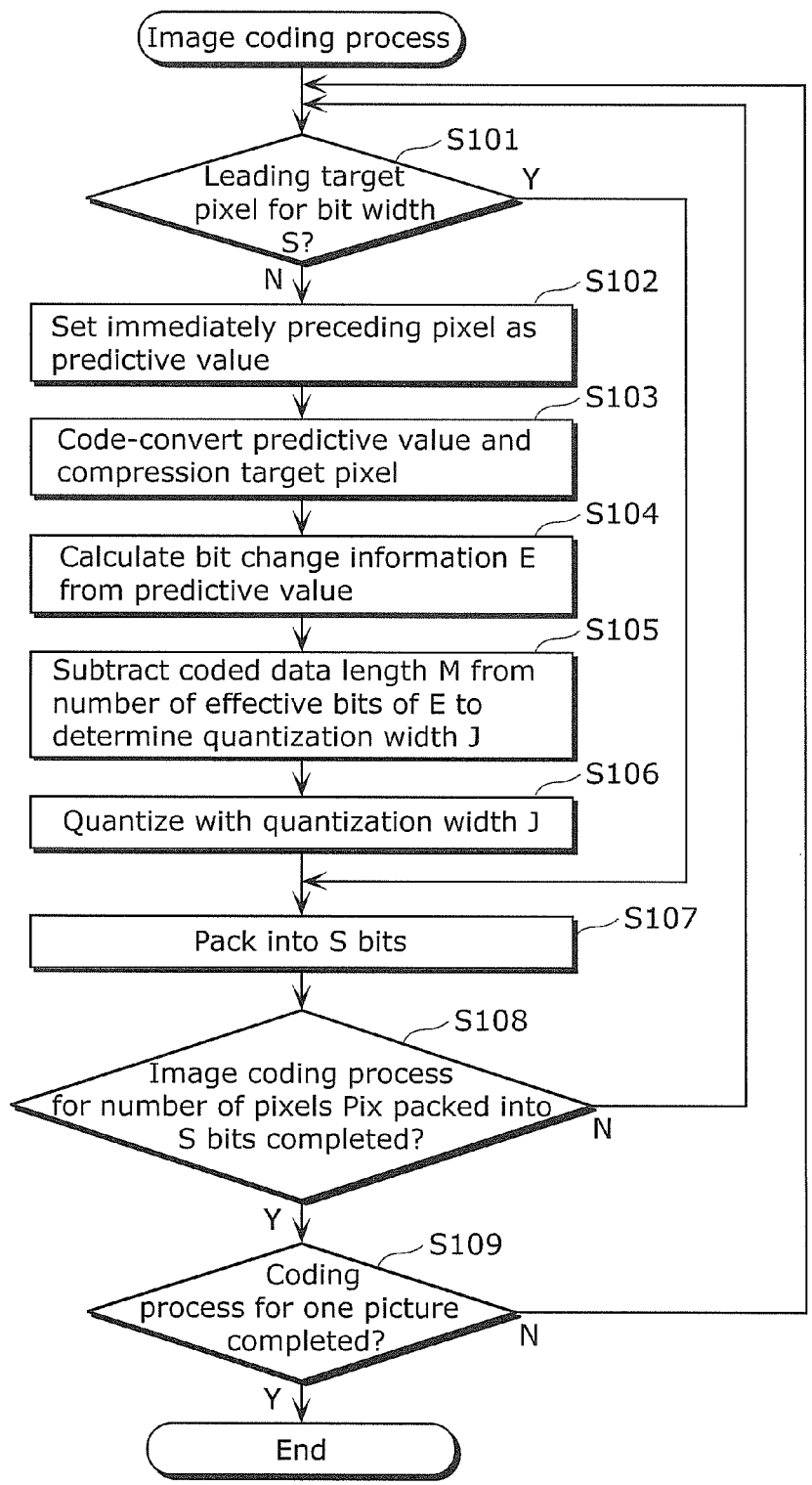
FIG. 2 is a flowchart showing an image coding process in an image coding apparatus.

FIG. 2 is a flowchart showing an image coding method in the embodiment of the present invention.

Figure 3:
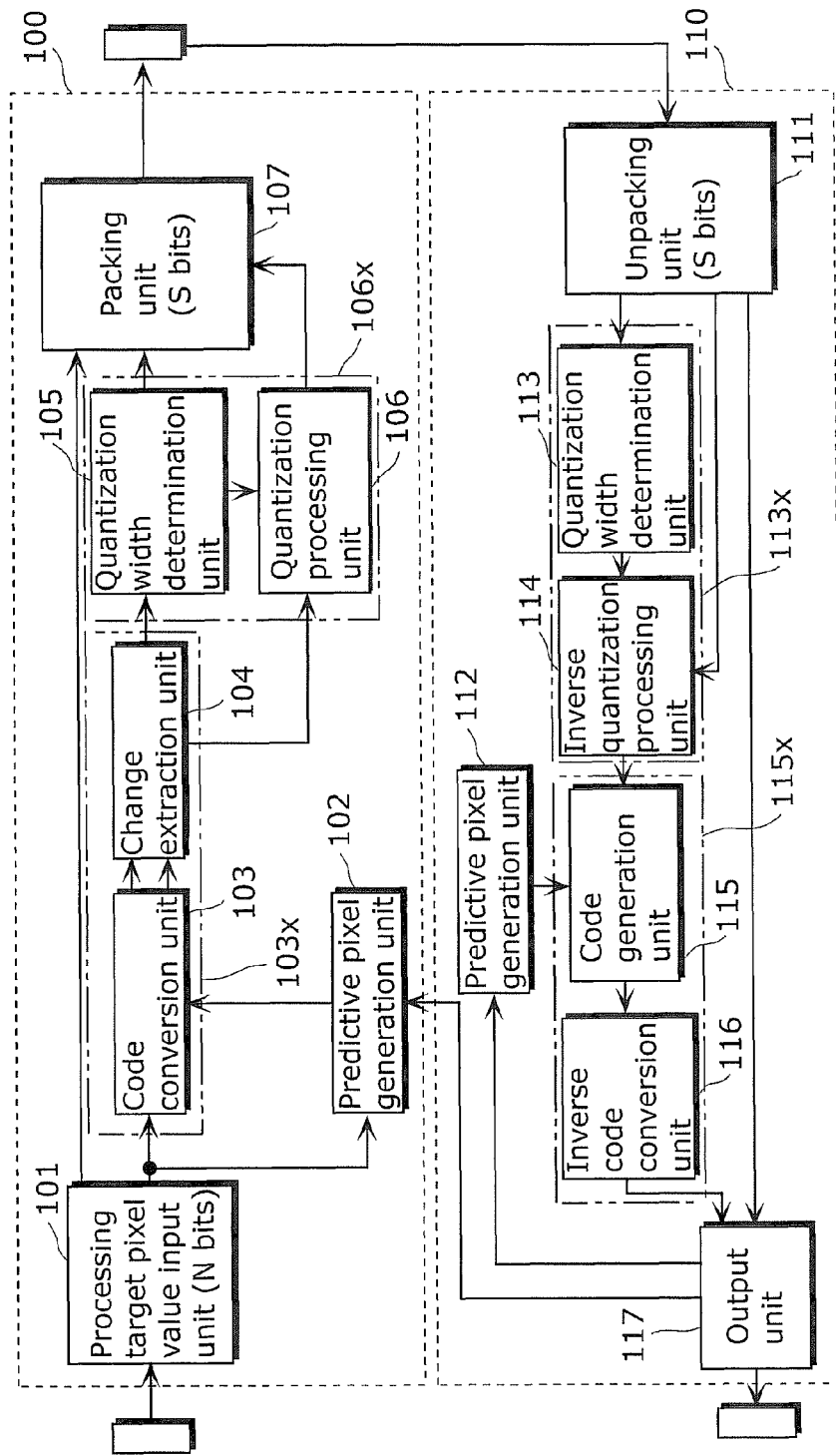
FIG. 3 is a block diagram showing structures of an image coding apparatus and an image decoding apparatus in an embodiment of the present invention.

FIG. 3 is a block diagram showing structures of an image coding apparatus 100 and an image decoding apparatus 110 in the embodiment of the present invention.

Note that part or whole of a coding process of the image coding apparatus 100 in this embodiment is implemented by hardware such as LSI (Large Scale Integration) or a program executed by a CPU (Central Processing Unit) or the like. The same applies to each variation of this embodiment.

(Image Coding Process)

The following describes a process of coding an image (hereafter referred to as an image coding process) by the image coding apparatus 100, with reference to FIGS. 2 and 3.

A processing target pixel value input unit 101 (FIG. 3) receives a pixel (target pixel) to be coded.

In this embodiment, it is assumed that each piece of pixel data is digital data of N bits, and quantized pixel data (hereafter referred to as a quantization value) corresponding to each piece of pixel data is digital data of M bits.

At least one leading target pixel, a plurality of quantization values corresponding to a plurality of pieces of pixel data, and a code (hereafter referred to as quantization width information) indicating a quantization width of each quantization value are packed into S bits by a packing unit 107. The packed data is then outputted from the image coding apparatus 100.

Here, N, M, and S are predetermined natural numbers.

The processing target pixel value input unit 101 provides the received pixel data to a predictive pixel generation unit 102 and a code conversion unit 103 at appropriate timings.

In the case where the coding target pixel of interest received by the processing target pixel value input unit 101 is a leading target pixel (Step S101 in FIG. 2: YES), a quantization process (Steps S102 to S106) is omitted, and the processing target pixel value input unit 101 directly provides the received pixel data to the packing unit 107.

In the case where the coding target pixel of interest is not a leading target pixel (Step S101 in FIG. 2: NO), on the other hand, the process goes to predictive pixel generation.

Here, the pixel data provided to the predictive pixel generation unit 102 is any of the following first to third data. The first data is a leading target pixel received by the processing target pixel value input unit 101 earlier than the coding target pixel of interest. The second data is a preceding coding target pixel received by the processing target pixel value input unit 101 earlier than the coding target pixel of interest. The third data is pixel data obtained by decoding, by the image decoding apparatus 110, coded data generated by the image coding apparatus 100 and sent to the image decoding apparatus 110 earlier.

The predictive pixel generation unit 102 generates a predictive value of the current target pixel of interest, using the received pixel data (e.g. the above-mentioned first data) (Step S102 in FIG. 2).

As a pixel data coding method, prediction coding is available. Prediction coding is a method of generating a predictive value for a coding target pixel and coding a difference between the coding target pixel and the predictive value. In the case of pixel data, there is a high possibility that a pixel near a pixel of interest has a value equal or close to the pixel of interest. Based on this, the value of the coding target pixel of interest is predicted from surrounding pixel data, as the predictive value. The difference is minimized in this manner, thereby reducing the quantization width.

Figure 4:
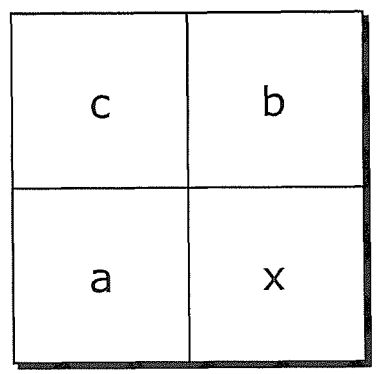
FIG. 4 is a diagram explaining prediction expressions in a predictive pixel generation unit.

FIG. 4 is a diagram explaining positions of surrounding pixels used for predictive value calculation.

In FIG. 4, "x" is a pixel value of a pixel of interest (target pixel), and "a", "b", and "c" are pixel values of three surrounding pixels for calculating a predictive value "y" of the pixel of interest. The following prediction expressions (1) to (7) are typically used.

$$y=a \quad (1)$$

$$y=b \quad (2)$$

$$y=c \quad (3)$$

$$y=a+b-c \quad (4)$$

$$y=a+(b-c)/2 \quad (5)$$

$$y=b+(a-c)/2 \quad (6)$$

$$y=(a+b)/2 \quad (7)$$

The predictive pixel generation unit 102 calculates the predictive value "y" of the pixel of interest using any of the pixel values "a", "b", and "c" of the surrounding pixels of the pixel of interest. The predictive pixel generation unit 102 then finds a prediction error $\Delta$ ($=y-x$) between the predictive value "y" and the coding target pixel "x", and codes the predictive error $\Delta$. Thus, the predictive pixel generation unit 102 calculates the predictive value using a prediction expression (e.g. the prediction expression (1)) out of the above-mentioned prediction expressions (1) to (7) used for prediction coding, and provides the calculated predictive value to the code conversion unit 103.

In such a case where an internal memory buffer available for use in compression processing can be reserved, not only the above-mentioned prediction expressions but also other prediction expressions for improving prediction accuracy may be employed by further storing surrounding pixels other than the pixels adjacent to the pixel of interest in the memory buffer and using these pixels for prediction.

In this embodiment, the prediction expression (1) is used in Step S102, as an example.

The code conversion unit 103 code-converts each of the coding target pixel received from the processing target pixel value input unit 101 and the predictive value received from the predictive pixel generation unit 102, to a code (Gray code) expressed in N bits. The code conversion unit 103 provides the code (hereafter referred to as the code of the target pixel) corresponding to the coding target pixel and the code (hereafter referred to as the code of the predictive value) corresponding to the predictive value obtained as a result of code conversion, to the change extraction unit 104 (Step S103 in FIG. 2).

The change extraction unit 104 performs an exclusive OR operation on the code of the coding target pixel and the code of the predictive value each expressed in N bits, to obtain bit change information E of N bits. The bit change information is a code that is used together with the code of the predictive value to calculate the code of the target pixel. The change extraction unit 104 provides the obtained bit change information E to a quantization width determination unit 105 and a quantization processing unit 106 (Step S104 in FIG. 2).

The quantization width determination unit 105 determines a quantization width J based on the bit change information E received from the change extraction unit 104, and provides the determined quantization width J to the quantization processing unit 106 and the packing unit 107 (Step S105 in FIG. 2).

The quantization width J is a value obtained by subtracting a bit length M of a quantization value from the number of effective bits of the bit change information E. Here, J is a positive integer, and is set to 0 in the case where the number of effective bits of the bit change information E is smaller than the bit length M of the quantization value generated by quantization.

The quantization processing unit 106 performs a quantization process of quantizing the bit change information E received from the change extraction unit 104, with the quantization width J calculated by the quantization width determination unit 105.

The quantization process with the quantization width J is a bit shift operation that shifts the bit change information E between the coding target pixel and the predictive value of the coding target pixel lower by the quantization width J.

The quantization processing unit 106 provides the quantization result (quantization value) to the packing unit 107 (Step S106 in FIG. 2).

It may be understood here that the quantization processing unit 106 does not perform quantization in the case where the quantization width J is 0.

The packing unit 107 combines at least one leading target pixel, a plurality of quantization values, and at least one piece of quantization width information of Q bits (Q is a natural number), thereby packing these data into S-bit data (packed data) (see, for example, FIGS. 7A and 7B described later).

The packing unit 107 outputs the packed data to a memory such as an SDRAM or an unpacking unit 111 (Step S107 in FIG. 2).

The fixed bit length S (mentioned above) which is the bit length of the packed data may be the same number of bits as a data transfer bus width in an integrated circuit used. In the case where there is any unused bit at the end of the packed data, dummy data (e.g. rightmost 4 bits in FIG. 7A described later) is inserted so as to reach S bits.

The following describes the image coding process in this embodiment in more detail.

FIG. 5 is a diagram explaining the image coding process in this embodiment.

The processing target pixel value input unit 101 sequentially receives pixel data of a fixed bit length (N bits). Suppose the data amount of the pixel data received by the processing target pixel value input unit 101 is 12 bits (N=12), that is, the pixel data has a dynamic range (see the two number lines in FIG. 1) of 12 bits. Also suppose the quantization value bit length M is 8 bits. The packing unit 107 packs the received data into S bits, and outputs the packed data from the image coding apparatus 100. The fixed bit length S is supposed to be 64 bits.

In this embodiment, the code conversion performed by the code conversion unit 103 is Gray code conversion. The reason for converting the pixel data to a Gray code is that a bit change when representing an approximate value can be reduced to attain a higher compression rate.

As a method of converting a decimal value to a Gray code, a method of exclusive ORing each bit and its adjacent higher bit sequentially from a least significant bit in a bit string that represents the decimal value in binary code is typically employed. Any code conversion other than Gray code conversion is also applicable so long as a bit change between original data and data representing an approximate value of the original data is smaller than a bit change expressed in binary code.

In FIG. 5, six pieces of pixel data received by the processing target pixel value input unit 101 are shown as an example.

The processing target pixel value input unit 101 receives 12-bit pixel data corresponding to each of pixels P1, P2, ..., P6 in this order. A numeric value (e.g. 300) shown in each of the fields of the pixels P1 to P6 is a signal level indicated by the corresponding pixel data. Here, the pixel data corresponding to the pixel P1 is a leading target pixel.

This embodiment describes an example where the predictive pixel generation unit 102 calculates the predictive value of the coding target pixel according to the prediction expression (1) out of the above-mentioned prediction expressions (1) to (7). This being the case, the calculated predictive value of the coding target pixel is a value ("a" in FIG. 4) of a left adjacent pixel of the coding target pixel. That is, the predictive pixel generation unit 102 predicts that the pixel value of the coding target pixel has a high possibility of being the same pixel value (level) as the pixel received immediately before the coding target pixel.

In the image coding process in FIG. 2, Step S101 is performed first. In Step S101, the processing target pixel value input unit 101 determines whether or not the received pixel data is a leading target pixel. In the case where the determination of Step S101 results in YES, the processing target pixel value input unit 101 stores the received pixel data in an internal buffer, and also provides the received pixel data to the packing unit 107. The process then goes to below-mentioned Step S107. In the case where the determination of Step S101 results in NO, on the other hand, the process goes to Step S102.

When the processing target pixel value input unit 101 receives the pixel data of the pixel P1 which is a leading target pixel, the processing target pixel value input unit 101 stores the received pixel data in the internal buffer, and also provides the received pixel data to the packing unit 107.

In the case where pixel data has already been stored in the internal buffer, the processing target pixel value input unit 101 writes the received pixel data over the already stored pixel data in the internal buffer.

It is assumed here that the pixel P2 is the coding target pixel (current target pixel). The processing target pixel value input unit 101 receives the pixel data (coding target pixel data) of the pixel P2, where the received coding target pixel data indicates a pixel value "220" (see FIG. 5). Since the received pixel data is not a leading target pixel (Step S101: NO), the processing target pixel value input unit 101 provides the received pixel data to the code conversion unit 103.

In the case where the determination of Step S101 results in NO, the processing target pixel value input unit 101 also provides the pixel data stored in the internal buffer to the predictive pixel generation unit 102. The pixel data provided here indicates the pixel value "300" of the pixel P1.

The processing target pixel value input unit 101 stores the received coding target pixel data in the internal buffer by overwriting, and provides the received coding target pixel data to the code conversion unit 103. The process then goes to Step S102.

In Step S102, the predictive pixel generation unit 102 calculates the predictive value of the coding target pixel. In detail, the predictive pixel generation unit 102 calculates the predictive value using, for example, the prediction expression (1) as mentioned earlier. This being so, the pixel value ("300") (the pixel value of P1) indicated by the pixel data received from the processing target pixel value input unit 101 is calculated by the predictive pixel generation unit 102 as the predictive value. The predictive pixel generation unit 102 provides the calculated predictive value "300" to the code conversion unit 103.

Thus, in the case where the (h−1)-th pixel data is a leading target pixel when calculating the predictive value of the h-th coding target pixel, the predictive pixel generation unit 102 specifies, as the predictive value, the value indicated by the (h−1)-th pixel data received from the processing target pixel value input unit 101 as described above.

In the case where the (h−1)-th pixel data is not a leading target pixel, on the other hand, the predictive pixel generation unit 102 may specify a value provided to the image coding apparatus 100 from the image decoding apparatus 110, as the predictive value. This value is a value corresponding to the (h−1)-th pixel data coded by the image coding apparatus 100. That is, the predictive pixel generation unit 102 may obtain (receive), from the image decoding apparatus 110, a pixel value (value) indicated by pixel data generated by the image decoding apparatus 110 decoding input data, and specify the obtained pixel value as the predictive value of the h-th coding target pixel. By doing so, even in the case where an error occurs as a result of quantization in the quantization processing unit 106, two predictive values used respectively in the image coding apparatus 100 and the image decoding apparatus 110 can be made in agreement with each other, with it being possible to suppress image quality degradation.

In Step S103, the code conversion unit 103 performs Gray code conversion on each of the coding target pixel and the predictive value. Here, the code conversion unit 103 receives the coding target pixel data of the value "220" (the value of P2 in FIG. 5) and the predictive value "300" (the value of P1). Accordingly, the code of the target pixel and the code of the predictive value as a result of code conversion are respectively "000010110010" and "000110111010" which are each a Gray code of N (12) bits (the second row and third and second columns in the upper table in FIG. 5).

In Step S104, the change extraction unit 104 performs an exclusive OR operation. In detail, the change extraction unit 104 takes an exclusive OR of the code of the target pixel and the code of the predictive value received from the code conversion unit 103, to calculate the bit change information E.

Here, the change extraction unit 104 receives the code of the target pixel "000010110010" and the code of the predictive value "000110111010" (the second row and third and second columns in the upper table in FIG. 5). The change extraction unit 104 exclusive ORs the code of the target pixel ("000010110010") and the code of the predictive value ("000110111010"), to calculate the bit change information E "000100001000" ("100001000") (the first row and second column in the lower table in FIG. 5).

The change extraction unit 104 provides the calculated bit change information E to the quantization width determination unit 105 and the quantization processing unit 106.

In Step S105, the quantization width determination unit 105 performs a quantization width determination process. In the quantization width determination process, the quantization width determination unit 105 specifies the number of effective bits (the bit length underlined in the first row and second column in the lower table in FIG. 5) of the bit change information E (the first row and second column in the lower table in FIG. 5), i.e. a bit length necessary for expressing bit change information.

Here, the bit change information E is "000100001000" (the first row and second column in the lower table in FIG. 5). In this case, the number of effective bits is 9 bits. Thus, for example, the number of effective bits is a result of subtracting, from a total number of bits (12 in the above example) of the code, the number of consecutive "0"s (3 in the above example) from the most significant bit in the code, where the number of consecutive "0"s is equal to or more than 0.

The quantization width determination unit 105 sets the quantization width J, using the predetermined quantization value bit length M and the number of effective bits of the bit change information E.

Suppose the predetermined quantization value bit length M is 8. The quantization width determination unit 105 sets the quantization width J to 1, from J=9−8. That is, the quantization width determination unit 105 subtracts the quantization value bit length (e.g. 8) from the number of effective bits (e.g. 9), and sets the difference (1) as the quantization width J.

The quantization width determination unit 105 provides the calculated quantization width J to the quantization processing unit 106. The quantization width determination unit 105 also generates quantization width information (see FIG. 6 described later) of Q bits by coding the quantization width J, and provides the generated quantization width information to the packing unit 107. The bit length Q of the quantization width information is assumed here to be 2.

FIG. 6 is a diagram showing a table of correspondence between the number of effective bits of the bit change information E, the quantization width J, and the Q-bit quantization width information.

When the quantization width J calculated by the quantization width determination unit 105 is 1, the quantization width information provided to the packing unit 107 is "01" as shown in FIG. 6.

Note that, since J is a non-negative number, J is set to 0 when the number of effective bits of the bit change information E is smaller than M (8).

In Step S106, the quantization processing unit 106 performs a quantization process. In the quantization process, the quantization processing unit 106 receives the quantization width J calculated by the quantization width determination unit 105, and performs a bit shift operation that shifts the bit change information E received from the change extraction unit 104 lower by the number of bits indicated by the received quantization width J, thereby quantizing the received bit change information E.

Here, the quantization width J received from the quantization width determination unit 105 is 1, and the bit change information E received from the change extraction unit 104 is "000100001000" (the first row and second column in the lower table in FIG. 5). The quantization processing unit 106 bit-shifts "000100001000" lower by the quantization width J (1), to yield "00010000100" (quantization value). Since the quantization value bit length M is 8 bits, the quantization processing unit 106 provides low-order 8-bit data in the calculated quantization value "00010000100", i.e. quantized bit change information "10000100", to the packing unit 107.

In Step S107, the packing unit 107 performs a packing process of packing into predetermined S bits. In the packing process, the packing unit 107 stores the leading target pixel P1 received from the processing target pixel value input unit 101, in an S-bit buffer memory. After storing the leading target pixel P1, the packing unit 107 sequentially stores the Q-bit quantization width information as a result of coding the quantization width J received from the quantization width determination unit 105 and the quantization value of the coding target pixel P2 received from the quantization processing unit 106, in the buffer memory.

Here, the fixed bit length S (packed data bit length) is 64, and the bit length Q of the quantization width information is 2 (see the third column in FIG. 6). Since the quantization value of the coding target pixel is 8 bits, coded data of 22 bits (=12 (the bit length of the leading target pixel P1)+2 (the bit length of the quantization width information)+8 (the bit length of the quantization value)) is stored from the beginning of the 64-bit buffer memory (see leftmost 22 bits in FIG. 7B).

After the packing process for the coding target pixel ends, the process goes to Step S108.

In Step S108, the image coding apparatus 100 determines whether or not the image coding process for the number of pixels Pix packed into S bits is completed. It is assumed here that Pix is calculated beforehand according to the following expression (8).

$$\text{Pix}=S/(Q+M) \quad (8)$$

Since the fixed bit length S is 64, the bit length Q of the quantization width information is 2, and the bit length of the quantization value is 8, Pix is 6 pixels according to the expression (8).

In the case where the determination of Step S108 results in NO, the process goes to Step S101, and the image coding apparatus 100 executes at least one of Steps S101 to S107 on the next pixel data received by the processing target pixel value input unit 101. The image coding apparatus 100 thus repeats Steps S101 to S107 for the pixels P3 to P6 shown in FIG. 5, and sequentially stores resulting data in the buffer memory.

In the case where the determination of Step S108 results in YES, the image coding apparatus 100 outputs the coded data in the buffer memory on an S-bit basis, and then the process goes to Step S109.

In Step S109, the image coding apparatus 100 determines whether or not the coding process for one picture is completed as a result of outputting the coded pixel data in preceding Step S108. In the case where the determination of Step S109 results in YES, the coding process ends. In the case where the determination of Step S109 results in NO, the process goes to Step S101 to execute at least one of Steps S101 to S108.

Data resulting from each of the above-mentioned processes and operations is shown in FIG. 5. In detail, FIG. 5 shows the data as a result of code-converting the coding target pixels P2 to P6 by the code conversion unit 103 (the second row in the upper table in FIG. 5), the exclusive OR (the first row in the lower table), the number of effective bits (the second row in the lower table), the quantization width (the third row in the lower table), and the 8-bit quantization value packed by the packing unit 107 (the fourth row in the lower table).

Figure 7A:
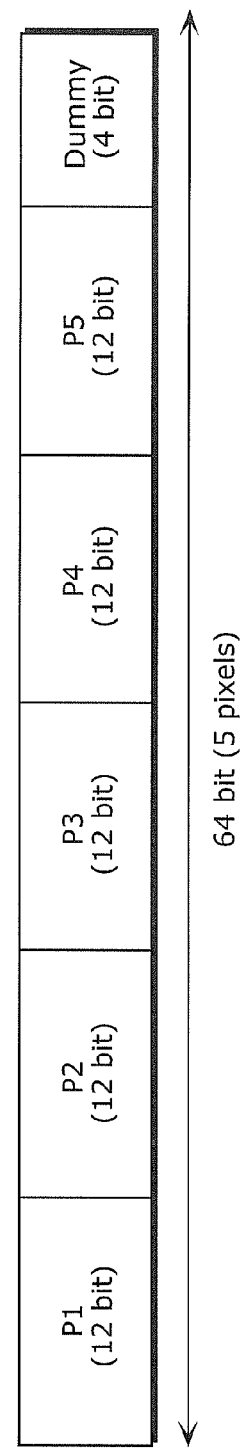
FIG. 7A is a diagram showing a bit image before image coding.

FIG. 7A is a diagram showing a bit image of S bits in the case where the image coding process is not applied.

Figure 7B:
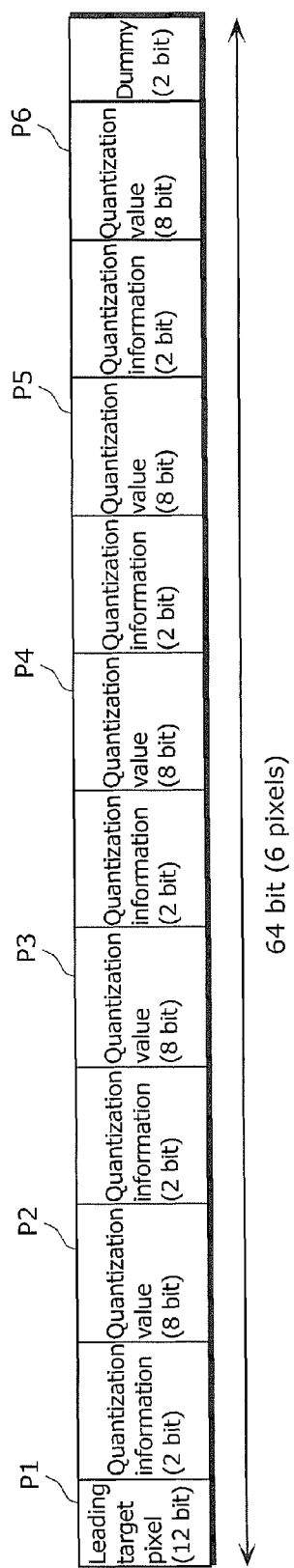
FIG. 7B is a diagram showing a bit image after image coding.

FIG. 7B is a diagram showing a bit image of S bits stored in the buffer memory by the packing unit 107 and outputted from the image coding apparatus 100, in the case where the image coding process is applied.

In FIG. 7B, the packing unit 107 first receives the pixel P1 of N (12) bits as the leading target pixel, as shown by leftmost 12 bits. For each of the succeeding pixel data P2 to P6, the quantization width information and the quantization value are paired as coded data of Q (2) bits and M (8) bits respectively. Thus, the coded data of the pixel P2 and the like is included in the packed data, following the first 12-bit data. By coding the pixels P2 to P6 in the above manner, a larger number of pixels can be included in the packed data of the same bit length.

Moreover, by setting the bit length S of the data packed by the packing unit 107 to the data transfer bus width in the integrated circuit used, the number of pixels transmittable in one transfer can be increased, with it being possible to ensure that the bus width is fixed in length. Accordingly, in the case where data access to compressed pixel data is requested, the data access can be made merely by accessing data packed per bus width. If the bus width and the packed data bit length do not match as there is one or more unused bits, the unused bits may be replaced with dummy data as shown in FIGS. 7A and 7B.

As described above, according to this embodiment, the code conversion by the code conversion unit 103 performed upon quantization for reducing the information amount of the bit change information enables quantization error reduction. Moreover, the bit change information is quantized to a fixed length code, so that image quality degradation can be reduced while maintaining random accessibility.

(Image Decoding Process)

Figure 8:
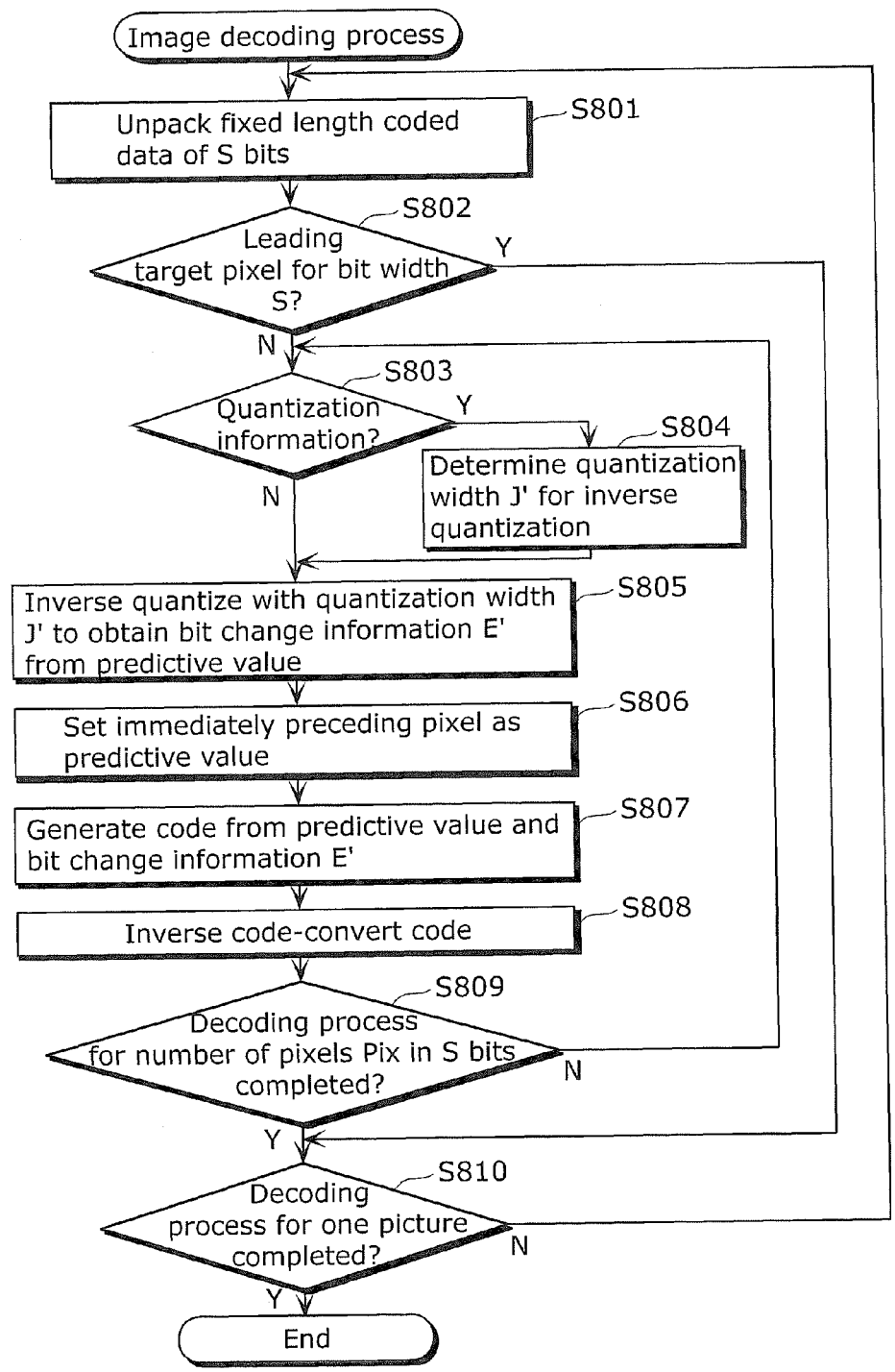
FIG. 8 is a flowchart showing a decoding process in an image decoding apparatus.

FIG. 8 is a flowchart showing an image decoding method.

The following describes a process of decoding coded data (hereafter referred to as an image decoding process) by the image decoding apparatus 110, with reference to FIGS. 3 and 8.

FIG. 8 is a flowchart showing the image decoding process performed by the image decoding apparatus 110 shown in FIG. 3.

For example, the unpacking unit 111 receives coded data necessary for reconstructing the pixels P1 to P6 shown in FIG. 5.

The unpacking unit 111 analyzes fixed length coded data of S bits received from the packing unit 107 or the memory such as the SDRAM, and separates the fixed length coded data into a plurality of pieces of data. That is, the unpacking unit 111 separates the received fixed length coded data into a leading target pixel of N bits, quantization width information of Q bits, and a pixel to be decoded (hereafter referred to as a decoding target pixel, i.e. a quantization value) of M bits (Step S801 in FIG. 8).

The unpacking unit 111 provides the analyzed coded data to a quantization width determination unit 113, an inverse quantization processing unit 114, and an output unit 117 at appropriate timings.

In the case where coded data of interest is a leading target pixel (Step S802 in FIG. 8: YES), the unpacking unit 111 receives the coded data as pixel data of N bits having a pre-coding dynamic range. In such a case, an inverse quantization process is omitted, and the unpacking unit 111 provides the coded data of interest directly to the output unit 117.

In the case where the coded data of interest is quantization width information (Step S803 in FIG. 8: YES), the unpacking unit 111 provides the coded data to the quantization width determination unit 113, where the process goes to a quantization width determination process in inverse quantization (Step S804 in FIG. 8).

The quantization width determination unit 113 determines a quantization width J' for inverse quantization corresponding to each decoded target pixel, from the coded data (quantization width information) received from the unpacking unit 111. The quantization width determination unit 113 provides the determined quantization width J' to the inverse quantization processing unit 114.

In the case where the coded data of interest is not quantization width information (Step S803 in FIG. 8: NO), the unpacking unit 111 provides the coded data to the inverse quantization processing unit 114, where the process goes to an inverse quantization process.

In the inverse quantization process, the inverse quantization processing unit 114 performs inverse quantization with the quantization width J' for inverse quantization received from the quantization width determination unit 113. The inverse quantization process with the quantization width J' is a bit shift operation that shifts the coded data (quantization value) received from the unpacking unit 111 higher by the quantization width J'.

The inverse quantization processing unit 114 calculates bit change information E' expressed in N bits, as a result of the inverse quantization process.

It may be understood here that the inverse quantization processing unit 114 does not perform inverse quantization in the case where the quantization width J' is 0 (Step S805 in FIG. 8).

Data received by a predictive pixel generation unit 112 is data inputted earlier than the decoding target pixel of interest and provided from the output unit 117. This data is either a leading target pixel or pixel data (hereafter referred to as decoded pixel data) decoded and provided from the output unit 117 earlier.

The predictive pixel generation unit 112 generates a predictive value expressed in N bits, using the received pixel data.

A predictive value generation method employed here is a method using any of the above-mentioned prediction expressions (1) to (7). The predictive pixel generation unit 112 calculates the predictive value using the same prediction expression as the predictive pixel generation unit 102 in the image coding apparatus 100.

The predictive pixel generation unit 112 provides the calculated predictive value to a code generation unit 115 (Step S806 in FIG. 8).

The code generation unit 115 performs the same code conversion (Gray code conversion) as the code conversion unit 103 in the image coding apparatus 100, on the predictive value received from the predictive pixel generation unit 112. The code generation unit 115 thus generates a code of the predictive value.

That is, the received predictive value is a value before code conversion such as Gray code conversion. The code generation unit 115 performs the same code conversion as the code conversion unit 103 on such a received predictive value, to yield a code. In this way, the code generation unit 115 calculates the code (Gray code) corresponding to the received predictive value.

The code generation unit 115 then performs an exclusive OR operation on the bit change information E' of N bits received from the inverse quantization processing unit 114 and the code of the predictive value obtained by code conversion, to generate a code of the target pixel of N bits. The code generation unit 115 provides the generated code of the target pixel to an inverse code conversion unit 116 (Step S807 in FIG. 8).

The inverse code conversion unit 116 performs inverse conversion of the code conversion performed by the code conversion unit 103 in the image coding apparatus 100, on the code of the target pixel received from the code generation unit 115, thereby reconstructing pixel data. The inverse code conversion unit 116 provides the pixel data obtained by the inverse code conversion, to the output unit 117 (Step S808 in FIG. 8).

The following describes the image decoding process in this embodiment in more detail.

Figure 9:
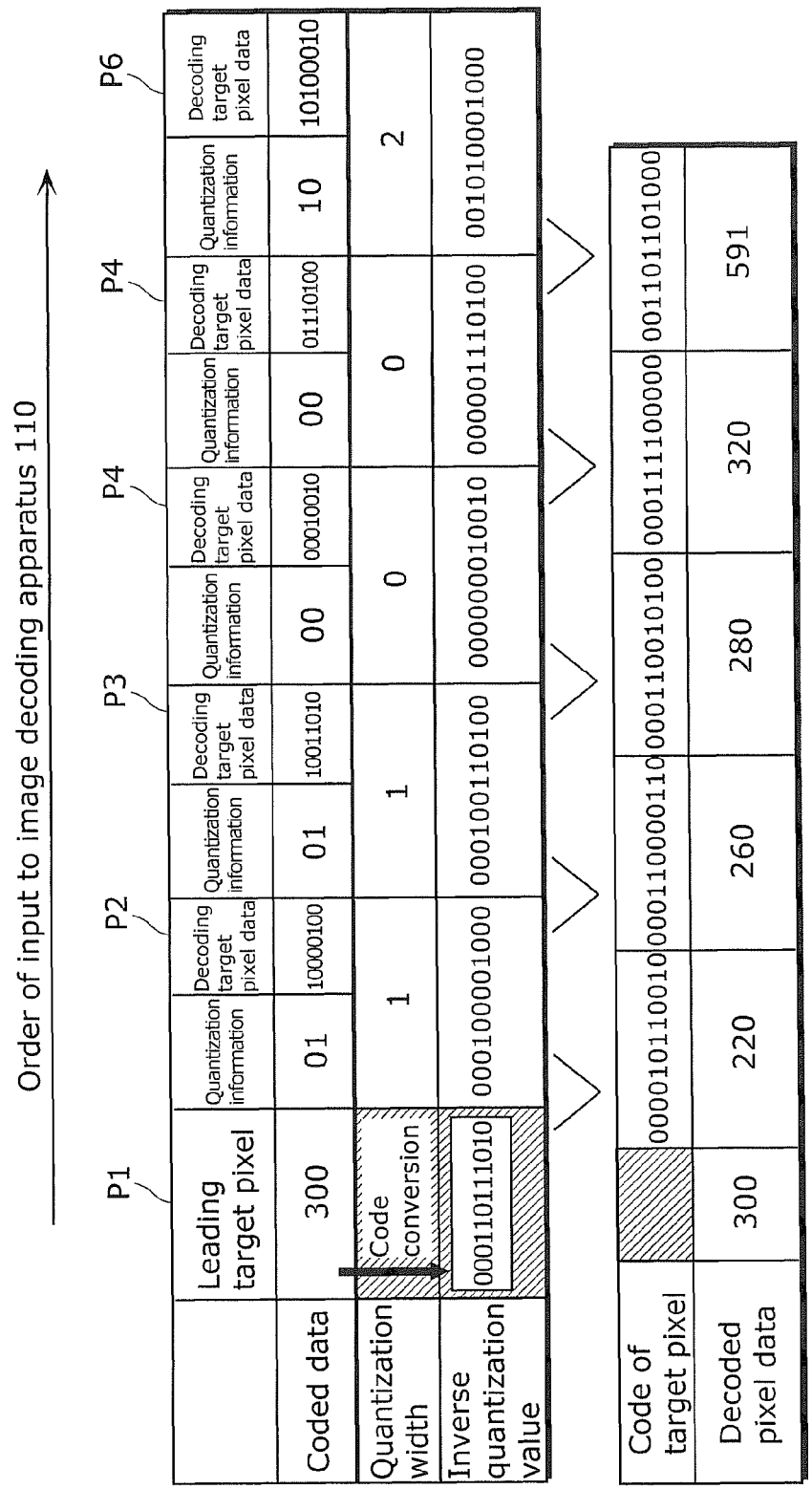
FIG. 9 is a diagram showing a decoding process example and each operation result.

FIG. 9 is a diagram explaining the image decoding process in this embodiment.

Here, the unpacking unit 111 receives packed data on a 64-bit basis (S=64).

The unpacking unit 111 sequentially receives a 12-bit leading target pixel (N=12, leftmost data in FIG. 7B), 2-bit quantization width information (Q=2, second data), and 8-bit decoding target pixel data (M=8, third data).

In FIG. 9, the image decoding apparatus 110 receives the data resulting from the image coding process of the six pieces of pixel data (pixels P1 to P6) in FIG. 5, as an example.

That is, the plurality of pieces of coded data stored in the external memory are sequentially provided to the unpacking unit 111 as shown in FIG. 7B.

The pixel data of the pixel P1 is a leading target pixel, and so is expressed in 12 bits. Meanwhile, the data (quantization value) of each of the pixels P2 to P6 is decoding target pixel data, and so is expressed in 8 bits.

In the image decoding process, Step S801 is performed first. In Step S801, the unpacking unit 111 separates the coded data into predetermined bits as shown in FIG. 7B. The process then goes to Step S802.

In Step S802, the unpacking unit 111 or the like determines whether or not the separated coded data is data of a leading target pixel. In the case where the determination of Step S802 results in YES, the unpacking unit 111 provides the received pixel data to the output unit 117. The process then goes to below-mentioned Step S810. In the case where the determination of Step S802 results in NO, on the other hand, the process goes to Step S803.

Suppose the unpacking unit 111 receives the pixel data of the pixel P1 as a leading target pixel (Step S802: YES), and the leading target pixel indicates a pixel value "300" (the second row and second column in the upper table in FIG. 9). In this case, the unpacking unit 111 provides the received pixel data "300" to the output unit 117.

The output unit 117 provides the received leading target pixel to the predictive pixel generation unit 112.

In Step S803, the unpacking unit 111 determines whether or not the separated coded data is quantization width information. In the case where the determination of Step S803 results in NO, the process goes to below-mentioned Step S805. In the case where the determination of Step S803 results in YES, on the other hand, the unpacking unit 111 provides the received quantization width information to the quantization width determination unit 113. The process then goes to Step S804.

Suppose the coded data separated by the unpacking unit 111 is the quantization width information of the pixel P2, and the quantization width information indicates "01" (the second row and third column in the upper table in FIG. 9). In this case, the unpacking unit 111 provides the quantization width information "01" to the quantization width determination unit 113.

In Step S804, the quantization width determination unit 113 calculates the quantization width J' for inverse quantization, from the received quantization width information. The quantization width J' needs to be in agreement with the quantization width J used in the image coding process, and so is calculated based on the correspondence relationship in the table shown in FIG. 6.

When the quantization width information received by the quantization width determination unit 113 is "01" (the second row and third column in the upper table in FIG. 9), the quantization width J' is 1 (the third row and third column) as shown in FIG. 6.

Suppose the pixel P2 is a decoding target pixel and the coded data separated by the unpacking unit 111 is the decoding target pixel data of the pixel P2. Since the separated coded data is not quantization width information (Step S803: NO), the process goes to Step S805. Here, the decoding target pixel data indicates a pixel value "10000100" (a quantization value in the second row and fourth column in the upper table in FIG. 9). The unpacking unit 111 provides the separated decoding target pixel data "10000100" to the inverse quantization processing unit 114.

In Step S805, the inverse quantization processing unit 114 performs an inverse quantization process. In the inverse quantization process, the inverse quantization processing unit 114 performs a bit shift operation that shifts the decoding target pixel data (quantization value) received from the unpacking unit 111 higher by the number of bits indicated by the quantization width J' for inverse quantization received from the quantization width determination unit 113, thereby inverse quantizing the received quantization value. Data yielded as a result of inverse quantization is the bit change information E' expressed in N (12) bits.

Here, the quantization width J' received from the quantization width determination unit 113 is 1 (the third row and third column in the upper table in FIG. 9), and the decoding target pixel data (quantization value) received from the unpacking unit 111 is "10000100" (the second row and fourth column). The inverse quantization processing unit 114 performs inverse quantization by bit-shifting "10000100" higher by 1 bit, to yield "000100001000" (the fourth row and third column). The inverse quantization processing unit 114 provides the calculated code to the code generation unit 115.

It may be understood here that, in the case where the quantization width J' received from the quantization width determination unit 113 is 0, the inverse quantization processing unit 114 provides the decoding target pixel data directly to the code generation unit 115 without performing inverse quantization.

In Step S806, the predictive pixel generation unit 112 calculates the predictive value of the decoding target pixel.

In detail, the predictive pixel generation unit 112 calculates the predictive value using the prediction expression (1) so as to adopt the same prediction method as in Step S102 for predictive pixel generation in the image coding process in the image coding apparatus 100.

Here, the predictive pixel generation unit 112 calculates the predictive value of the pixel P2. According to the prediction expression (1), the predictive pixel generation unit 112 specifies the pixel data of the pixel P1 which is decoding target pixel data received immediately before the pixel P2, as the current predictive value. That is, the predictive pixel generation unit 112 receives the pixel value "300" (the second row and second column in the upper table in FIG. 9) of the pixel P1 from the output unit 117, and sets the received pixel value "300" as the current predictive value.

Figure 10:
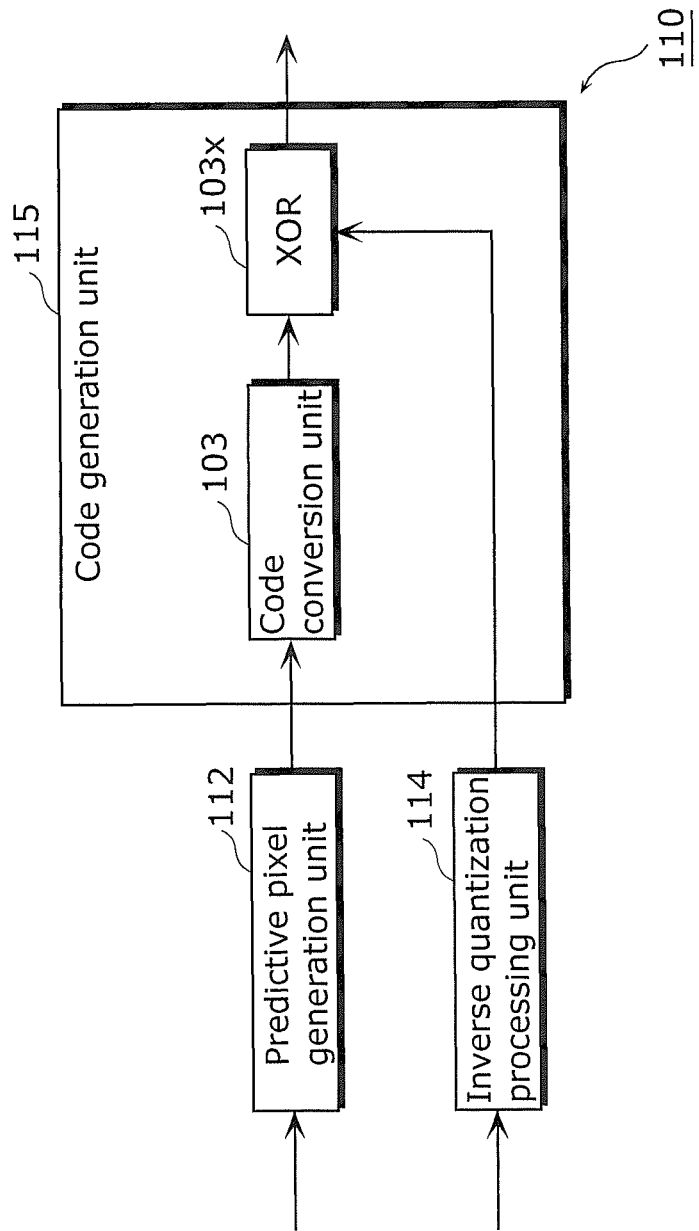
FIG. 10 is a block diagram showing a structure of a code generation unit.

FIG. 10 is a diagram showing a structure of the code generation unit 115.

In Step S807, the code generation unit 115 calculates the code of the target pixel from the code of the predictive pixel, which is obtained by the code generation unit 115 code-converting the predictive value received from the predictive pixel generation unit 112, and the bit change information E' received from the inverse quantization processing unit 114. In detail, in FIG. 10, the code generation unit 115 performs the same code conversion as the code conversion unit 103 in the image coding apparatus 100 on the predictive value received from the predictive pixel generation unit 112, to generate the code (the code of the predictive value).

Here, the predictive value received from the predictive pixel generation unit 112 is "300" (the second row and second column in the upper table in FIG. 9), and the code conversion is Gray code conversion. The code generation unit 115 performs Gray code conversion on "300", to yield "000110111010" (the fourth row and second column in the upper table in FIG. 9) which is the code of the predictive value of N (12) bits.

The code generation unit 115 then performs an exclusive OR operation on the bit change information E' of 12 bits received from the inverse quantization processing unit 114 and the code of the predictive value. The code generation unit 115 generates the code of the target pixel of 12 bits as a result of the exclusive OR operation, and provides the generated code to the inverse code conversion unit 116.

Here, the bit change information E' received from the inverse quantization processing unit 114 is "000100001000" (the fourth row and third column in the upper table in FIG. 9), and the code of the predictive value is "000110111010" (the fourth row and second column). The code generation unit 115 takes an exclusive OR of the bit change information E' ("000100001000") and the code of the predictive value ("000110111010") to obtain the code of the target pixel "000010110010" (the first row and third column in the lower table), and provides the obtained code to the inverse code conversion unit 116.

In Step S808, the inverse code conversion unit 116 performs inverse code conversion on the code of the target pixel received from the code generation unit 115, to reconstruct the pixel data. The inverse code conversion is a process of performing the inverse of the code conversion performed by the code conversion unit 103. When the code conversion performed by the code conversion unit 103 is Gray code conversion, the inverse code conversion performed by the inverse code conversion unit 116 is Gray code to binary code conversion.

Here, the code of the target pixel received from the code generation unit 115 is "000010110010" (the first row and third column in the lower table in FIG. 9). The inverse code conversion unit 116 converts the code of the target pixel ("000010110010") to a binary code, thereby yielding "000011011100" ("220" in decimal) (the second row and third column in the lower table).

The inverse code conversion unit 116 provides the pixel data obtained as a result of inverse code conversion, to the output unit 117.

The output unit 117 stores the decoded pixel data in, for example, an external memory and the predictive pixel generation unit 112.

Consider the case where, when calculating the predictive value of the h-th coding target pixel, the image coding apparatus 100 uses the (h−1)-th decoded pixel data decoded by the image decoding apparatus 110 after coding, as the predictive value. The output unit 117 in the image decoding apparatus 110 may provide the (h−1)-th decoded pixel data to the predictive pixel generation unit 102 in the image coding apparatus 100, to store the decoded pixel data in the predictive pixel generation unit 102.

Though the above describes the case where the output unit 117 stores the decoded pixel data in the external memory, the output unit 117 may instead output the decoded pixel data to an external image processing circuit or the like.

In Step S809, the unpacking unit 111 or the like determines whether or not the image decoding process for the number of pixels Pix packed into S bits by the packing unit 107 in the image coding apparatus 100 is completed. It is assumed here that Pix is calculated beforehand according to the expression (8), as in the image coding process.

Since the fixed bit length S (the bit length of the packed data) is 64, the bit length Q of the quantization width information (the number of bits of the quantization width information) is 2, and the bit length of the quantization value is 8, Pix is 6 pixels according to the expression (8) as mentioned above.

In the case where the determination of Step S809 regarding Pix results in NO, the process goes to Step S803, and the image decoding apparatus 110 executes at least one of Steps S803 to S808 on the next coded data received by the unpacking unit 111. The image decoding apparatus 110 thus repeats Steps S803 to S808 for the pixels P3 to P6, and sequentially outputs the target pixels obtained as a result.

In the case where the determination of Step S809 regarding Pix results in YES, the process goes to Step S810.

In Step S810, the unpacking unit 111 or the like determines whether or not the decoding process for one picture is completed as a result of outputting the decoded pixel data by the output unit 117. In the case where the determination of Step S810 results in YES, the decoding process ends. In the case where the determination of Step S810 results in NO, the process goes to Step S801 to execute at least one of Steps S801 to S809.

Next, suppose the pixel P3 is the decoding target pixel. The unpacking unit 111 first analyzes the quantization width information of the pixel P3 (Step S803: YES). Here, the quantization width information of the pixel P3 indicates "01" (the second row and fifth column in the upper table in FIG. 9). The unpacking unit 111 provides the quantization width information "01" to the quantization width determination unit 113. The process then goes to Step S804.

In Step S804, the quantization width determination unit 113 calculates the quantization width J' for inverse quantization, from the received quantization width information. The quantization width determination unit 113 calculates the quantization width J' based on the correspondence relationship shown in FIG. 6.

When the quantization width information received by the quantization width determination unit 113 is "01", the quantization width J' is 1 (the third row and fourth column in the upper table in FIG. 9) as shown in FIG. 6.

The unpacking unit 111 then analyzes the decoding target pixel data (quantization value) of the pixel P3 (Step S803: NO). Here, the decoding target pixel data (quantization value) of the pixel P3 is "10011010" (the second row and sixth column in the upper table in FIG. 9). The unpacking unit 111 provides the decoding target pixel data "10011010" to the inverse quantization processing unit 114. The process then goes to Step S805.

In Step S805, the inverse quantization processing unit 114 inverse quantizes the decoding target pixel data (quantization value) received from the unpacking unit 111, with the quantization width J' for inverse quantization received from the quantization width determination unit 113.

Here, the quantization width J' received from the quantization width determination unit 113 is 1 (the third row and fourth column in the upper table in FIG. 9), and the decoding target pixel data received from the unpacking unit 111 is "10011010" (the second row and sixth column). The inverse quantization processing unit 114 performs inverse quantization by bit-shifting "10011010" higher by 1 bit, to yield "000100110100" (the fourth row and fourth column). The inverse quantization processing unit 114 provides the calculated code to the code generation unit 115.

In Step S806, when calculating the predictive value of the h-th decoding target pixel, the predictive pixel generation unit 112 specifies the (h−1)-th decoded pixel data received from the output unit 117, as the predictive value. This being so, the predictive pixel generation unit 112 calculates the (h−1)-th decoded pixel data, i.e. the decoded pixel data "220" of the pixel P2 (the second row and third column in the lower table in FIG. 9), as the predictive value of the h-th decoding target pixel, and provides the predictive value to the code generation unit 115. The process then goes to Step S807.

Subsequently, the pixel P3 is processed in the same way as the pixel P2 described above, as a result of which the decoded pixel data (e.g. the second row and fourth column in the lower table in FIG. 9) is generated by the inverse code conversion unit 116.

Data resulting from each of the above-mentioned processes and operations is shown in FIG. 9. In detail, FIG. 9 shows the coded data (quantization value) of the decoding target pixels P2 to P6, the quantization width, the inverse quantization value (bit change information), the exclusive OR (the code of the target pixel), and the decoded pixel data outputted from the output unit 117 for each pixel expressed in 12 bits.

The reason why there is no quantization width, inverse quantization value, and exclusive OR for the pixel P1 which is the leading target pixel is as follows. In the case where the coding target pixel is received as the leading target pixel in the image coding process (Step S101 in FIG. 2: YES), the quantization process is omitted, and the coding target pixel is directly provided to the packing unit 107 (Step S107 in FIG. 2). Accordingly, in the image decoding process, too, in the case where the unpacking unit 111 receives the leading target pixel, the unpacking unit 111 directly provides the received pixel data to the output unit 117.

Comparison between the six pieces of pixel data provided to the processing target pixel value input unit 101 in FIG. 5 and the six pieces of decoded pixel data in FIG. 9 reveals that an error occurs in the pixel P6. This error is a truncation error when the quantization processing unit 106 bit-shifts the bit change information lower by the quantization width J, i.e. a quantization error.

This being the case, if the prediction expression (1) is used in the predictive pixel generation (Step S102 in FIG. 2) in the image coding process, an error occurs in the predictive value itself calculated in the predictive pixel generation (Step S806 in FIG. 8) in the image decoding process, in addition to the quantization error. Such an error leads to image quality degradation. In view of this, in the case where the (h−1)-th pixel data is a leading target pixel when calculating the predictive value of the h-th coding target pixel, the value of the (h−1)-th pixel data received from the processing target pixel value input unit 101 is directly set as the predictive value. In the case where the (h−1)-th pixel data is not a leading target pixel, the pixel value of the pixel data obtained by providing the (h−1)-th pixel data coded by the image coding apparatus 100 to the image decoding apparatus 110 and decoding the data by the image decoding apparatus 110 is set as the predictive value of the coding target pixel. By doing so, even in the case where a quantization error occurs in the quantization processing unit 106, two predictive values used respectively in the image coding apparatus 100 and the image decoding apparatus 110 can be made in agreement with each other, with it being possible to suppress image quality degradation.

(Variation 1)

Variation 1 is a modification (variation) of the image coding apparatus 100 and the image decoding apparatus 110 in the embodiment.

Figure 11:
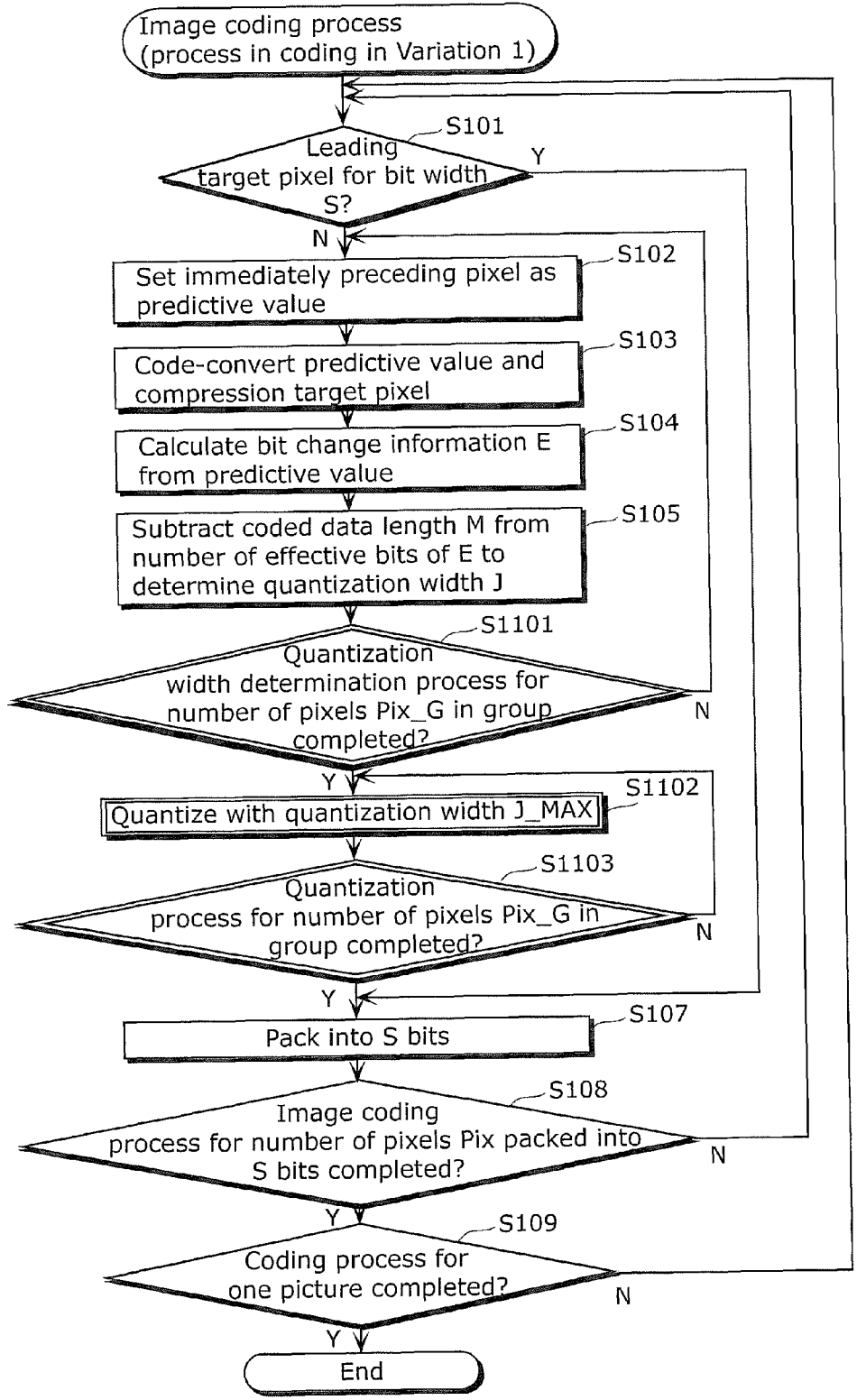
FIG. 11 is a flowchart showing an image coding process in Variation 1.

FIG. 11 is a flowchart showing a coding process in Variation 1.

In FIG. 11, Step S1101 is newly added so that, for each group composed of pixel data of a predetermined number of pixels Pix_G, the quantization width determination unit 105 determines a common quantization width J used for quantization of every target pixel in the group. This produces effects described below, contributing to a higher compression rate of each target pixel. Steps S1102 and S1103 are also added in FIG. 11.

FIG. 12 is a diagram showing data processed in Variation 1.

FIG. 12 shows the code conversion result of the coding target pixel (the code of the target pixel, the code of the predictive pixel), the exclusive OR (bit change information), the number of effective bits, the quantization width, the maximum quantization width of the group, the quantization value, and the group number in Variation 1. As an example, the number of pixels Pix_G constituting one group is 3.

In Step S1101, the quantization width determination unit 105 or the like determines whether or not the quantization width J is determined for all of the number of pixels Pix_G in the group. In the case where the determination of Step S1101 results in NO, the process goes to Step S102, and at least one of Steps S102 to S105 is executed on the next pixel data received by the processing target pixel value input unit 101. In the case where the determination of Step S1101 results in YES, the process goes to Step S1102.

In Step S1102, the quantization width determination unit 105 sets a maximum quantization width from among Pix_G quantization widths J of the Pix_G pixels (target pixels) in the group, as a maximum quantization width J_MAX. In FIG. 12, the quantization widths J of the group of the group number 1 are 1, 1, and 0, so that the maximum quantization width J_MAX is 1. The maximum quantization width J_MAX calculated here is a quantization width common to all pixels in the group. That is, the maximum quantization width J_MAX is the quantization width for quantizing every coding target pixel in the group.

In Step S1103, it is determined whether or not the quantization process is completed for all of the number of pixels Pix_G in the group. In the case where the determination of Step S1103 results in NO, the process goes to Step S1102, and the quantization processing unit 106 executes Step S1102 on the next coding target pixel data in the group. In the case where the determination of Step S1103 results in YES, the process goes to Step S107. The subsequent process is the same as the above-mentioned process, and so its detailed description is omitted.

Figure 13:
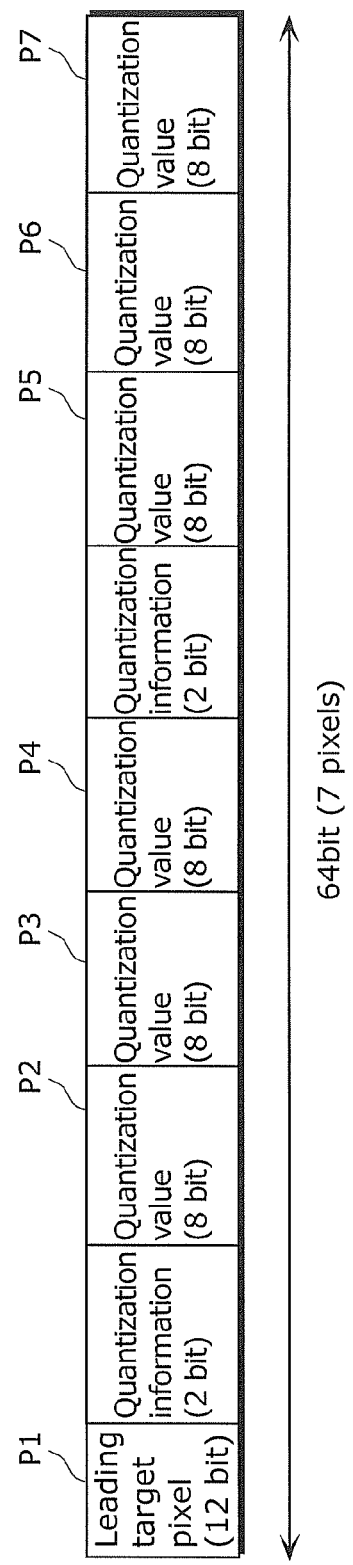
FIG. 13 is a diagram showing a bit image after image coding in Variation 1.

FIG. 13 is a diagram showing a bit image of S bits stored in the buffer memory by the packing unit 107 and outputted from the image coding apparatus 100, in the case where the image coding process in Variation 1 is applied.

In FIG. 13, the packing unit 107 first receives the pixel P1 of 12 bits as the leading target pixel. Regarding data of the succeeding pixels P2 to P7 (the target pixels from the second pixel onward), the quantization width information is inserted for each group, followed by the quantization values of three pixels that belong to the group.

According to Variation 1, the quantization width of the pixel P4 is 1 and the quantization width of the pixel P5 is 2 in FIG. 12, whereas the pixels P4 and P5 do not need to be quantized in FIG. 5. Though this might be disadvantageous in that image quality degradation tends to be caused by a quantization error, there is also an advantageous effect of improving the compression rate because the pixels P2 to P7 can be coded and so the number of pixels transmittable with the same bit length can be increased, as is clear from comparison between FIGS. 7B and 13.

(Variation 2)

Variation 2 is a modification (variation) of the image coding apparatus 100 and the image decoding apparatus 110 in Variation 1. Variation 2 differs from Variation 1 in the quantization width determination method in the quantization width determination unit 105 (FIG. 15).

Figure 14:
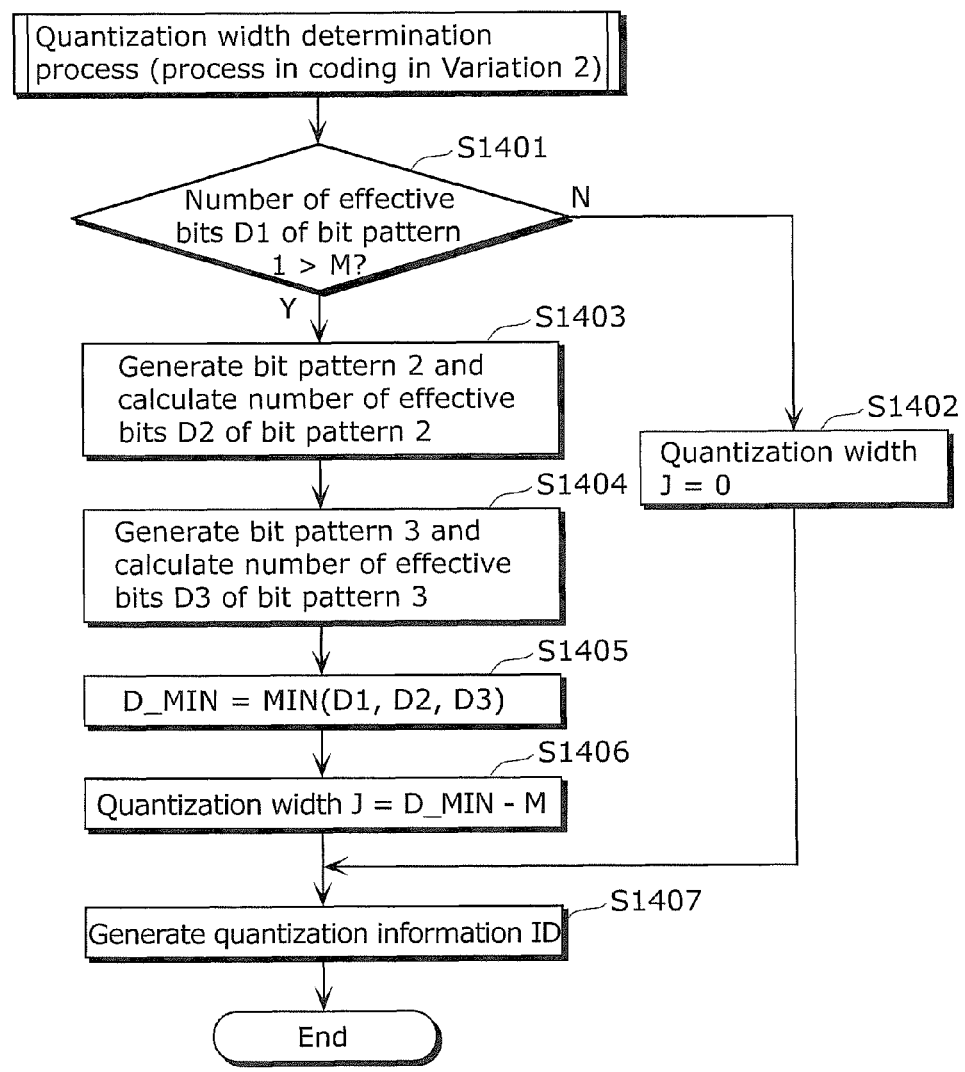
FIG. 14 is a flowchart showing a quantization width determination process in Variation 1.

FIG. 14 is a flowchart showing the quantization width determination method in the image coding process in Variation 2.

FIG. 15 is a block diagram for realizing the quantization width determination method shown in FIG. 14.

(Image Coding Process)

In the quantization width determination method in Variation 2, focus is given on high-order bits that are highly correlated with pixel data of surrounding pixels, in first bit change information E of N bits received from the change extraction unit 104. A bit pattern generation unit 1501 generates a plurality of bit patterns to find a bit pattern in which effective bits in the bit change information concentrate more on the low-order bit side, in order to achieve higher quantization accuracy.

Figure 16:
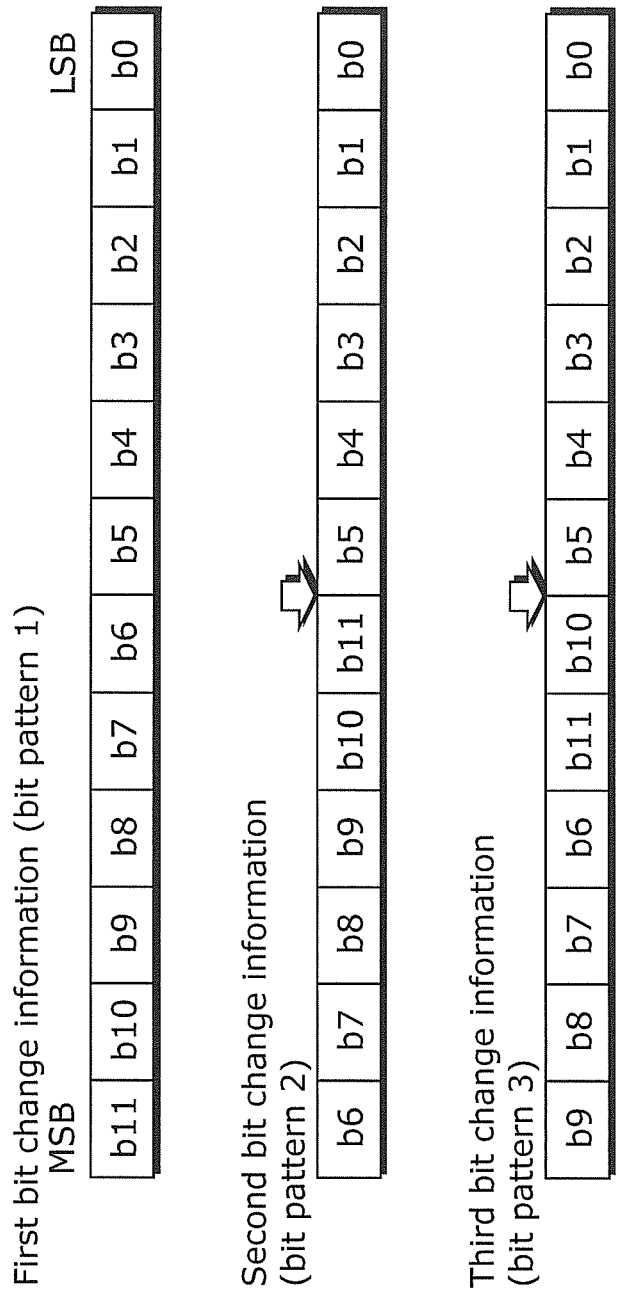
FIG. 16 is a diagram showing bit patterns generated by a bit pattern generation unit.

FIG. 16 is a diagram showing a plurality of bit patterns.

For example, in Variation 2, the bit pattern generation unit 1501 generates second bit change information (bit pattern) by dividing the first bit change information into high-order bits and low-order bits at a predetermined bit position (designated by the arrow in the middle part of FIG. 16) and rearranging the high-order bits in reverse order. The bit pattern generation unit 1501 also generates third bit change information (bit pattern) by changing bit positions of a plurality of pieces of bit data (the lower part of FIG. 16). As an example, the third bit change information is bit change information obtained by cyclic shifting the high-order 6 bits. In an image coding apparatus 100b, the bit pattern generation unit 1501 or the like selects a bit pattern from the plurality of bit patterns so as to reduce the quantization width J, and the image coding process is performed using the selected bit pattern.

In detail, it is assumed that the bit length N of the first bit change information E received from the change extraction unit 104 is 12 bits. The bit pattern generation unit 1501 in the quantization width determination unit 105 generates two bit patterns that are the second bit change information (bit pattern) and the third bit change information (bit pattern) as shown in FIG. 16 (Steps S1403 and S1404 in FIG. 14). In each of the upper, middle, and lower parts of FIG. 16, pixel data per pixel (per target pixel) is expressed by a bit string of 12 bits. Bit data of a least significant bit is b0, and bit data of a most significant bit is b11, with higher bits having larger numbers. The first bit change information E received from the change extraction unit 104 is denoted as a bit pattern 1, the second bit change information is denoted as a bit pattern 2, and the third bit change information is denoted as a bit pattern 3.

The process is described in detail below, with reference to FIGS. 14, 15, and 16.

In Step S1401, the quantization width determination unit 105 provides the first bit change information (bit pattern 1) received from the change extraction unit 104, to the bit pattern generation unit 1501 and a comparator 1502. The comparator 1502 calculates the number of effective bits D1 in the bit pattern 1. In the case where the number of effective bits D1 in the bit pattern 1 is equal to or less than the quantization value bit length M (Step S1401: NO), the process goes to Step S1402. In the case where the number of effective bits D1 in the bit pattern 1 is more than M (Step S1401: YES), the process goes to below-mentioned Step S1403.

In Step S1402, the quantization width determination unit 105 sets the quantization width J to 0, and provides the quantization width and the adopted bit pattern number (1) to the quantization processing unit 106 and an ID generation unit 1503. The process then goes to below-mentioned Step S1407.

From Step S1403, the bit pattern generation unit 1501 generates a plurality of bit patterns. For example, in Variation 2, the bit pattern generation unit 1501 generates the bit pattern 2 and the bit pattern 3.

In Step S1403, the bit pattern generation unit 1501 generates the bit pattern 2. As an example, the bit pattern 2 is generated by dividing the bit data of the bit pattern 1 into the high-order bits from b6 and the low-order bits from b5 (see the arrow in the middle part of FIG. 16) and rearranging the high-order bits in reverse order, as shown in FIG. 16.

The bit pattern generation unit 1501 provides the generated bit pattern 2 to the comparator 1502.

In Step S1404, the bit pattern generation unit 1501 generates the bit pattern 3.

As an example, the bit pattern 3 is generated by dividing the bit data into the high-order bits from b6 and the low-order bits from b5 as in the bit pattern 2 (see the arrow in the lower part of FIG. 16) and manipulating only the bit data of the high-order bits. In detail, the bit data b11 and b10 in the bit pattern 1 are shifted to lowest positions in the high-order bits, and the remaining bit data b6 to b9 are shifted higher, as shown in FIG. 16.

The bit pattern generation unit 1501 provides the generated bit pattern 3 to the comparator 1502.

This process of the bit pattern generation unit 1501 is based on the following property. Even when predictive value generation accuracy is high, the correlation between the coding target pixel and the predictive value is not very high in low-order bits having high randomness. In high-order bits, on the other hand, there is a high correlation between the coding target pixel and the predictive value.

That is, the bit pattern generation unit 1501 increases the number of bit patterns of high-order bits so that a code pattern for reducing the quantization width can be selected to improve quantization accuracy.

In Step S1405, the comparator 1502 compares the number of effective bits D1 of the bit pattern 1, the number of effective bits D2 of the bit pattern 2, and the number of effective bits D3 of the bit pattern 3, and detects a bit pattern having a minimum number of effective bits (D_MIN). The process then goes to Step S1406.

In Step S1406, the quantization width determination unit 105 calculates the quantization width J for quantization using the number of effective bits (D_MIN) of the bit pattern that is specified to have the minimum number of effective bits from among the plurality of bit patterns by the comparator 1502. Since the quantization width J is a result of subtracting M from the number of effective bits of the bit change information, the quantization width J is calculated as J=D_MIN−M.

The quantization width determination unit 105 provides the calculated quantization width and the adopted bit pattern number to the quantization processing unit 106 and the ID generation unit 1503. The process then goes to Step S1407.

FIG. 17 is a diagram showing a quantization information ID table.

A quantization information ID is information for specifying a quantization width for quantizing a quantization value corresponding to the quantization information ID (the second column in FIG. 17). The quantization information ID also specifies which of the plurality of bit patterns in FIG. 16 is a bit pattern of bit change information quantized to the quantization value (the third column in FIG. 17). The quantization information ID is information that is used together with the quantization value corresponding to the quantization information ID in order to calculate the bit change information quantized to the quantization value.

The number of effective bits in the first column in the table in FIG. 17 is information indirectly specified from the quantization width (the second column in the table in FIG. 17) specified by the quantization information ID (e.g. "0001"). The quantization information ID may not directly specify the number of effective bits.

In Step S1407, the ID generation unit 1503 generates a quantization information ID from the adopted bit pattern number and the quantization width received from the comparator 1502, and provides the generated quantization information ID to the packing unit 107.

In Variation 2, the information of the quantization width and the information of the bit pattern (bit pattern number) adopted in the image coding process are needed in the image decoding process. Accordingly, instead of the quantization width information obtained by coding the quantization width J in the embodiment, the ID generation unit 1503 generates the quantization information ID (the quantization width information in Variation 2) shown in FIG. 17. In detail, as shown in FIG. 17, the quantization information ID of Q bits is generated to enable the image decoding apparatus 110 to analyze, in the image decoding process, the quantization width J for quantization performed in the image coding process and the bit pattern (number) adopted in the image coding process. In other words, the ID generation unit 1503 assigns, instead of the quantization width information, coded data of Q bits to the quantization information ID so as to enable such analysis. It is assumed here that the bit length Q of the quantization information ID is 4.

After generating the quantization information ID as shown in FIG. 17, the ID generation unit 1503 provides the generated quantization information ID to the packing unit 107, and ends the process.

Figure 18A:
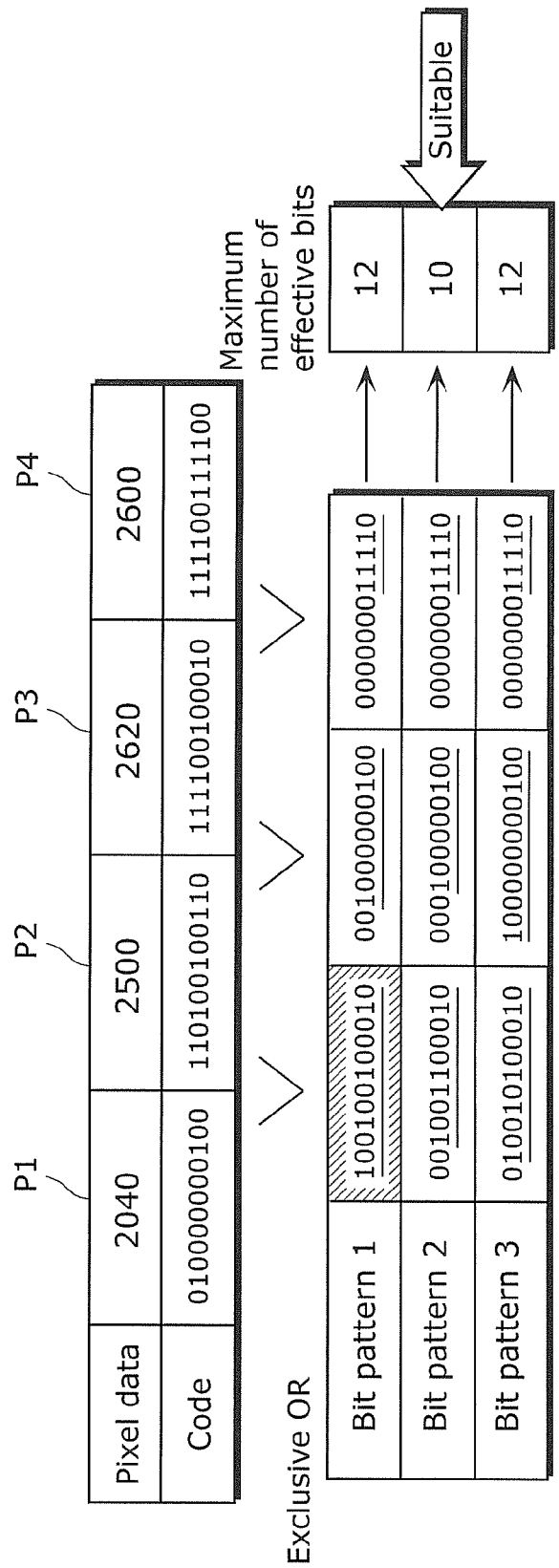
FIG. 18A is a diagram showing each operation result by bit pattern generation in Variation 2.

FIG. 18A is a diagram showing data for which the bit pattern 2 is suitable.

The bit pattern 2 is generated in Variation 2. Such Variation 2 is relatively effective in the case where the pixel data received by the processing target pixel value input unit 101 in the image coding apparatus 100 has pixel values shown in FIG. 18A.

In FIG. 18A, even though the received pixel data itself does not have a large amount of change, Gray code conversion results in a situation where the maximum number of effective bits is 12 bits (see the hatched area in the first row in the lower table in FIG. 18A).

When the quantization value bit length M is 8 bits and the number of pixels Pix_G per group is 3 pixels, the pixels P2 to P4 constitute one group, and the quantization width corresponding to the group is 4 (=12−8). This causes lower quantization accuracy, despite there being no abrupt image change such as an edge in the image area of the group subjected to the image coding process. Thus, a problem of significant visual degradation arises.

In view of this, the bit pattern generation unit 1501 generates the bit pattern 2 (the second row in the lower table in FIG. 18A), where the maximum number of effective bits is 10 bits. As a result, the quantization width corresponding to the pixels P2 to P4 is 2, with it being possible to reduce the quantization error. In such a case, the ID generation unit 1503 generates, for example, the quantization information ID "0110" based on the table in FIG. 17.

Figure 18B:
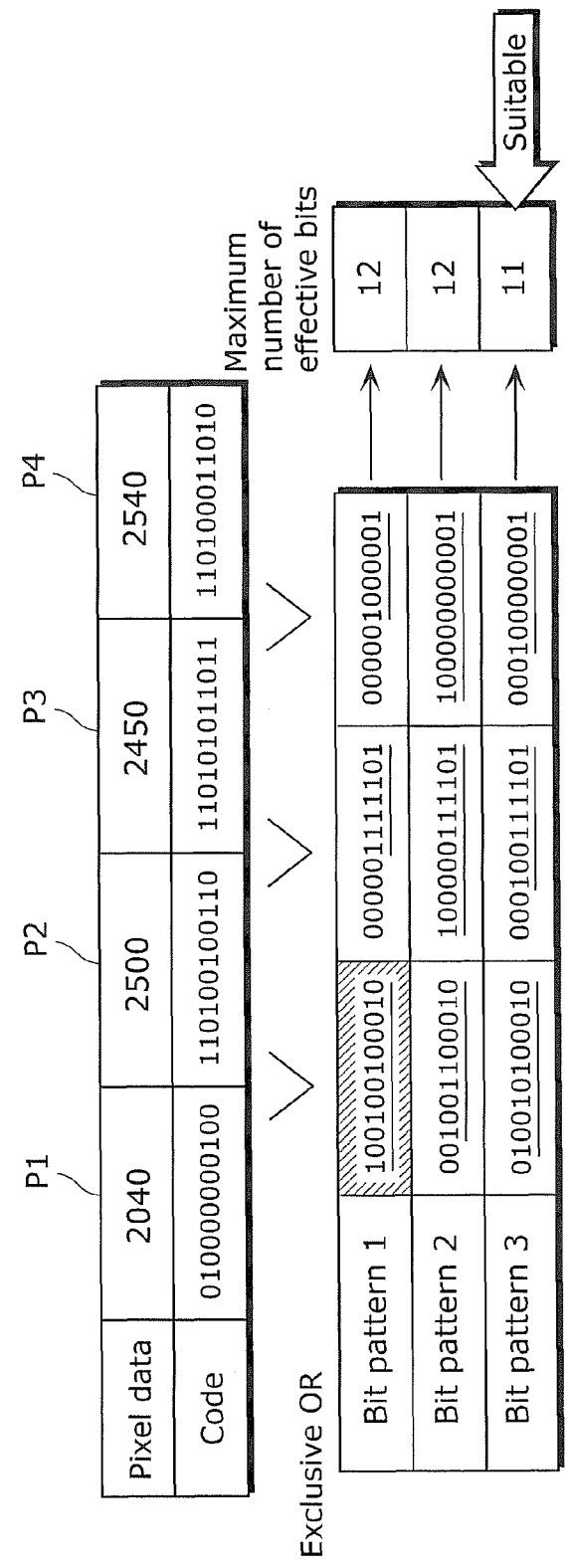
FIG. 18B is a diagram showing each operation result by bit pattern generation in Variation 2.

FIG. 18B is a diagram showing data for which the bit pattern 3 is suitable.

The bit pattern 3 is generated in Variation 2. Such Variation 2 is relatively effective in the case where the pixel data received by the processing target pixel value input unit 101 in the image coding apparatus 100 has pixel values shown in FIG. 18B.

In FIG. 18B, the maximum number of effective bits is 12 bits in the bit pattern 1 (see the hatched area in the first row in the lower table in FIG. 18B). By generating the bit pattern 3 (the third row), however, the maximum number of effective bits can be limited to 11 bits. As a result, the quantization width corresponding to the pixels P2 to P4 is 3 (=11−8), with it being possible to reduce the quantization error. In such a case, the ID generation unit 1503 generates, for example, the quantization information ID "1010" based on the table in FIG. 17.

According to Variation 2, the quantization width determination unit 105 generates the plurality of bit patterns from the first bit change information E received from the change extraction unit 104, so as to concentrate the bit change information more on the low-order bit side of the data to enhance quantization accuracy. This reduces a decrease in quantization accuracy caused by code conversion, contributing to higher image quality.

Though Variation 2 describes the case where the bit pattern generation unit 1501 generates three bit patterns, the number of patterns may be increased.

(Image Decoding Process)

Figure 19:
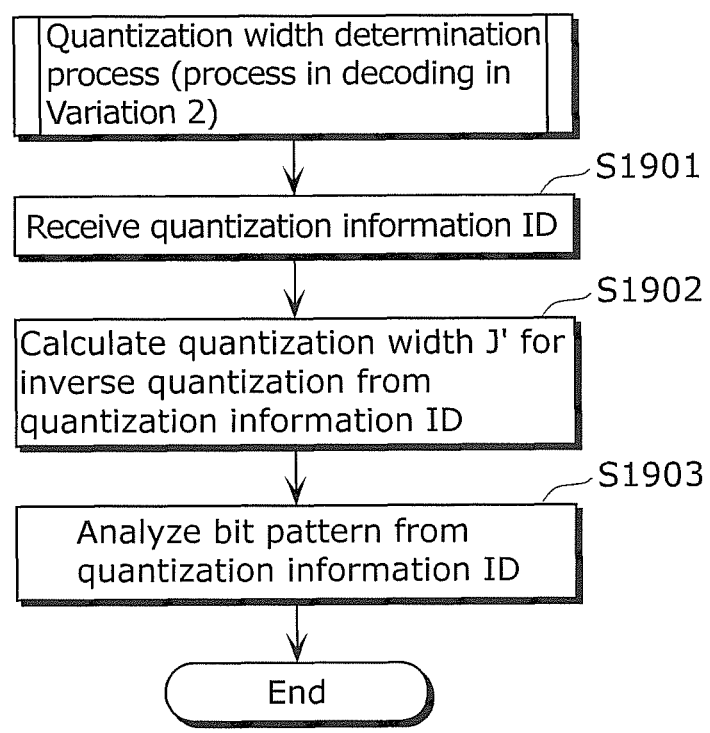
FIG. 19 is a flowchart showing a quantization width determination process in Variation 2.
Figure 20:
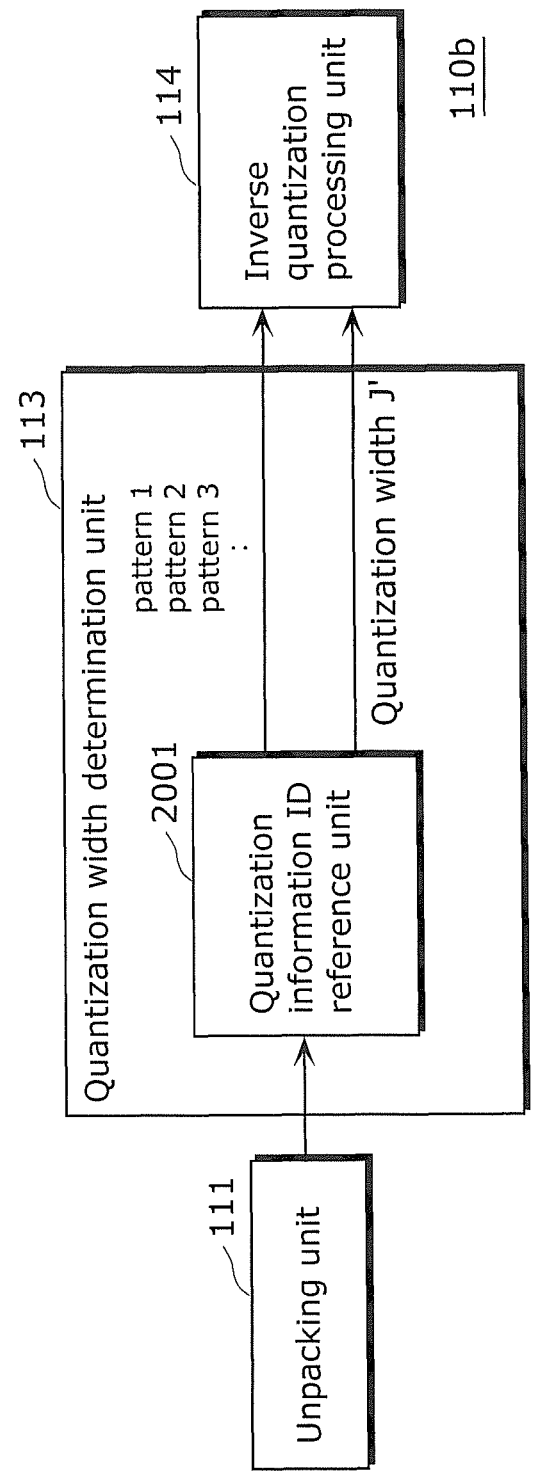
FIG. 20 is a block diagram showing a structure of a quantization width determination unit in image decoding in Variation 2.

The following describes the image decoding process in Variation 2, with reference to FIGS. 19 and 20.

FIG. 19 is a flowchart showing the quantization width determination method in the decoding process.

FIG. 20 is a block diagram for realizing the quantization width determination method shown in FIG. 19.

A quantization information ID reference unit 2001 is added to the quantization width determination unit 113 in the image decoding process in Variation 2. The quantization information ID reference unit 2001 analyzes coded data received by the quantization width determination unit 113 from the unpacking unit 111, as the quantization information ID. As a result of the analysis, the quantization information ID reference unit 2001 extracts the quantization width in the image coding process and the information of the bit pattern (bit pattern number) adopted in the quantization process, from the quantization information ID (Steps S1902 and S1903 in FIG. 19).

Figure 21:
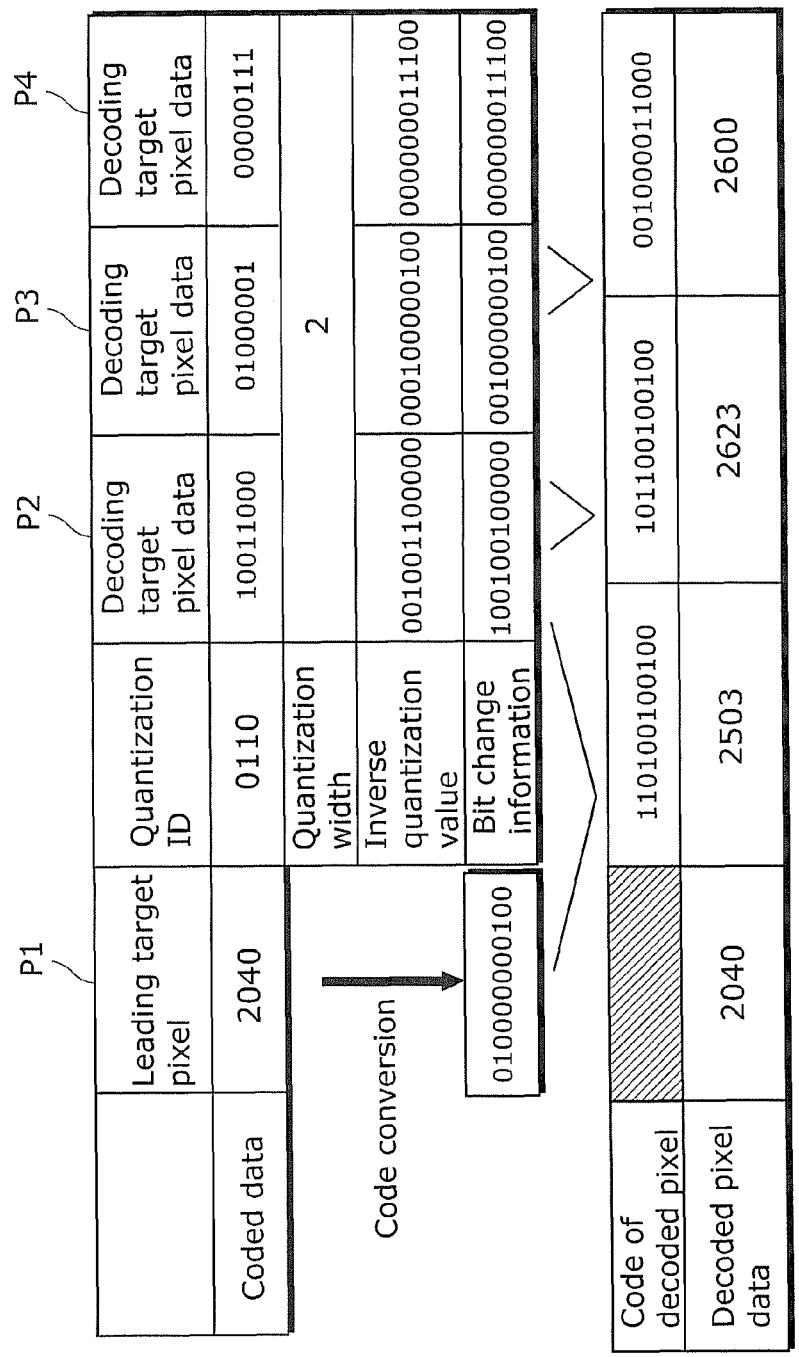
FIG. 21 is a diagram showing a decoding process example and each operation result in Variation 2.

FIG. 21 is a diagram showing a decoding process example and each operation result in Variation 2.

The process is described in detail below, with reference to FIGS. 19, 20, and 21.

For example, the unpacking unit 111 receives a plurality of pieces of coded data shown in FIG. 21, which are necessary for reconstructing the pixels P1 to P4 shown in FIG. 18A.

First, in Step S1901, the quantization width determination unit 113 receives coded data corresponding to a quantization information ID from the unpacking unit 111. The quantization width determination unit 113 provides the received quantization information ID to the quantization information ID reference unit 2001. The process then goes to Step S1902.

In Step S1902, the quantization information ID reference unit 2001 analyzes the received coded data as the quantization information ID, that is, analyzes the quantization width J used in the image coding process and included in the quantization information ID.

Here, the quantization information ID reference unit 2001 references to the assignment table in FIG. 17 used in the image coding process, in order to correctly analyze the quantization width J in the image coding process.

Having extracted the information of the quantization width J, the quantization information ID reference unit 2001 sets the extracted quantization width J to the quantization width J' for inverse quantization in the image decoding process, and provides the quantization width J' to the inverse quantization processing unit 114. The process then goes to Step S1903.

Suppose the coded data received by the quantization width determination unit 113 from the unpacking unit 111 is "0110" (the second row and third column in the upper table in FIG. 21). In the table in FIG. 17, the quantization width J corresponding to the quantization information ID "0110" is 2. Accordingly, the decoding target pixels P2 to P4 (target pixel quantization values P2 to P4) are inverse quantized with the quantization with "2".

In Step S1903, the quantization information ID reference unit 2001 analyzes the bit pattern (bit pattern number) adopted in the image coding process, from the quantization information ID.

Here, the quantization information ID reference unit 2001 references to the assignment table in FIG. 17 used in the image coding process, in order to correctly analyze the bit pattern adopted in the image coding process. Having extracted the information of the bit pattern (bit pattern number) adopted in the quantization process, the quantization information ID reference unit 2001 provides the extracted information to the inverse quantization processing unit 114, and ends the process.

Suppose the coded data (quantization information ID) received from the unpacking unit 111 is "0110" (the second row and third column in the upper table in FIG. 21). In the table in FIG. 17, the adopted bit pattern corresponding to the quantization information ID "0110" is the bit pattern 2. Accordingly, after inverse quantization, the inverse quantization processing unit 114 or the like divides, for each of the decoding target pixels P2 to P4 (target pixel quantization values P2 to P4), the bit data into the high-order bits from b6 and the low-order bits from b5 (see the arrow in the middle part of FIG. 16) and rearranges the high-order bits in reverse order as shown in FIG. 16, thereby calculating the bit change information E'.

(Variation 3)

Variation 3 is a modification (variation) of the image coding apparatus 100 and the image decoding apparatus 110 in Variation 1. Variation 3 differs from Variation 1 in the quantization width determination method in the quantization width determination unit 105.

Figure 22:
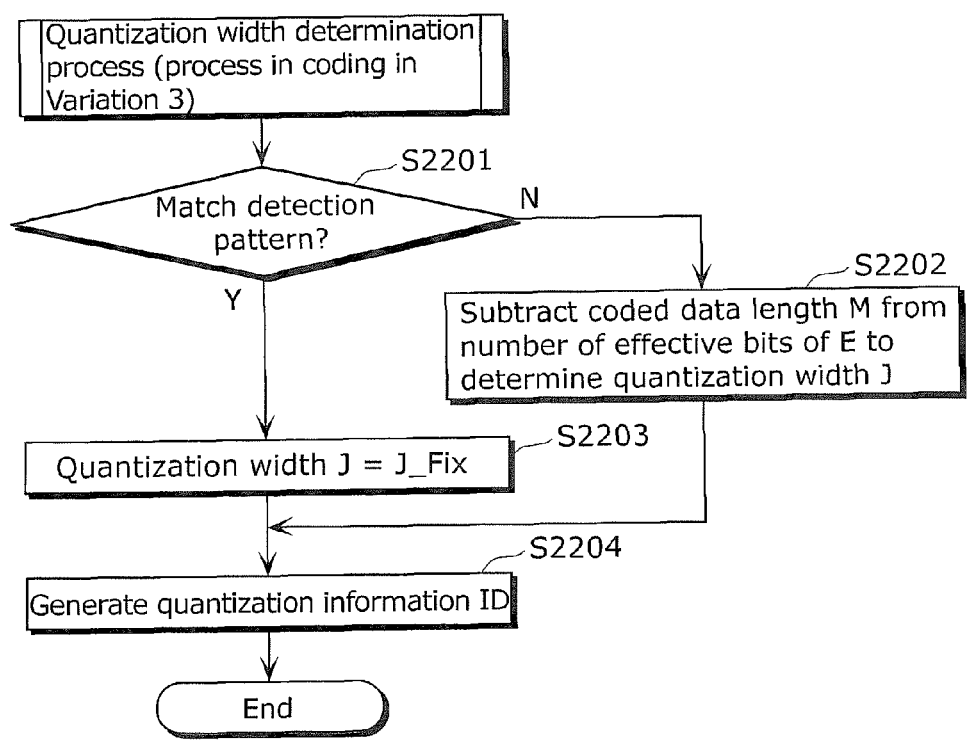
FIG. 22 is a flowchart showing a quantization width determination process in Variation 3.

FIG. 22 is a flowchart showing the quantization width determination method in Variation 3.

Figure 23:
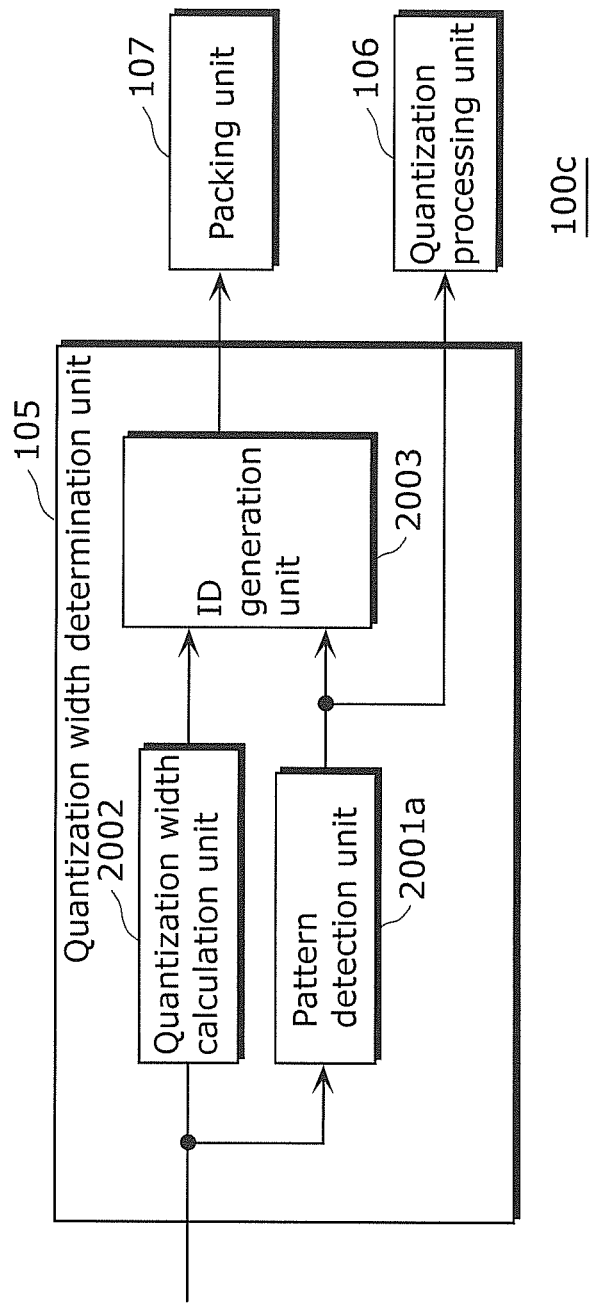
FIG. 23 is a block diagram showing a structure of a quantization width determination unit in image coding in Variation 3.

FIG. 23 is a block diagram for realizing the quantization width determination method shown in FIG. 22.

In the quantization width determination method in Variation 3, the quantization width determination unit 105 performs the following process on the first bit change information E of N bits received from the change extraction unit 104. This process is performed based on a property that the number of change bits decreases as a result of the code conversion process by the code conversion unit 103. That is, the process is performed with regard to the received first bit change information E and bit change information of a specific pattern. The bit change information of the specific pattern is bit change information having a high occurrence frequency among a plurality of pieces of bit change information. In this process, a pattern detection unit 2001a detects whether or not there is a match between the received first bit change information E and the bit change information of the specific pattern. In the case where the received first bit change information E matches the specific pattern, only the change bits in the bit change information are extracted, and a bit string to be quantized is limited to the extracted change bits, in order to achieve higher quantization accuracy.

Figure 24:
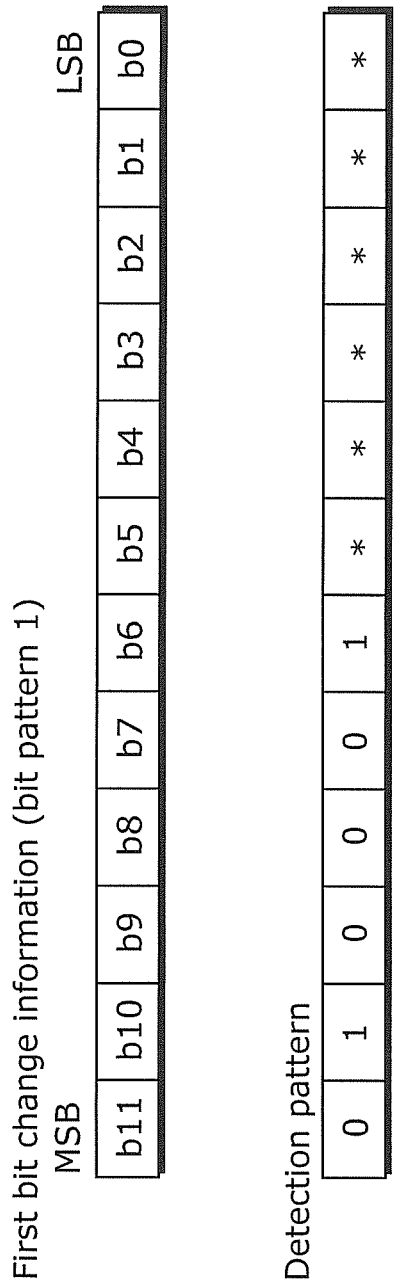
FIG. 24 is a diagram showing a detection pattern for match detection by a pattern detection unit.

For example, in Variation 3, focusing on high-order bits in the bit change information that are highly correlated with surrounding pixels, a detection pattern as shown in FIG. 24 is prepared beforehand. The process is described in detail below, with reference to FIGS. 22, 23, and 24.

FIG. 24 is a diagram showing a pattern (specific pattern) used for determination in Variation 3.

In the pattern shown in FIG. 24, the mark "*" indicates that any of data 0 and 1 matches the pattern at the corresponding position. Meanwhile, the mark "0" indicates that only data 0 matches the pattern at the corresponding position.

In Step S2201, the quantization width determination unit 105 provides the first bit change information received from the change extraction unit 104, to the pattern detection unit 2001a and a quantization width calculation unit 2002.

The pattern detection unit 2001a determines whether or not the received first bit change information E matches the predetermined detection pattern. In detail, the pattern detection unit 2001a samples bit data of each bit position at which "0" is set in the predetermined detection pattern, and performs an OR operation. In FIG. 24, b7, b8, b9, and b11 are bit positions at which "0" is set in the detection pattern. Meanwhile, no match detection is performed on the bit data of b5 and lower where "*" is set, because these bit data have high randomness. The pattern detection unit 2001 performs an OR operation (described later) on the bit data of the above-mentioned four bit positions, and determines whether or not the result of the OR operation is 0. In the case where the result of the OR operation is not 0 (Step S2201: NO), the quantization width calculation unit 2002 performs the same process as in the embodiment, to calculate the quantization width J (Step S2202). In the case where the result of the OR operation is 0 (Step S2201: YES), the process goes to Step S2203.

In other words, the pattern detection unit 2001a determines, for each of the plurality of "0" positions in the detection pattern, whether or not the value of the position in the received first bit change information E is 0. The pattern detection unit 2001a thus determines whether or not the first bit change information E matches the detection pattern. Note that this determination process may involve an OR operation as mentioned above, or not involve an OR operation. Other processes are also applicable.

It may be understood here that the mark "1" in the pattern shown in FIG. 24 indicates that any of data 0 and 1 matches the pattern at the corresponding position, as with the mark "*".

In Step S2203, the quantization width determination unit 105 sets the quantization width J to a predetermined quantization width J_Fix. The quantization width J_Fix is a value obtained by subtracting the sum of the number of "0"s set in the detection pattern and the quantization value bit length M, from the bit length N of the pixel data received by the processing target pixel value input unit 101.

When the number of "0"s set in the detection pattern is 4, the bit length N of the received pixel data is 12 bits, and the quantization value bit length M is 8 bits, the quantization width J_Fix=12−(4+8)=0.

Having determined the quantization width J, the quantization width determination unit 105 provides the quantization width and the detection result of the pattern detection unit 2001a to the quantization processing unit 106. The process then goes to Step S2204.

FIG. 25 is a diagram showing a quantization information ID table in Variation 3.

A quantization information ID is information for specifying a quantization width and a pattern matching status (match or mismatch). For example, the quantization information ID is any of a plurality of pieces of data in the fourth column in the table in FIG. 25. Each of these pieces of data specifies a corresponding quantization width and matching status. The quantization information ID is information that is used together with the quantization value corresponding to the quantization information ID in order to calculate the bit change information quantized to the quantization value.

In Step S2204, an ID generation unit 2003 generates a quantization information ID from the detection result of the pattern detection unit 2001a and the quantization width J calculated by the quantization width calculation unit 2002, and provides the generated quantization information ID to the packing unit 107.

In Variation 3, the information of the quantization width and the detection result of the pattern detection unit 2001a in the image coding process are needed in the image decoding process. Accordingly, instead of the quantization width information obtained by coding the quantization width J in the embodiment, the ID generation unit 2003 generates the quantization information ID (the quantization width information in Variation 3).

In detail, as shown in FIG. 25, the ID generation unit 2003 assigns coded data so that the quantization width J for quantization and the detection result in the image coding process can be analyzed from the quantization information ID of Q bits in the image decoding process. It is assumed here that the bit length Q of the quantization information ID is 3. In FIG. 25, "*" indicates an arbitrary number of effective bits.

After generating the quantization information ID as shown in FIG. 25, the ID generation unit 2003 provides the generated quantization information ID to the packing unit 107, and ends the process.

According to Variation 3, the pattern detection unit 2001a performs matching between the first bit change information E received from the change extraction unit 104 and the specific pattern. In the case where the first bit change information E matches the specific pattern, the quantization processing unit 106 extracts only the above-mentioned change bits. By limiting the bit string to be quantized in such a manner, quantization accuracy can be enhanced. This reduces a decrease in quantization accuracy caused by code conversion, contributing to higher image quality.

Though Variation 3 describes the case where the number of specific patterns used for matching by the pattern detection unit 2001a is one, the number of patterns may be increased.

The following describes Variation 3x as a variation of Variation 3.

Figure 26:
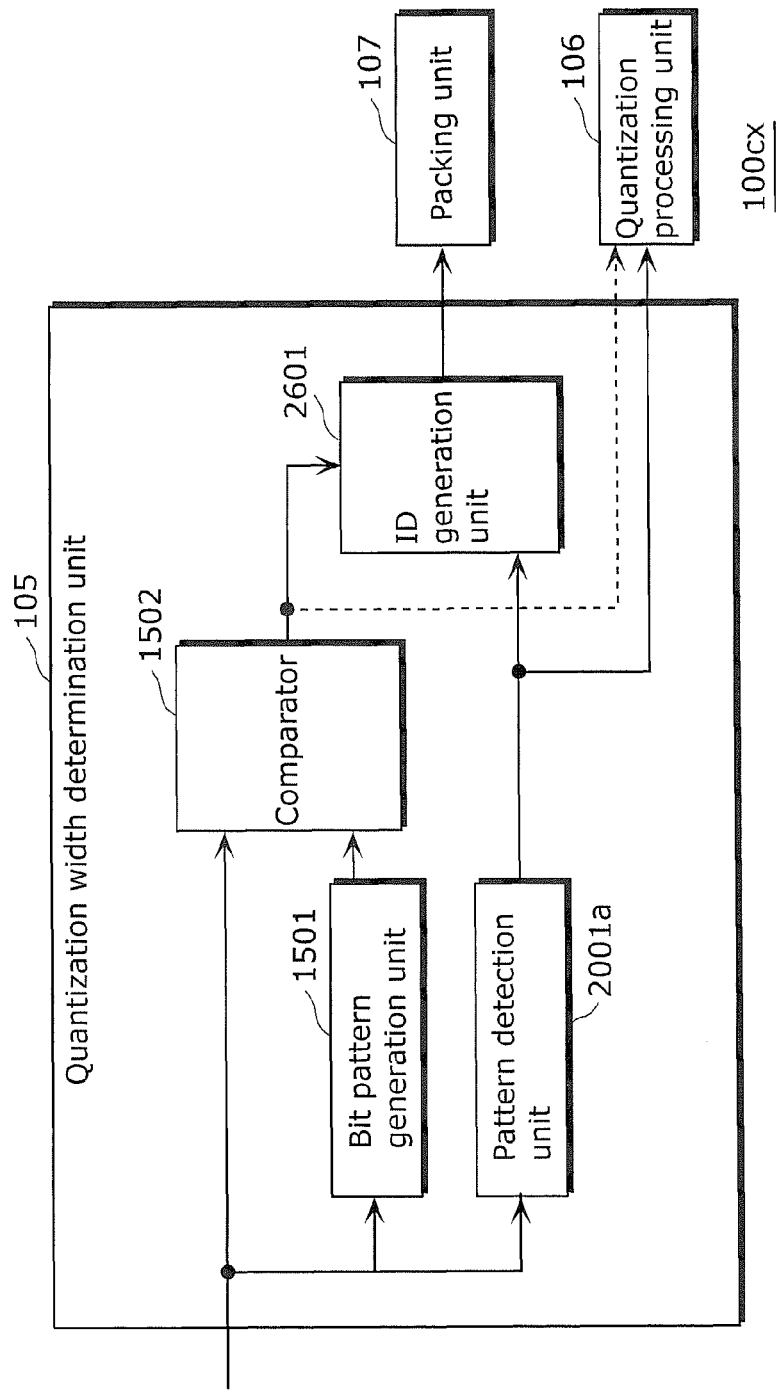
FIG. 26 is a block diagram showing a structure of a quantization width determination unit that includes a bit pattern generation unit and a pattern detection unit.

FIG. 26 is a block diagram showing the quantization width determination unit that includes the bit pattern generation unit and the pattern detection unit.

FIG. 27 is a diagram showing a quantization information ID in the case where the bit pattern generation unit and the pattern detection unit are included.

Thus, the image coding apparatus 100 may have the functions of both Variations 2 and 3 (Variation 3x). The block diagram and the coded data assignment to the quantization information ID in this case are shown respectively in FIGS. 26 and 27. In FIG. 27, "*" indicates an arbitrary number of effective bits.

In such a case, an ID generation unit 2601 calculates the quantization width J in the bit pattern that minimizes the number of effective bits of the bit change information E from among the plurality of bit patterns (FIG. 16), as described in Variation 2. The ID generation unit 2601 compares the calculated quantization width J and the quantization width J_Fix in the case where the pattern detection unit 2001a detects a match, and specifies which quantization width is smaller. The ID generation unit 2601 thus employs a method for obtaining the smaller quantization width, and determines the smaller quantization width as the quantization width to be used. The quantization width determination unit 105 then provides the detection result of the pattern detection unit 2001a, the adopted bit pattern number, and the quantization width to the quantization processing unit 106.

The ID generation unit 2601 generates the quantization information ID as shown in FIG. 27, and provides the generated quantization information ID to the packing unit 107. By assigning the coded data as shown in FIG. 27, the information of the bit pattern in Variation 2, the matching result in Variation 3, and the information of the quantization width can all be analyzed in the image decoding process.

(Variation 4)

Variation 4 describes an example of a digital still camera (a digital still camera 2800) that includes the image coding apparatus 100 and the image decoding apparatus 110 in the embodiment.

Figure 28:
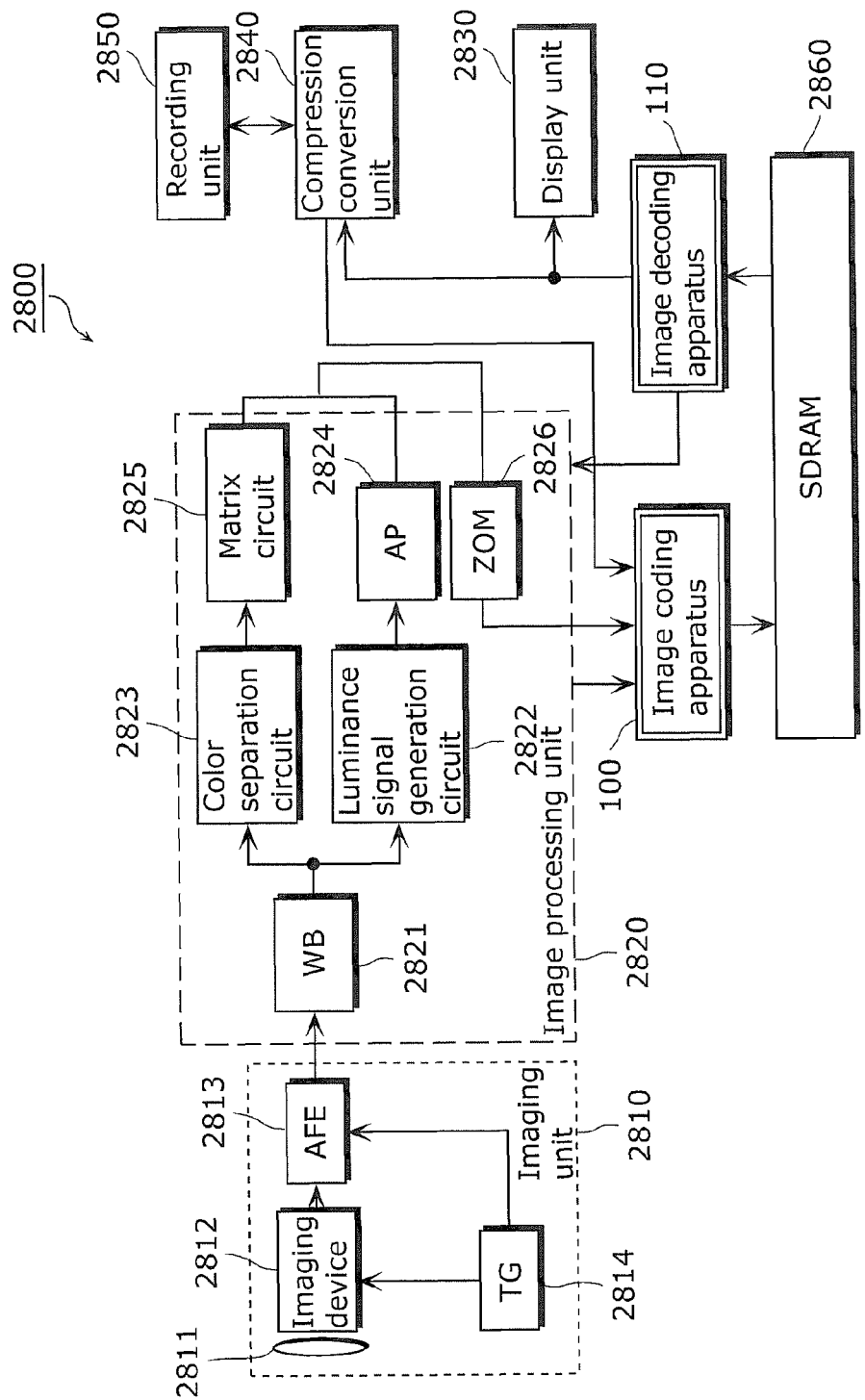
FIG. 28 is a block diagram showing a structure of a digital still camera in Variation 4.

FIG. 28 is a block diagram showing a structure of the digital still camera 2800 in Variation 4.

As shown in FIG. 28, the digital still camera 2800 includes the image coding apparatus 100 and the image decoding apparatus 110. The structures and functions of the image coding apparatus 100 and the image decoding apparatus 110 have already been described in the embodiment, and so their detailed description is omitted.

The digital still camera 2800 also includes an imaging unit 2810, an image processing unit 2820, a display unit 2830, a compression conversion unit 2840, a recording unit 2850, and an SDRAM 2860.

The imaging unit 2810 captures an image of a subject, and outputs digital image data (raw data) corresponding to the captured image of the subject.

In this example, the imaging unit 2810 includes an optical system 2811, an imaging device 2812, an analog front end (abbreviated as AFE in FIG. 28) 2813, and a timing generator (abbreviated as TG in FIG. 28) 2814.

The optical system 2811 is composed of a lens and the like, and forms the image of the subject on the imaging device 2812.

The imaging device 2812 converts light incident from the optical system 2811 to an electric signal. Various imaging devices such as an imaging device using a CCD (Charge Coupled Device) and an imaging device using a CMOS are applicable as the imaging device 2812.

The analog front end 2813 performs signal processing such as noise removal, signal amplification, and A/D conversion on an analog signal received from the imaging device 2812, and outputs the processed data as image data.

The timing generator 2814 supplies a clock signal for timing the operations of the imaging device 2812 and the analog front end 2813, to the imaging device 2812 and the analog front end 2813.

The image processing unit 2820 performs predetermined image processing on pixel data (raw data) received from the imaging unit 2810, and outputs the processed data to the image coding apparatus 100.

The image processing unit 2820 typically includes a white balance circuit (abbreviated as WB in FIG. 28) 2821, a luminance signal generation circuit 2822, a color separation circuit 2823, an aperture correction processing circuit (abbreviated as AP in FIG. 28) 2824, a matrix processing circuit 2825, a zoom circuit (abbreviated as ZOM in FIG. 28) 2826 for image enlargement and reduction, and the like, as shown in FIG. 28.

The white balance circuit 2821 corrects color components by color filters in the imaging device 2812 at an appropriate ratio so that a white subject is imaged as white under any light source.

The luminance signal generation circuit 2822 generates a luminance signal (Y signal) from the raw data.

The color separation circuit 2823 generates a chrominance signal (Cr/Cb signal) from the raw data.

The aperture correction processing circuit 2823 adds a high frequency component to the luminance signal generated by the luminance signal generation circuit 2822, to attain a higher resolution.

The matrix processing circuit 2825 performs adjustment of spectral characteristics of the imaging device and hue balance lost in image processing and the like, on the output of the color separation circuit 2823.

In many cases, the image processing unit 2820 temporarily stores processing target pixel data in a memory such as an SDRAM, performs predetermined image processing, YC signal generation, zoom processing, and the like on the temporarily stored data, and temporarily stores the processed data in the SDRAM again. This means the image processing unit 2820 both provides data to the image coding apparatus 100 and receives data from the image decoding apparatus 110.

The display unit 2830 displays the output of the image decoding apparatus 110 (decoded image data).

The compression conversion unit 2840 provides image data obtained by compressing the output of the image decoding apparatus 110 according to a predetermined standard such as JPEG (Joint Photographic Experts Group), to the recording unit 2850. The compression conversion unit 2840 also provides image data obtained by decompressing image data read by the recording unit 2850, to the image coding apparatus 100. Thus, the compression conversion unit 2840 is capable of processing data based on JPEG. Such a compression conversion unit 2840 is normally included in digital still cameras.

The recording unit 2850 receives compressed image data, and records the compressed imaged data in a recording medium (e.g. a nonvolatile memory). The recording unit 2850 also reads compressed image data stored in the recording medium, and outputs the read image data to the compression conversion unit 2840.

The input signal of the image coding apparatus 100 and the image decoding apparatus 110 in Variation 4 is raw data, as an example. The input signal of the image coding apparatus 100 and the like is, however, not limited to raw data. For instance, the processing target data of the image coding apparatus 100 and the image decoding apparatus 110 may be data of a YC signal (luminance signal or chrominance signal) generated from raw data by the image processing unit 2820. Alternatively, the processing target data of the image coding apparatus 100 and the like may be data (luminance signal or chrominance signal) obtained by decompressing JPEG image data which has been compressed according to JPEG and the like.

In the case where the input signal of the image coding apparatus 100 and the image decoding apparatus 110 is raw data, the predictive pixel generation unit 112 may generate the predictive value from a surrounding pixel (surrounding image) whose color component is the same color as a color component of the coding target pixel. In detail, suppose the raw data has a Bayer filter array as a pixel array of the coding target pixel. In this case, the raw data can be divided into an R (red) component, a G (green) component, and a B (blue) component. In the case of using the prediction expression (1), not the pixel adjacent to the coding target pixel but the same-color pixel left adjacent to the coding target pixel may be used. This exhibits a higher correlation of pixel data than when the adjacent pixel of a different color component is used, leading to enhanced quantization accuracy.

In the case where the input signal of the image coding apparatus 100 and the image decoding apparatus 110 is raw data, the dynamic range M of the quantization value may be changed for each color component of the raw data so that the data after the dynamic range M is changed is coded. In detail, the raw data is divided into RGB components, and the dynamic range M of the quantization value is determined for each of these color components. In this way, it is possible to decrease the dynamic range M of the quantization value of the R or B component which is relatively low in amplitude and in turn increase the dynamic range M of the quantization value for the G component for which humans have high visual sensitivity, thereby improving the quantization accuracy of the G component. This also contributes to improved image quality in luminance, as the G component is a main component in luminance signal generation.

In the case where the input signal of the image coding apparatus 100 and the image decoding apparatus 110 is raw data, the quantization width may be determined separately for each color component of the raw data. When the quantization width J is determined for each group composed of pixel data of the number of pixels Pix_G as in Variation 1, the grouping can be made for each color component of the raw data. For example, in the case of an input image having a large change of R, if RGB are mixed up in the same group, the quantization process is performed with a large quantization width despite small changes of G and B. In view of this, the grouping may be made for each color component, to enable the quantization process to be performed with a quantization width according to a change of a corresponding color without being affected by other color components. This is effective for an image having a low correlation between RGB components.

Thus, the digital still camera 2800 in Variation 4 includes not only the compression conversion unit 2840 normally included in digital still cameras, but also the image coding apparatus 100 and the image decoding apparatus 110 that process raw data or YC signals. Such a digital still camera 2800 in Variation 4 is capable of a high-speed imaging operation for a larger number of continuous shots (e.g. a larger number of pictures taken per unit time), with the same memory capacity of an SDRAM or the like and the same resolution. The digital still camera 2800 is also capable of storing a moving image of a higher resolution in a memory of the same capacity such as an SDRAM.

The structure of the digital still camera 2800 in Variation 4 may also be applied to a digital video camera and the like that include an imaging unit, an image processing unit, a display unit, a compression conversion unit, a recording unit, and an SDRAM as with the digital still camera 2800.

(Variation 5)

Variation 5 describes an example (a digital still camera 2900) of a structure of a digital still camera in which an imaging device includes the image coding apparatus 100.

Figure 29:
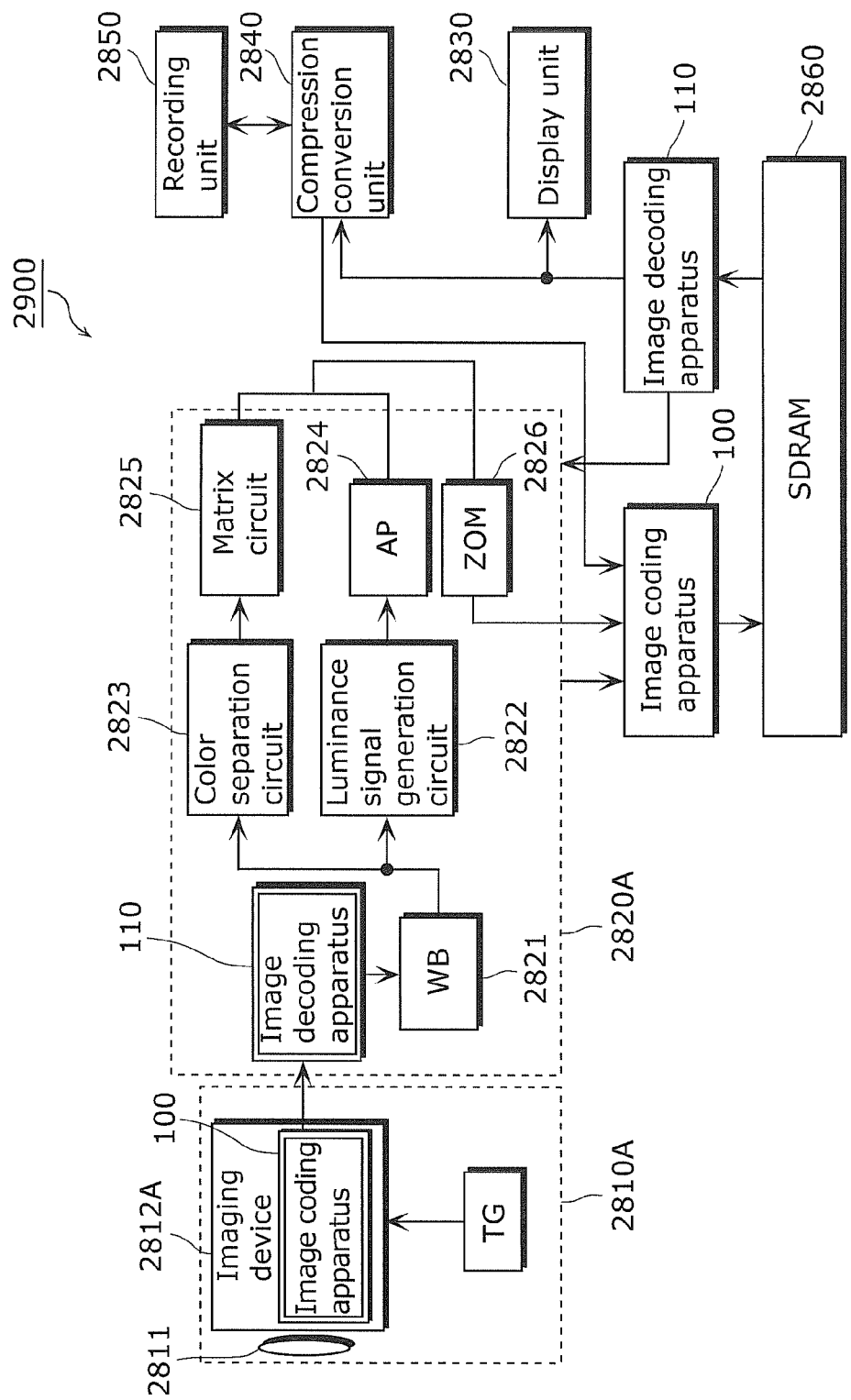
FIG. 29 is a block diagram showing a structure of a digital still camera in Variation 5.

FIG. 29 is a block diagram showing a structure of the digital still camera 2900 in Variation 5.

As shown in FIG. 29, the digital still camera 2900 differs from the digital still camera 2800 in FIG. 28 in that an imaging unit 2810A is included instead of the imaging unit 2810 and an image processing unit 2820A is included instead of the image processing unit 2820. The other structure is the same as the digital still camera 2800, and so its detailed description is omitted.

The imaging unit 2810A differs from the imaging unit 2810 in FIG. 28 in that an imaging device 2812A is included instead of the imaging device 2812 and the analog front end 2813 is not included. The other structure is the same as the imaging unit 2810, and so its detailed description is omitted. As an example, the imaging device 2812A uses a CMOS sensor where an amplifier and an A/D conversion circuit are contained in each pixel, and outputs a digital signal. This allows the image coding apparatus 100 in FIG. 3 to be included.

The image processing unit 2820A differs from the image processing unit 2820 in FIG. 28 in that the image decoding apparatus 110 in FIG. 3 is further included. The other structure is the same as the image processing unit 2820, and so its detailed description is omitted.

The image coding apparatus 100 included in the imaging device 2812A codes a pixel signal (raw data) captured by the imaging device 2812A, and provides the coded data to the image decoding apparatus 110 in the image processing unit 2820A.

The image decoding apparatus 110 in the image processing unit 2820A decodes the data received from the image coding apparatus 100. Data transfer efficiency between the imaging device 2812A and the image processing unit 2820A in the integrated circuit can be improved in this manner.

Therefore, the digital still camera 2900 in Variation 5 is capable of a high-speed imaging operation for a large number of continuous shots with the same memory capacity and the same resolution or a high-speed imaging operation for a moving image of a higher resolution with the same memory capacity, than the digital still camera 2800 in Variation 4.

In recent years, there is demand to output 30 pictures per second using the imaging device 2812A of a very large number of pixels. In detail, there is demand to output 30 pictures per second from a solid-state imaging device of 3 million pixels, 30 million pixels, or the like. Even when not provided with a very large number of pixels, there is still demand for high-speed imaging to output 100 pictures or more per second as in the case of high-speed imaging of capturing an image at the moment of ball impact in baseball. Though this may be realized by increasing the pixel data reading speed, simply increasing the reading speed can cause problems such as higher power consumption, noise, and unwanted radiation. Accordingly, there is a method of converting the output signal of the imaging unit 2810A to serial data using a fast clock and outputting the converted data to outside. Furthermore, in Variation 5, the image coding apparatus 100 is included in the imaging device 2812A. As a result, improved data transfer efficiency between the imaging unit 2810A and the image processing unit 2820A can be attained, providing an effective way to realize high-speed imaging.

In this case, the imaging unit 2810A converts the data from parallel to serial, and also embeds a synchronous signal in the output signal and outputs the resulting output signal. The image decoding apparatus 110 in the image processing unit 2820A extracts the synchronous signal embedded in the received signal, and determines pixel data acquisition timings. This being so, there is a problem that, if a signal matching the synchronous signal is contained in the coded data received from the image coding apparatus 100, this signal is mistaken as the synchronous signal in the image processing unit 2820A and so the image cannot be received properly. As the synchronous signal, a signal of bit data of a bit length Y (Y is a natural number) that are all "0" or all "1" is typically inserted and recognized.

FIG. 30A is a diagram showing an example of a quantization information ID table in Variation 5.

Figure 30B:
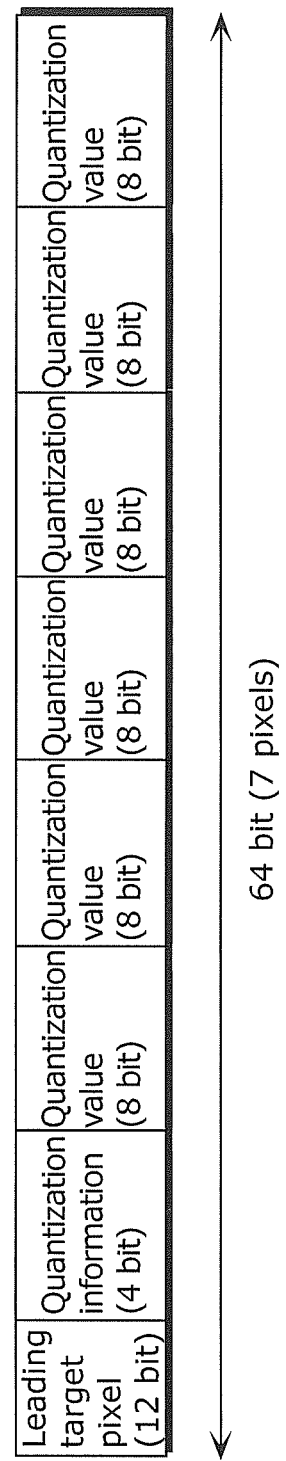
FIG. 30B is a diagram showing an output bit image in Variation 5.

FIG. 30B is a diagram showing an output example of the image coding apparatus 100 in Variation 5.

For example, in the case of performing the image coding process using the quantization information ID of Q bits (Q=4) as in Variation 2, the coded data assignment to the quantization information ID shown in FIG. 30A is employed instead of the one shown in FIG. 17. It is assumed here that the fixed bit length S of packing by the packing unit 107 is 64 bits. Then, the data packed by the packing unit 107 and outputted from the image coding apparatus 100 has a bit image as shown in FIG. 30B. Since the coded data of the quantization information ID is kept from being all "0" or all "1", it is possible to prevent the output of the same signal as the synchronous signal so long as Y>S.

(Variation 6)

Variation 6 describes an example (a surveillance camera 3100) of a structure of a surveillance camera that receives image data from the image coding apparatus 100.

Figure 31:
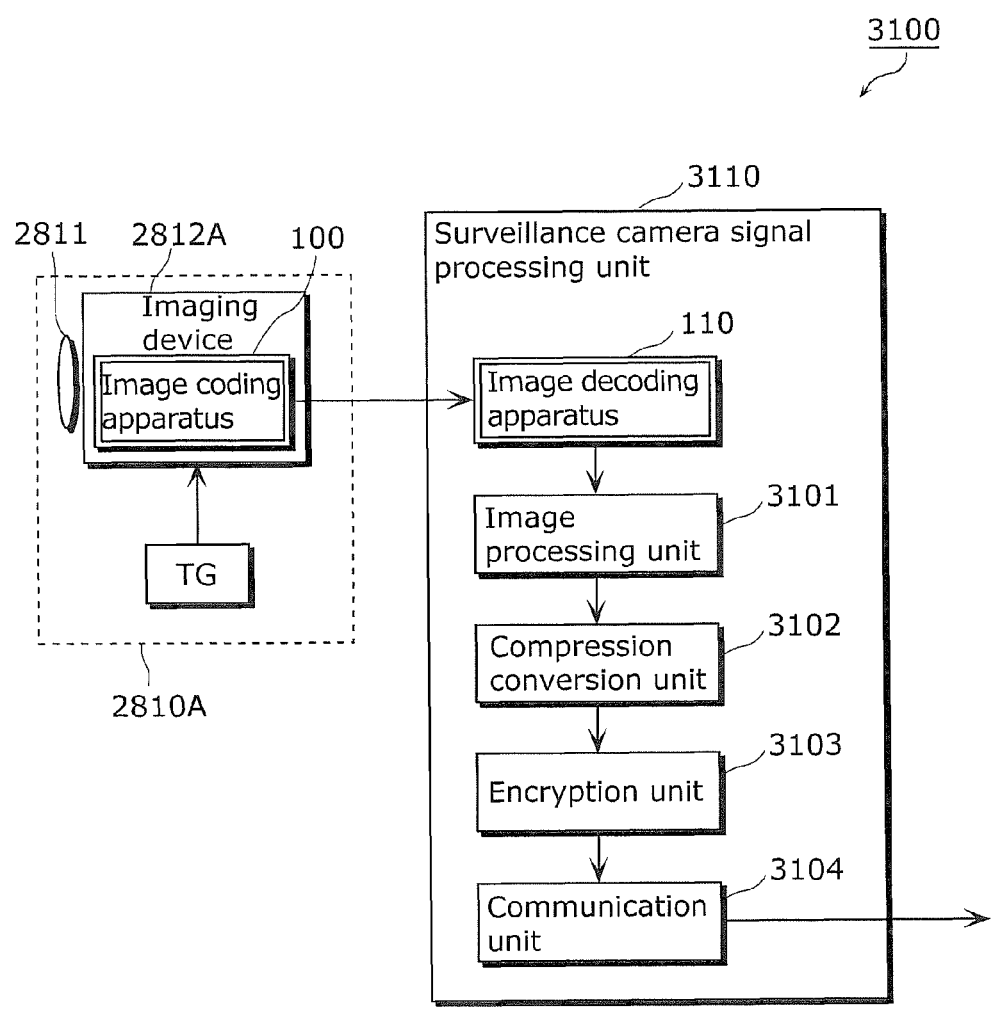
FIG. 31 is a block diagram showing a structure of a surveillance camera in Variation 6.

FIG. 31 is a diagram showing a structure of the surveillance camera 3100.

Like common surveillance camera systems, the surveillance camera 3100 encrypts image data transmitted from the surveillance camera 3100 so as to protect the image data from being stolen by a third party on a transmission path, thereby ensuring security on the transmission path. Typically, in a surveillance camera signal processing unit 3110, image data on which predetermined image processing is performed by an image processing unit 3101 is compressed by a compression conversion unit 3102 according to a predetermined standard such as JPEG, MPEG4, or H.264 and further encrypted by an encryption unit 3103, and the encrypted data is transmitted from a communication unit 3104 on the Internet, thereby protecting personal privacy.

Here, as shown in FIG. 31, the coded data outputted from the imaging unit 2810A including the image coding apparatus 100 described above is provided to the surveillance camera signal processing unit 3110, and decoded by the image decoding apparatus 110 in the surveillance camera signal processing unit 3110. This allows the image data captured by the imaging unit 2810A to be pseudo-encrypted, thus ensuring security on a transmission path between the imaging unit 2810A and the surveillance camera signal processing unit 3110. Consequently, higher security than in conventional art can be attained.

(Variation 7)

Figure 32:
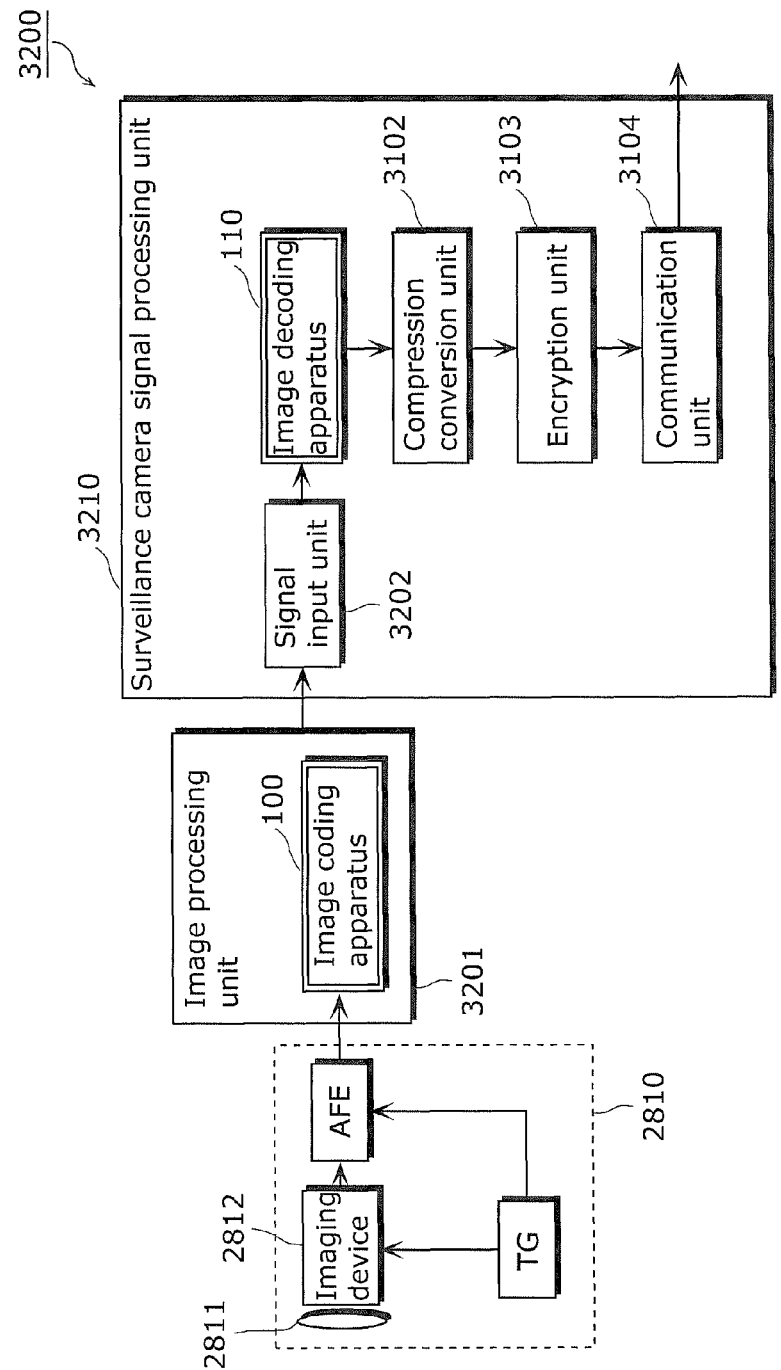
FIG. 32 is a block diagram showing a structure of a surveillance camera in Variation 7.

FIG. 32 is a diagram showing a surveillance camera 3200 in Variation 7.

A surveillance camera system may also be realized by a method of providing a signal input unit 3202 and an image processing unit 3201 for performing predetermined camera image processing on an image received from the imaging unit 2810, as shown in FIG. 32. In this method, a surveillance camera signal processing unit 3210 receives image data from the image processing unit 3201, compresses and encrypts the received image data, and transmits the image data from the communication unit 3104 on the Internet. For instance, this surveillance camera signal processing unit 3210 is realized by separate LSI.

In this form (Variation 7), the image coding apparatus 100 is included in the image processing unit 3201, and the image decoding apparatus 110 is included in the surveillance camera signal processing unit 3210. This allows the image data transmitted from the image processing unit 3201 to be pseudo-encrypted, thus ensuring security on a transmission path between the image processing unit 3201 and the surveillance camera signal processing unit 3210. Consequently, higher security than in conventional art can be attained.

Therefore, according to Variation 7, the data transfer efficiency of the surveillance camera can be enhanced. This makes it possible to achieve an improvement in high-speed imaging operation such as an increase in moving image resolution. Besides, since image data is pseudo-encrypted, improved security such as image data leakage prevention and privacy protection can be attained.

(Variation 8)

Variation 8 is a modification (an image coding apparatus 100X) of the image coding apparatus 100 in Variation 1.

Figure 39:
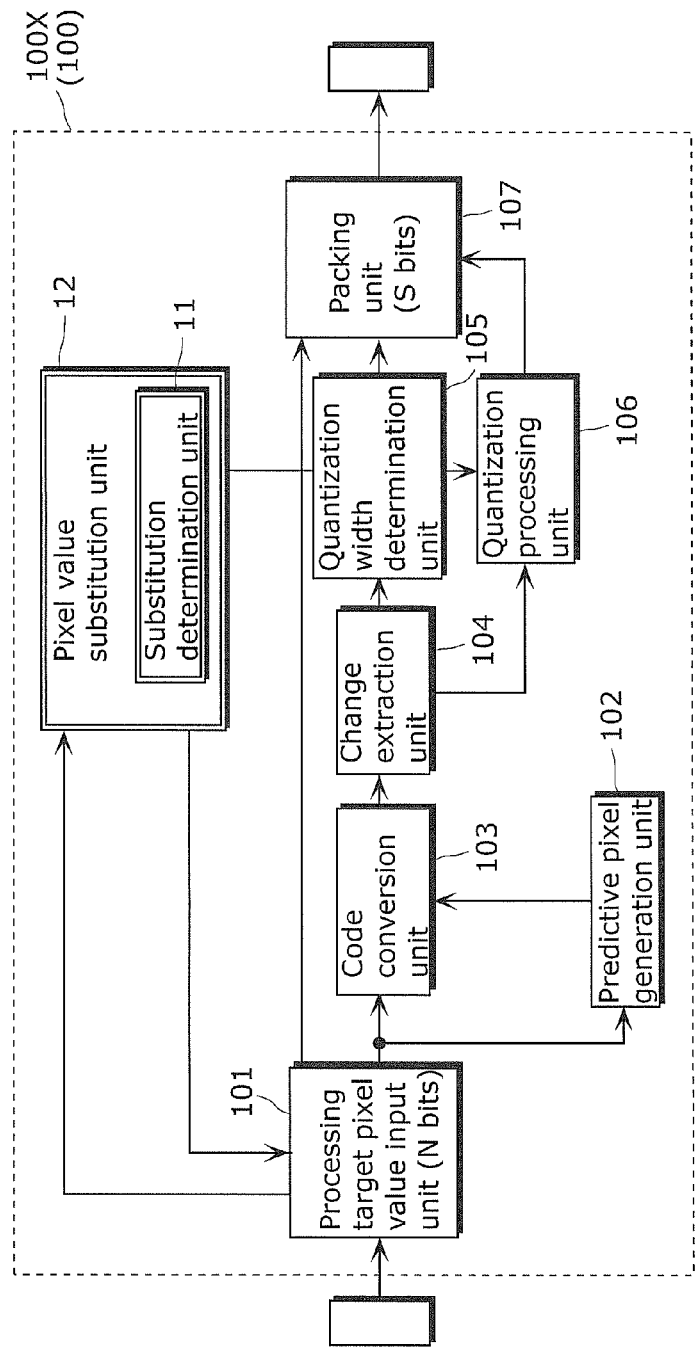
FIG. 39 is a block diagram showing a structure of an image coding apparatus in Variation 8.

FIGS. 33 to 38 are flowcharts in Variation 8. FIG. 39 is a block diagram showing a structure of the image coding apparatus 100X in Variation 8.

Figure 33:
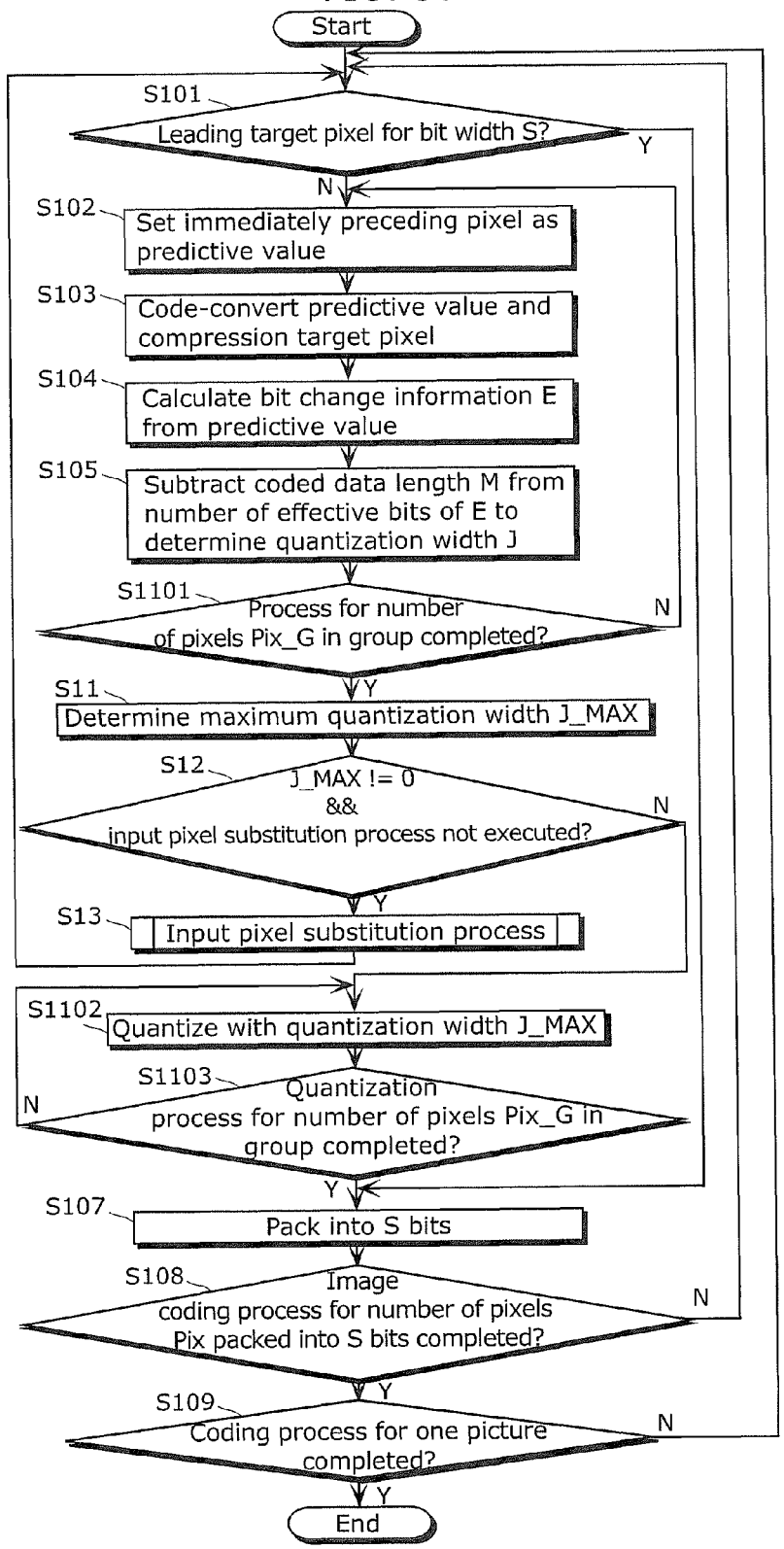
FIG. 33 is a flowchart in Variation 8.

FIG. 33 is a flowchart in Variation 8.

As shown in FIG. 33, Step S13 is newly added to perform pixel value substitution on pixel data of the predetermined number of pixels Pix_G, to reduce the maximum quantization width J_MAX on the group-by-group basis as compared with the case where the substitution process is not performed. By doing so, the error associated with quantization can be reduced. Steps S11 and S12 are also added in FIG. 33 to execute the substitution process.

FIG. 39 is a block diagram showing the structure of the image coding apparatus in Variation 8.

In Variation 8, a substitution determination unit 11 and a pixel value substitution unit 12 are newly added to the image coding apparatus 100 in Variation 1, as shown in FIG. 39.

FIGS. 40 to 42 show the received pixel data, the substitutable range, the substitution cumulative error, the code conversion result of the coding target pixel, the exclusive OR, the number of effective bits, the quantization width, the quantization value, the decoded pixel data, and the cumulative error between the received pixel data and the decoded pixel data.

It is assumed here that the number of pixels Pix_G constituting one group is 6, and the received pixel data is the same in each case (see FIGS. 40 to 42).

FIG. 40 is a diagram showing processing results of the structure in Variation 1.

Figure 34:
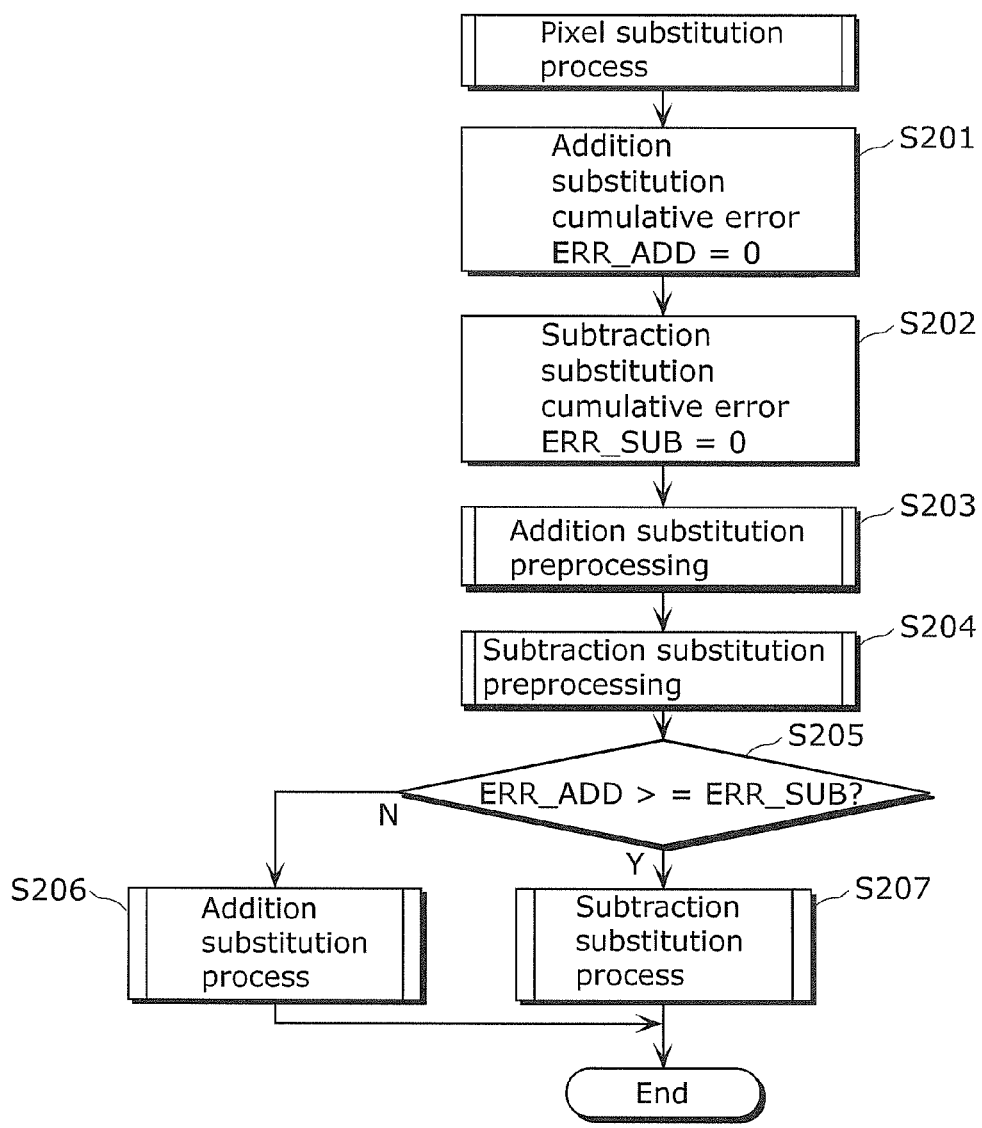
FIG. 34 is a flowchart showing Step S13 shown in FIG. 33 in detail.

FIG. 41 is a diagram showing processing results when Step S203 in FIG. 34 is performed.

FIG. 42 is a diagram showing processing results when Step S204 in FIG. 34 is performed.

(Image Coding Process)

When code conversion is performed in the coding process in Variation 1, the following problem arises. As shown in FIG. 40, even though an image change (change in the first row in the upper table in FIG. 40) is small, in the case of such pixel value input (the first row in the upper table) where a power of 2 (e.g. 2 raised to the 9th power=512) is included in a range from the coding target pixel value (e.g. 512 of the pixel P12) to the predictive value (e.g. 500 of the pixel P11), the quantization width increases (see the quantization width "2" in the third row in the middle table in FIG. 40).

Quantization with a large quantization width (2) has a possibility of incurring a large loss of information (large quantization error) in quantization, resulting in image quality degradation.

In view of this, in Variation 8, the coding target pixel value (e.g. 500 of the pixel P21 in FIG. 41, 512 of the pixel P32 in FIG. 42) is substituted so that no power of 2 is included from the coding target pixel value to the predictive value (e.g. the pixel value "500" of the pixel P21 in FIG. 41 is substituted with 512 (see "500→512" in FIG. 41), the pixel value "512" of the pixel P32 in FIG. 42 is substituted with 511 (see "512→511" in FIG. 42)).

As a result, quantization can be performed not with a large quantization width (2 as mentioned above) but with a small quantization width. By solving the above problem in this way, the quantization accuracy can be enhanced to attain higher image quality.

In Step S11 (FIG. 33), the maximum quantization width J_MAX is calculated from among the Pix_G quantization widths J corresponding to the Pix_G pixels in the group.

In Step S12, it is determined whether or not a condition that the maximum quantization width J_MAX is not 0 and also the below-mentioned pixel value substitution process is not executed is met. In the case where the determination of Step S12 results in YES (the condition is met), the process goes to Step S13. In the case where the determination of Step S12 results in NO, the process goes to Step S1102. The subsequent process from Step S1102 has already been described in Variation 1, and so its detailed description is omitted.

FIG. 34 is a flowchart showing Step S13 in FIG. 33 in detail.

Step S13 is described in detail below, with reference to the flowchart in FIG. 34.

In each of Steps S201 and S202 in FIG. 34, the value (ERR_ADD, ERR_SUB) obtained by sequentially adding the difference from the input pixel data, which is used for calculating the cumulative error (cumulative error obtained by accumulation of the difference from the input pixel data) in the corresponding substitution process (below-mentioned Steps S206 and S207) is initialized.

In Step S203, substitution preprocessing is performed for pixel data substitution by addition (Step S206) on the input pixel data. In Step S204, substitution preprocessing is performed for pixel data substitution by subtraction (Step S207) on the input pixel data. Steps S203 and S204 will be described in detail later.

In Step S205, the addition substitution cumulative error ERR_ADD calculated in Step S203 and the subtraction substitution cumulative error ERR_SUB calculated in Step S204 are compared with each other, to determine a substitution method of a smaller cumulative error as a more suitable method.

That is, it is determined whether or not the addition substation cumulative error (ERR_ADD) is equal to or more than the subtraction substitution cumulative error (ERR_SUB) ("ERR_ADD≥ERR_SUB" in FIG. 34). In the case where the determination of Step S205 results in YES (the subtraction substitution method is more suitable), the process goes to Step S207. In the case where the determination of Step S205 results in NO (the addition substitution method is more suitable), the process goes to Step S206.

In Step S206, the addition substitution process is executed on the input pixel data, and then the process ends. In Step S207, the subtraction substitution process is executed on the input pixel data, and then the process ends. Steps S206 and S207 will be described in detail later.

Figure 35:
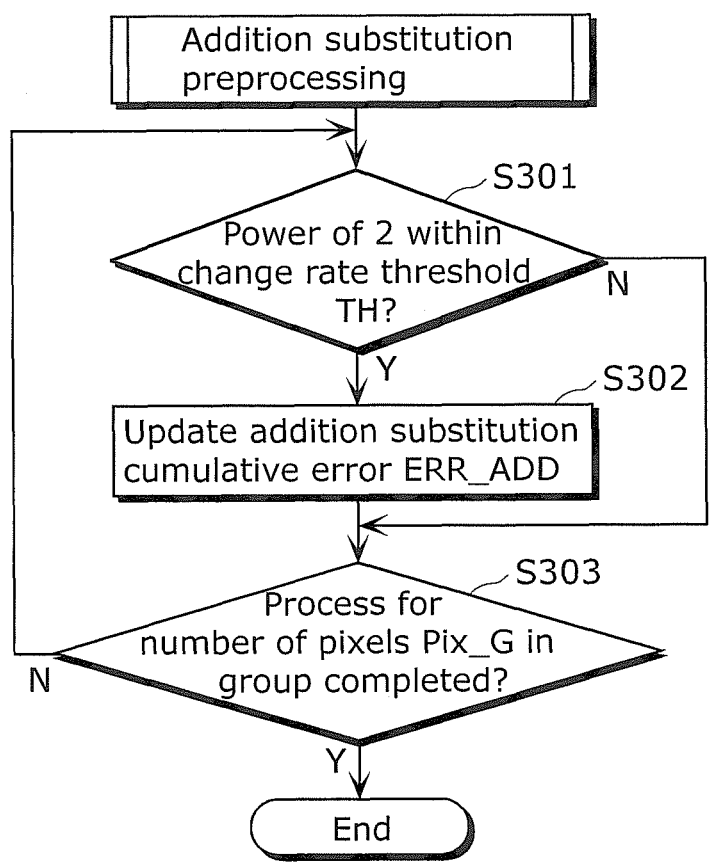
FIG. 35 is a flowchart showing Step S203 shown in FIG. 34 in detail.

FIG. 35 is a flowchart showing Step S203 in FIG. 34 in detail.

Step S203 is described in detail below, with reference to FIG. 35.

In Step S301, it is determined whether or not a power of 2 (e.g. 512) is included in a predetermined range. In detail, it is determined whether or not a power of 2 is included in a range (e.g. a range from 500 to 550) from the coding target pixel value (e.g. 500) subjected to addition substitution to the value obtained by adding, to the coding target pixel value, a change (e.g. 50) determined by a change rate threshold TH that can be arbitrarily set.

When an upper limit of the range (e.g. from 500 to 550) exceeds a maximum value that can be taken by pixel data, the upper limit is clipped to the maximum value that can be taken by pixel data. Here, the range is set in natural numbers. The change rate threshold TH may be varied depending on the coding target pixel value.

For example, suppose the change rate threshold TH is 10%, and the coding target pixel value of interest is 500. In this case, the above-mentioned change is 500×10%=50, so that the substitution range is from 500 to 550. This range includes 512 as a power of 2.

In the case where the determination of Step S301 results in YES, the process goes to Step S302. In the case where the determination of Step S301 results in NO, the process goes to Step S303.

In Step S302, an absolute difference (12, see "+12" in the field of the pixel P21 in FIG. 41) between the coding target pixel of interest (e.g. 500) and the power of 2 (512) included in the range (the range within the change rate threshold TH, e.g. the range from 500 to 550) for the coding target pixel is added to the addition substitution cumulative error ERR_ADD.

For example, 12 which is the absolute difference between the coding target pixel value (500) and the power of 2 (512) is added to the addition substitution cumulative error ERR_ADD.

In Step S303, it is determined whether or not Steps S301 and S302 are performed for all of the Pix_G pixels in the group. In the case where the determination of Step S303 results in YES, the process ends. In the case where the determination of Step S303 results in NO, the process goes to Step S301. The subsequent process is the same as the above-mentioned process, and so its detailed description is omitted.

Figure 36:
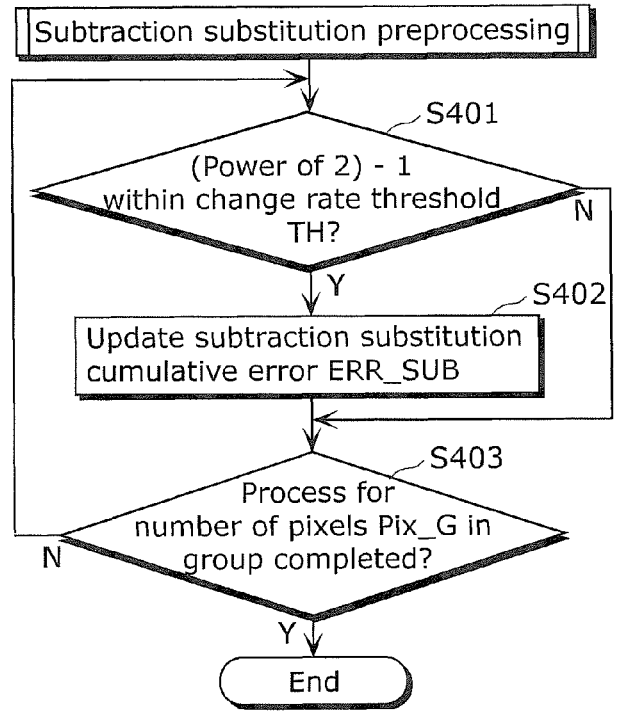
FIG. 36 is a flowchart showing Step S204 shown in FIG. 34 in detail.

FIG. 36 is a flowchart showing Step S204 in FIG. 34 in detail.

Step S204 is described in detail below, with reference to FIG. 36.

In Step S401, it is determined whether or not "(power of 2)−1" (e.g. 512−1=511) is included in a range from the coding target pixel value (e.g. 512 of the pixel P32 in FIG. 42) subjected to subtraction substitution to the value (e.g. 461) obtained by subtracting, from the coding target pixel value, a change (e.g. 50) determined by a change rate threshold TH that can be arbitrarily set for the coding target pixel value.

When a lower limit of the range is less than 0, the lower limit is clipped to 0. Here, the range is set in natural numbers. The change rate threshold TH may be varied depending on the coding target pixel value.

For example, suppose the change rate threshold TH is 10%, and the coding target pixel value of interest is 512. In this case, the substitution range is from 461 to 512. This range includes 511 as "(power of 2)−1".

In the case where the determination of Step S401 results in YES, the process goes to Step S402. In the case where the determination of Step S401 results in NO, the process goes to Step S403.

In Step S402, an absolute difference (1, see "−1" in the field of the pixel P32 in FIG. 42) between the coding target pixel of interest (e.g. 512 of the pixel P32) and "(power of 2)−1" (511) included in the range (the range within the change rate threshold TH) for the coding target pixel is added to the subtraction substitution cumulative error ERR_SUB.

For example, 1 which is the absolute difference between the coding target pixel value (512) and "(power of 2)−1" (511) is added to the subtraction substitution cumulative error ERR_SUB.

In Step S403, it is determined whether or not Steps S401 and S402 are performed for all of the Pix_G pixels in the group. In the case where the determination of Step S403 results in YES, the process ends. In the case where the determination of Step S403 results in NO, the process goes to Step S401. The subsequent process is the same as the above-mentioned process, and so its detailed description is omitted.

Figure 37:
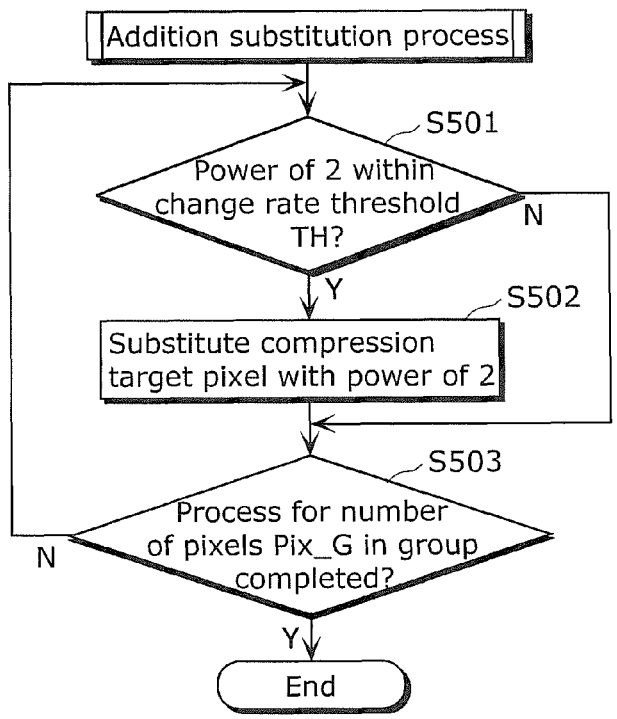
FIG. 37 is a flowchart showing Step S206 shown in FIG. 34 in detail.

FIG. 37 is a flowchart showing Step S206 in FIG. 34 in detail.

Step S206 is described in detail below, with reference to FIG. 37.

In Step S501, it is determined whether or not the value subjected to addition substitution has a power of 2 in the range within the change rate threshold TH (arbitrarily settable). In the case where the determination of Step S501 results in YES, the process goes to Step S502. In the case where the determination of Step S501 results in NO, the process goes to Step S503.

In Step S502, the coding target pixel value of interest (e.g. 500 of the pixel P21) is substituted with the power of 2 (512) included in the range within the change rate threshold TH (see "500→512" of the pixel 21 in FIG. 41).

In Step S503, it is determined whether or not Steps S501 and S502 are performed for all of the Pix_G pixels in the group. In the case where the determination of Step S503 results in YES, the process ends. In the case where the determination of Step S503 results in NO, the process goes to Step S501. The subsequent process is the same as the above-mentioned process, and so its detailed description is omitted.

FIG. 38 is a flowchart showing Step S207 in FIG. 34 in detail.

Step S207 is described in detail below, with reference to FIG. 38.

In Step S601, it is determined whether or not the value subjected to subtraction substitution has "(power of 2)−1" in the range within the change rate threshold TH (arbitrarily settable). In the case where the determination of Step S601 results in YES, the process goes to Step S602. In the case where the determination of Step S601 results in NO, the process goes to Step S603.

In Step S602, the coding target pixel value of interest (e.g. 512 of the pixel P32) is substituted with "(power of 2)−1" (511) included in the range within the change rate threshold TH (see "512→511" of the pixel 32 in FIG. 42).

In Step S603, it is determined whether or not Steps S601 and S602 are performed for all of the Pix_G pixels in the group. In the case where the determination of Step S603 results in YES, the process ends. In the case where the determination of Step S603 results in NO, the process goes to Step S601. The subsequent process is the same as the above-mentioned process, and so its detailed description is omitted.

In Variation 1, the quantization widths are 2, 0, 0, 0, and 0 (the third row in the middle table in FIG. 40) as shown in FIG. 40, so that the maximum quantization width J_MAX is 2 (relatively large quantization width). As a result of coding and decoding with this quantization width, the pixel data "500", "512", "513", "514", "512", and "513" (the first row in the upper table) are transformed to the decoded pixel data "500", "515", "515", "515", "515", and "515" (the first row in the lower table). The cumulative error of the Pix_G decoded pixels in the group is 11 (|500−500|+|512−515|+|513−515|+|514−515|+|512−515|+|513−515|=0+3+2+1+3+2=11, which is a relatively large error).

In Variation 8, on the other hand, the maximum quantization width J_MAX is 0 (relatively small quantization width) (see the third row in the middle table in each of FIGS. 41 and 42) as shown in FIGS. 41 and 42, enabling a reduction in quantization width. The addition cumulative error ERR_ADD is 12 (|500−512|+0+0+0+0+0=12), whereas the subtraction cumulative error ERR_SUB is 9 (0+|512−11|+|513−511|+|514−511|+|512−511|+|513−511|=0+1+2+3+1+2=9 (<11), which is a relatively small error). Accordingly, the subtraction substitution process with the smaller cumulative error (the process with the error 9) is performed.

As a result, the pixel data "500", "512", "513", "514", "512", and "513" (the first row in the upper table) are transformed to the decoded pixel data "500", "511", "511", "511", "511", and "511" (the first row in the lower table), as shown in FIG. 42. The cumulative error of the Pix_G decoded pixels in the group is 9 (small error). Though the error associated with substitution (e.g. the error of "512−511=1" in "512→511") occurs, the error of the decoded pixel data can be reduced (e.g. the small error 9 (<11)), as compared with Variation 1.

For example, the following operation may be performed in a given situation.

A predictive value of a pixel value (e.g. the pixel P12 in FIG. 40) is a pixel value (the pixel P11) other than the pixel value (the pixel P12).

A power of 2 (e.g. 512) is included in a range from one of the two pixel values to the other (512 of the pixel P12 and 500 of the pixel P11), or no power of 2 is included in a range from one of the two pixel values to the other (e.g. 513 of the pixel P13 and 514 of the pixel P14).

That is, the two pixel values are two pixel values (the pixels P12 and P11) that differ in whether or not the pixel value is equal to or more than the power of 2 (512), or two pixel values (the pixels P13 and P14) that are the same in whether or not the pixel value is equal to or more than the power of 2 (e.g. both are equal to or more than 512).

In the case where the two pixel values differ in the above point (the pixels P12 and P11), a relatively large quantization width (the large quantization width "2" in the third row in the middle table in FIG. 40) is calculated from the two pixel values. In the case where the two pixel values are the same in the above point (the pixels P13 and P14), a relatively small quantization width (see 0 in the third row, 0 in the third row in the middle table in FIG. 42) is calculated from the two pixel values.

Quantization with a large quantization width (e.g. 2) can incur a large loss of information in quantization and causes a large error, resulting in image quality degradation. Meanwhile, quantization with a small quantization width (e.g. 0) causes less degradation.

Accordingly, the two pixel values (the pixels P12 and P11) that differ in whether or not the pixel value is equal to or more than the power of 2 (512) and not the two pixel values (the pixels P13 and 14) that are the same in whether or not the pixel value is equal to or more than the power of 2, are detected.

In the case where the two pixel values are detected, the value (512) of one (e.g. the pixel P32 in FIG. 42) of the two pixel values (the pixels P31 and P32) that differ in the above point is substituted by another value (511).

The substituted value (511) and the other pixel value (500 of the pixel P31) are the same in whether or not the pixel value is equal to or more than the power of 2 (512) (i.e. both are less than 512).

A small quantization width (0 in the third row in the middle table in FIG. 42) is then calculated from the two pixel values that are the same in the above point as a result of substitution, and quantization is performed with the small quantization width.

Quantization with a large quantization width (2 in FIG. 40) is prevented in this manner, as a result of which degradation can be reduced. In other word, quantization is performed with a small quantization width (e.g. 0 in FIG. 42), resulting in less degradation.

The details of such processes may be the same as those described above.

Variations 1, 2, 3, and 8 may be used in combination. That is, the form (one of Variations 1 to 3 and 8) for minimizing the error of the decoded pixel data may be appropriately selected for each group of the number of pixels Pix_G, by comparing the quantization error that occurs in each of Variations 1 to 3 and the error caused by substitution in Variation 8.

The embodiment and the variations provide the following solution. By performing fixed length coding, the number of pixel patterns having an arbitrary quantization width can be fixed while maintaining random accessibility. Thus, fixed length coding can be realized without image quality degradation. This can be achieved in the following manner. Image data composed of a plurality of pieces of pixel data are received. Bit change information between a code of a predictive value generated from at least one pixel (e.g. "a" in FIG. 4) located near a coding target pixel and a code of the coding target pixel ("x" in FIG. 4) obtained by code conversion is quantized to obtain coded data including a quantization value generated by quantization, thereby compressing pixel data to a fixed length code (i.e. the quantization value). According to this structure, by performing fixed length coding, the number of pixel patterns having an arbitrary quantization width can always be fixed without depending on the signal level of the predictive value (a), while maintaining random accessibility. Furthermore, code conversion and bit pattern generation for reducing the information amount of the bit change information enable quantization error reduction.

The embodiment described above is merely illustrative. The subject matter for which a patent is sought is a generic concept of the above embodiment at an abstract level. The generic concept may be carried out (implemented, realized) by the above illustrative embodiment or by other embodiments that partly or wholly differ from the above embodiment.

A plurality of techniques described in separate sections may be combined according to need.

The present invention may be realized as an apparatus, a machine, a computer, an integrated circuit, and the like having a plurality of functions, a method having a plurality of steps, a computer program having a plurality of functions, a data structure in the computer program, and so on.

Although only an exemplary embodiment of the present invention has been described in detail above, those skilled in the art will readily appreciate that many modifications are possible in the exemplary embodiments without materially departing from the novel teachings and advantages of the present invention. Accordingly, all such modifications are intended to be included within the scope of the present invention.

INDUSTRIAL APPLICABILITY

The image coding apparatus and decoding apparatus according to the present invention enable image data to be compressed while securing a bus width of a fixed length for a data transfer bus in an integrated circuit. Moreover, by quantizing bit change information, the number of pixel patterns having an arbitrary quantization width can always be fixed without depending on a signal level of a predictive value. Furthermore, code conversion and bit pattern generation for reducing the information amount of the bit change information enable quantization error reduction.

Accordingly, image data can be coded and decoded without image quality degradation while maintaining random accessibility, in an apparatus that handles images such as a digital still camera or a network camera. The present invention is therefore useful for coping with recent increases in image data processing amount.

The invention claimed is:

1. An image coding method for compressing pixel data of a compression target pixel, said image coding method comprising:

generating a predictive value of the pixel data from at least one surrounding pixel located near the compression target pixel;

code-converting the pixel data to generate a code of the pixel data;

quantizing bit change information to a quantization value that has a smaller number of bits than the bit change information, to compress the pixel data to the quantization value, the bit change information being information of a bit change between the code of the pixel data generated in said code-converting and a code of the predictive value generated in said generating.

2. The image coding method according to claim 1, wherein said quantizing includes rearranging the bit change information according to a predetermined method, and quantizing the rearranged bit change information to the quantization value.

3. The image coding method according to claim 1, wherein said code-converting includes converting the pixel data from a binary code to a code that makes (i) a Hamming distance between original data and data approximate to the original data to be smaller than (ii) a Hamming distance when presented in a binary code.

4. The image coding method according to claim 1, further comprising:

performing an exclusive OR operation on the code of the pixel data generated in said code-converting and the code of the predictive value generated in said generating, to generate the bit change information as a result of the operation, wherein said quantizing includes:

determining, as a quantization width, the number of bits obtained by subtracting a bit length of the quantization value from the number of effective bits of the bit change information generated in said performing; and quantizing the bit change information generated in said performing, with the quantization width determined in said determining.

5. The image coding method according to claim 1, wherein said code-converting includes converting the pixel data from a binary code to a Gray code.

6. The image coding method according to claim 1, wherein said determining includes: rearranging bit data in the bit change information of N bits generated in said performing, to obtain a plurality of bit patterns resulting from different rearrangements, N being a natural number; adopting a bit pattern having a minimum number of effective bits from among the plurality of bit patterns; and determining, as the quantization width used for the quantization, the number of bits obtained by subtracting the bit length of the quantization value from the number of effective bits of the adopted bit pattern.

7. The image coding method according to claim 6, wherein at least one of the plurality of bit patterns is second bit change information obtained by dividing first bit change information into high-order bits and low-order bits at a predetermined bit position and rearranging the high-order bits in reverse order, the first bit change information being the bit change information of N bits generated in said performing.

8. The image coding method according to claim , wherein at least one of the plurality of bit patterns is third bit change information obtained by changing bit positions of a plurality of pieces of bit data in first bit change information which is the bit change information of N bits generated in said performing.

9. The image coding method according to claim 6, wherein at least one of the plurality of bit patterns is fourth bit change information of L bits obtained by extracting only information of a change in K consecutive bits in first bit change information which is the bit change information of N bits generated in said performing, the K consecutive bits being consecutive from a predetermined bit position, K being a natural number smaller than N, and L being smaller than K.

10. The image coding method according to claim 6, wherein said determining includes determining, for each group composed of a plurality of pieces of pixel data, a common quantization width used for quantization of all of the plurality of pieces of pixel data.

11. The image coding method according to claim 4, wherein said determining includes coding the determined quantization width to a code of Q bits, to generate coded data for specifying the quantization width used for inverse quantizing the quantization value, Q being a natural number.

12. The image coding method according to claim 4, further comprising:

determining a need of whether or not to substitute a value of the pixel data of the compression target pixel; and substituting the value of the pixel data of the compression target pixel with an arbitrary value, wherein, in the case of determining in said determining a need that the value of the pixel data needs to be substituted, said code-converting includes code-converting the pixel data whose value is substituted in said substituting to generate the code of the pixel data, and said quantizing includes quantizing the bit change information between the code of the pixel data generated in said code-converting and the code of the predictive value.

13. The image coding method according to claim 12, wherein said determining a need includes determining whether or not the value of the pixel data of the compression target pixel needs to be substituted, according to the quantization width determined in said determining.

14. The image coding method according to claim 13, wherein said determining a need includes determining that the value of the pixel data of the compression target pixel needs to be substituted, in the case where the quantization width determined in said determining is W which is an arbitrary nonzero natural number.

15. The image coding method according to claim 13, wherein said substituting includes substituting the value of the pixel data of the compression target pixel, in the case where a power of 2 is included in a predetermined range with respect to the value of the pixel data of the compression target pixel.

16. The image coding method according to claim 15, wherein said substituting includes substituting the value of the pixel data of the compression target pixel with the power of 2 in the case of substituting the value in a positive direction, and substituting the value of the pixel data of the compression target pixel with a result of subtracting 1 from the power of 2 in the case of substituting the value in a negative direction.

17. The image coding method according to claim 4, wherein said determining includes determining one quantization information ID for specifying the quantization width used for the quantization from among at most $2^Q$ quantization information IDs where Q is predetermined, and coding the quantization width to the determined quantization information ID which is a code of Q bits.

18. The image coding method according to claim 6,
wherein said determining includes generating a quantization information ID that includes at least quantization width information and bit pattern information, the quantization width information being information for specifying the quantization width used for the quantization, and the bit pattern information being information for specifying the bit pattern adopted in said determining.

19. The image coding method according to claim 4,
wherein said quantizing includes quantizing the bit change information by a bit shift operation that shifts the bit change information lower by the number of bits indicated by the quantization width used for the quantization.

20. The image coding method according to claim 1, further comprising
generating coded data of S bits that includes at least one of the quantization width used for the quantization and the quantization value, S being a natural number.

21. The image coding method according to claim 20,
wherein said generating coded data includes generating, as the coded data, packed data that includes unquantized pixel data of a leading pixel and one or more quantization values obtained by quantizing, in said quantizing, pixel data of each pixel following the leading pixel within a predetermined interval.

22. The image coding method according to claim 1,
wherein the pixel data is raw data which an image coding apparatus that executes said image coding method receives from an imaging device.

23. The image coding method according to claim 22,
wherein a dynamic range M of coded data of the pixel is changed for each color component.

24. The image coding method according to claim 22,
wherein said determining includes determining the quantization width separately for each color component.

25. The image coding method according to claim 1,
wherein the pixel data is data of a luminance signal or a chrominance signal generated by an image processing apparatus from raw data received from an imaging device.

26. The image coding method according to claim 1,
wherein the pixel data is data of a luminance signal or a chrominance signal generated by a decompression apparatus decompressing a JPEG image.

27. An image decoding method for decoding a quantization value to pixel data, the quantization value being a result of quantizing bit change information of a bit change between a code of the pixel data and a code of a predictive value of the pixel data, the predictive value being generated from at least one pixel located near a pixel of the pixel data, said image decoding method comprising:
generating the predictive value of the pixel data from already decoded preceding pixel data;
inverse quantizing the quantization value to generate the bit change information;
inverse code-converting the code of the pixel data to obtain the pixel data, the code of the pixel data being specified from the code of the predictive value generated in said generating and the bit change information generated in said inverse quantizing; and
performing an exclusive OR operation on the bit change information generated in said inverse quantizing and the code of the predictive value generated in said generating, to generate the code of the pixel data as a result of the operation,
wherein said inverse quantizing includes:
determining a quantization width used for the inverse quantization in said inverse quantizing; and
inverse quantizing the quantization value with the quantization width determined in said determining, to generate the bit change information.

28. The image decoding method according to claim 25,
wherein said inverse quantizing includes rearranging the bit change information according to a predetermined method, and
said performing includes generating the code of the pixel data from the code of the predictive value generated in said generating and the bit change information rearranged in said inverse quantizing.

29. The image decoding method according to claim 25,
wherein said inverse code-converting includes converting the code of the pixel data from a Gray code to a binary code.

30. The image decoding method according to claim 25,
wherein said determining includes specifying the quantization width and bit pattern information indicated by a quantization information ID, the bit pattern information being information for specifying an adopted bit pattern from among a plurality of bit patterns.

31. The image decoding method according to claim 27,
wherein said inverse quantizing includes inverse quantizing the quantization value to the bit change information, by a bit shift operation that shifts the quantization value higher by the number of bits indicated by the quantization width determined in said determining.

32. The image decoding method according to claim 27, further comprising
extracting at least one of pixel data of a leading pixel, the quantization width used for the inverse quantization in said inverse quantizing, and the quantization value, from data of S bits.

33. An image coding apparatus that receives pixel data of a compression target pixel and compresses the received pixel data, said image coding apparatus comprising:
a predictive pixel generation unit configured to generate a predictive value of the pixel data from at least one surrounding pixel located near the compression target pixel;
a code conversion unit configured to code-convert the pixel data to generate a code of the pixel data;
a quantization unit configured to quantize bit change information to a quantization value that has a smaller number of bits than the bit change information, to compress the pixel data to the quantization value, the bit change information being information of a bit change between the code of the pixel data generated by said code conversion unit and a code of the predictive value generated by said predictive pixel generation unit; and
a change extraction unit configured to perform an exclusive OR operation on the code of the pixel data generated by said code conversion unit and the code of the predictive value generated by said predictive pixel generation unit, to generate the bit change information as a result of the operation,
wherein said quantization unit includes:
a quantization width determination unit configured to determine, as a quantization width, the number of bits obtained by subtracting a bit length of the quantization value from the number of effective bits of the bit change information generated by said change extraction unit; and a quantization processing unit configured to quantize the bit change information generated by said change extraction unit, with the quantization width determined by said quantization width determination unit.

34. An image decoding apparatus that receives a quantization value and decodes the received quantization value to pixel data, the quantization value being a result of quantizing bit change information of a bit change between a code of the pixel data and a code of a predictive value of the pixel data, the predictive value being generated from at least one pixel located near a pixel of the pixel data, said image decoding apparatus comprising:
 a predictive pixel generation unit configured to generate the predictive value of the pixel data from already decoded preceding pixel data;
 an inverse quantization unit configured to inverse quantize the quantization value to generate the bit change information;
 an inverse code conversion unit configured to inverse code-convert the code of the pixel data to obtain the pixel data, the code of the pixel data being specified from the code of the predictive value generated by said predictive pixel generation unit and the bit change information generated by said inverse quantization unit; and
 a code generation unit configured to perform an exclusive OR operation on the bit change information generated by said inverse quantization unit and the code of the predictive value generated by said predictive pixel generation unit, to generate the code of the pixel data as a result of the operation,
 wherein said inverse quantization unit includes:
 a quantization width determination unit configured to determine a quantization width used for the inverse quantization by said inverse quantization unit; and
 an inverse quantization processing unit configured to inverse quantize the quantization value with the quantization width determined by said quantization width determination unit, to generate the bit change information.

35. A digital still camera comprising:
 the image coding apparatus according to claim 33; and
 an image decoding apparatus that receives a quantization value and decodes the received quantization value to pixel data, the quantization value being a result of quantizing bit change information of a bit change between a code of the pixel data and a code of a predictive value of the pixel data, the predictive value being generated from at least one pixel located near a pixel of the pixel data, said image decoding apparatus including:
 a predictive pixel generation unit configured to generate the predictive value of the pixel data from already decoded preceding pixel data;
 an inverse quantization unit configured to inverse quantize the quantization value to generate the bit change information; and
 an inverse code conversion unit configured to inverse code-convert the code of the pixel data to obtain the pixel data, the code of the pixel data being specified from the code of the predictive value generated by said predictive pixel generation unit and the bit change information generated by said inverse quantization unit.

36. A digital video camera comprising:
 the image coding apparatus according to claim 31; and
 an image decoding apparatus that receives a quantization value and decodes the received quantization value to pixel data, the quantization value being a result of quantizing bit change information of a bit change between a code of the pixel data and a code of a predictive value of the pixel data, the predictive value being generated from at least one pixel located near a pixel of the pixel data, said image decoding apparatus including:
 a predictive pixel generation unit configured to generate the predictive value of the pixel data from already decoded preceding pixel data;
 an inverse quantization unit configured to inverse quantize the quantization value to generate the bit change information; and
 an inverse code conversion unit configured to inverse code-convert the code of the pixel data to obtain the pixel data, the code of the pixel data being specified from the code of the predictive value generated by said predictive pixel generation unit and the bit change information generated by said inverse quantization unit.

37. A surveillance camera comprising:
 the image coding apparatus according to claim 33; and
 an image decoding apparatus that receives a quantization value and decodes the received quantization value to pixel data, the quantization value being a result of quantizing bit change information of a bit change between a code of the pixel data and a code of a predictive value of the pixel data, the predictive value being generated from at least one pixel located near a pixel of the pixel data, said image decoding apparatus including:
 a predictive pixel generation unit configured to generate the predictive value of the pixel data from already decoded preceding pixel data;
 an inverse quantization unit configured to inverse quantize the quantization value to generate the bit change information; and
 an inverse code conversion unit configured to inverse code-convert the code of the pixel data to obtain the pixel data, the code of the pixel data being specified from the code of the predictive value generated by said predictive pixel generation unit and the bit change information generated by said inverse quantization unit.

38. A solid-state imaging device comprising the image coding apparatus according to claim 33.

39. The image decoding method according to claim 25, further comprising:
 performing an exclusive OR operation on the bit change information generated in said inverse quantizing and the code of the predictive value generated in said generating, to generate the code of the pixel data as a result of the operation,
 wherein said inverse quantizing includes:
 determining a quantization width used for the inverse quantization in said inverse quantizing; and
 inverse quantizing the quantization value with the quantization width determined in said determining, to generate the bit change information.

40. The image coding apparatis according to claim 31, further comprising:
 a change extraction unit configured to perform an exclusive OR operation on the code of the pixel data generated by said code conversion unit and the code of the predictive value generated by said predictive pixel generation unit, to generate the bit change information as a result of the operation,
 wherein said quantization unit includes:
 a quantization width determination unit configured to determine, as a quantization width, the number of bits obtained by subtracting a bit length of the quantization value from the number of effective bits of the bit change information generated by said change extraction unit; and a quantization processing unit configured to quantize the bit change information generated by said change extraction unit, with the quantization width determined by said quantization width determination unit.

\* \* \* \* \*